United States Patent (10) Patent No.: US 7,923,114 B2
Myli et al. (45) Date of Patent: *Apr. 12, 2011

(54) HYDROPHILIC COATINGS, METHODS FOR DEPOSITING HYDROPHILIC COATINGS, AND IMPROVED DEPOSITION TECHNOLOGY FOR THIN FILMS

(75) Inventors: Kari Myli, Sauk City, WI (US); Gary Pfaff, Cazenovia, WI (US); James Brownlee, Cazenovia, WI (US); John German, Prairie du Sac, WI (US); Annette Krisko, Sauk City, WI (US); Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 630 days.

This patent is subject to a terminal disclaimer.

(21) Appl. No.: 11/293,032

(22) Filed: Dec. 2, 2005

(65) Prior Publication Data

US 2006/0121315 A1 Jun. 8, 2006

Related U.S. Application Data

(60) Provisional application No. 60/659,529, filed on Mar. 7, 2005, provisional application No. 60/633,701, filed on Dec. 3, 2004.

(51) Int. Cl.
*B32B 9/00* (2006.01)
(52) U.S. Cl. ......... 428/426; 428/432; 428/701; 428/702
(58) Field of Classification Search .................. None
See application file for complete search history.

(56) References Cited

U.S. PATENT DOCUMENTS

| 1,256,818 | A | 2/1918 | Nile | 206/454 |
|---|---|---|---|---|
| 2,808,351 | A | 10/1952 | Colbert | 117/211 |
| 2,780,553 | A | 2/1957 | Pawlyk | 106/1 |
| 3,505,092 | A | 4/1970 | Ryan | 117/33.3 |
| 3,528,906 | A | 9/1970 | Cash, Jr. | 204/298 |
| 3,679,291 | A | 7/1972 | Apfel | 359/587 |
| 3,727,666 | A | 4/1973 | Vander Sluis | 164/72 |
| 3,829,197 | A | 8/1974 | Thelen | 359/588 |
| 3,840,451 | A | 10/1974 | Golyanov | 204/192 |

(Continued)

FOREIGN PATENT DOCUMENTS

CA 2290999 5/1998

(Continued)

OTHER PUBLICATIONS

MikroElektronick—High-rate Sputtering System for Two-Sided Coating (HZS-04).

(Continued)

*Primary Examiner* — Timothy M Speer
(74) *Attorney, Agent, or Firm* — Fredrikson & Byron, PA

(57) ABSTRACT

The invention provides certain embodiments that involve sputtering techniques for applying a mixed oxide film comprising silica and titania. In these embodiments, the techniques involve sputtering at least two targets in a common chamber (e.g., in a shared gaseous atmosphere). A first of these targets includes silicon, while a second of the targets includes titanium. Further, the invention provides embodiments involving a substrate bearing a hydrophilic coating, which can be deposited by sputtering or any other suitable thin film deposition technique. The invention also provides techniques and apparatuses useful for depositing a wide variety of coating types. For example, the invention provides thin film deposition technologies in which sputtering apparatuses or other thin film deposition apparatuses are employed.

132 Claims, 29 Drawing Sheets

U.S. PATENT DOCUMENTS

| | | | |
|---|---|---|---|
| 3,844,924 A | 10/1974 | Cunningham | 204/298 |
| 3,852,098 A | 12/1974 | Bloss | 117/106 |
| 3,854,796 A | 12/1974 | Thelen | 359/588 |
| 3,911,579 A | 10/1975 | Lane | |
| 3,925,182 A | 12/1975 | Carmichael | 204/192 |
| 3,934,961 A | 1/1976 | Itoh | 359/586 |
| 3,968,018 A | 7/1976 | Lane | 204/192 |
| 3,970,037 A | 7/1976 | Sopko | 118/48 |
| 3,990,784 A | 11/1976 | Gelber | 350/166 |
| 4,012,119 A | 3/1977 | Adams | |
| 4,029,566 A | 6/1977 | Brandmair | 204/290.08 |
| 4,045,125 A | 8/1977 | Farges | 350/166 |
| 4,052,520 A | 10/1977 | Chang | 427/164 |
| 4,060,660 A | 11/1977 | Carlson | 428/408 |
| 4,107,350 A | 8/1978 | Berg | 427/38 |
| 4,130,672 A | 12/1978 | Onoki | 427/164 |
| 4,166,018 A | 8/1979 | Chapin | 204/192.12 |
| 4,194,022 A | 3/1980 | Gillery | 427/109 |
| 4,212,663 A | 7/1980 | Aslami | 65/144 |
| 4,212,903 A | 7/1980 | Schnell | 427/127 |
| 4,214,014 A | 7/1980 | Hofer | 427/40 |
| 4,216,259 A | 8/1980 | Groth | 428/216 |
| 4,238,276 A | 12/1980 | Kinugawa | 216/23 |
| 4,252,629 A | 2/1981 | Bewer | 204/290.03 |
| 4,261,722 A | 4/1981 | Novak | 65/60 |
| 4,322,276 A | 3/1982 | Meckel | 204/192.26 |
| 4,331,526 A | 5/1982 | Kuehnie | |
| 4,332,922 A | 6/1982 | Kossmehl | 525/478 |
| 4,336,119 A | 6/1982 | Gillery | 204/192.13 |
| 4,351,861 A | 9/1982 | Henery | 428/255.1 |
| 4,356,073 A | 10/1982 | McKelvey | |
| 4,377,613 A | 3/1983 | Gordon | 428/212 |
| 4,422,916 A | 12/1983 | McKelvey | |
| 4,422,917 A | 12/1983 | Hayfield | 204/196.01 |
| 4,440,822 A | 4/1984 | Gordon | 428/216 |
| 4,465,575 A | 8/1984 | Love | 204/192 |
| 4,466,258 A | 8/1984 | Sando | 68/56 |
| 4,466,877 A | 8/1984 | McKelvey | 204/298.23 |
| 4,485,146 A | 11/1984 | Mizuhashi | 428/428 |
| 4,486,286 A | 12/1984 | Lewin | 204/192 |
| 4,503,125 A | 3/1985 | Nelson | 428/408 |
| 4,504,519 A | 3/1985 | Zelez | 427/39 |
| 4,568,622 A | 2/1986 | Minami | 430/51 |
| 4,569,738 A | 2/1986 | Kieser | 204/173 |
| 4,571,350 A | 2/1986 | Parker | 427/109 |
| 4,576,864 A | 3/1986 | Krautter | 428/328 |
| 4,661,409 A | 4/1987 | Kieser | 428/408 |
| 4,673,475 A | 6/1987 | Windischmann | 204/192.11 |
| 4,704,339 A | 11/1987 | Green | 428/689 |
| 4,713,311 A | 12/1987 | Senske | 430/127 |
| 4,717,622 A | 1/1988 | Kurokawa | 428/408 |
| 4,725,345 A | 2/1988 | Sakamoto | 204/192.31 |
| 4,728,529 A | 3/1988 | Etzkorn | 427/39 |
| 4,732,454 A | 3/1988 | Saito | 350/164 |
| 4,737,252 A | 4/1988 | Hoffman | 204/192.16 |
| 4,769,291 A | 9/1988 | Belkind | 428/630 |
| 4,777,090 A | 10/1988 | Ovshinsky | 428/408 |
| 4,780,334 A | 10/1988 | Ackerman | 427/248.1 |
| 4,798,660 A | 1/1989 | Ermer | 204/192.17 |
| 4,814,056 A | 3/1989 | Welty | 204/298.11 |
| 4,816,127 A | 3/1989 | Eltouky | 204/192.15 |
| 4,834,857 A | 5/1989 | Gillery | |
| 4,849,081 A | 7/1989 | Ross | 204/192.15 |
| 4,851,095 A | 7/1989 | Scobey | 204/192.12 |
| 4,859,493 A | 8/1989 | Lemelson | 427/451 |
| 4,861,680 A | 8/1989 | Meyer | 428/623 |
| 4,882,827 A | 11/1989 | Kusumi | 29/527.2 |
| 4,894,133 A | 1/1990 | Hedgcoth | 204/192.15 |
| 4,915,977 A | 4/1990 | Okamoto | 427/37 |
| 4,919,778 A | 4/1990 | Dietrich | 204/192.27 |
| 4,931,778 A | 6/1990 | Guajardo | 340/664 |
| 4,952,430 A | 8/1990 | Bowser | 428/34 |
| 4,961,958 A | 10/1990 | Desphandey | 427/38 |
| 4,981,568 A | 1/1991 | Taranko | 204/192.31 |
| 4,990,234 A | 2/1991 | Szczyrbowski | |
| 5,006,248 A | 4/1991 | Anderson | 210/500.25 |
| 5,008,002 A | 4/1991 | Uno | 204/192.31 |
| 5,020,288 A | 6/1991 | Swensen | 52/202 |
| 5,026,415 A | 6/1991 | Yamamoto | 65/305 |
| 5,032,421 A | 7/1991 | Sarma | 427/38 |
| 5,035,784 A | 7/1991 | Anderson | 204/158.14 |
| 5,047,131 A | 9/1991 | Wolfe | 204/192.23 |
| 5,071,206 A | 12/1991 | Hood | 359/360 |
| 5,073,241 A | 12/1991 | Watanabe | 204/192.15 |
| 5,073,450 A | 12/1991 | Nietering | 428/336 |
| 5,090,985 A | 2/1992 | Soubeyrand | 65/60.52 |
| 5,104,539 A | 4/1992 | Anderson | 210/500.25 |
| 5,105,310 A | 4/1992 | Dickey | 359/586 |
| 5,106,671 A | 4/1992 | Amberger | 428/215 |
| 5,107,643 A | 4/1992 | Swensen | 52/202 |
| 5,108,574 A | 4/1992 | Kirs | 208/298.22 |
| 5,126,218 A | 6/1992 | Clarke | 429/245 |
| RE34,035 E | 8/1992 | Dimigen | 428/244 |
| 5,139,633 A | 8/1992 | Kashida | 204/192.15 |
| 5,165,972 A | 11/1992 | Porter | 428/1 |
| 5,171,414 A | 12/1992 | Amberger | 204/192.26 |
| 5,190,807 A | 3/1993 | Kimock | 428/216 |
| 5,194,990 A | 3/1993 | Boulos | 359/587 |
| 5,196,400 A | 3/1993 | Chen | 505/476 |
| 5,201,926 A | 4/1993 | Szczyrbowski | 65/60.2 |
| 5,209,996 A | 5/1993 | Kashida | 430/5 |
| 5,211,759 A | 5/1993 | Zimmerman | 118/723 |
| 5,245,468 A | 9/1993 | Demiryont | 359/359 |
| 5,254,392 A | 10/1993 | Burns | 428/212 |
| 5,284,539 A | 2/1994 | McKernan | 156/154 |
| 5,286,524 A | 2/1994 | Slutz | 427/249 |
| 5,302,449 A | 4/1994 | Eby | 428/336 |
| 5,306,547 A | 4/1994 | Hood | 428/213 |
| 5,318,830 A | 6/1994 | Takamatsu | 428/246 |
| 5,338,422 A | 8/1994 | Belkind | 204/192.12 |
| 5,342,676 A | 8/1994 | Zagdoun | 428/216 |
| 5,346,600 A | 9/1994 | Nieh | 204/192.3 |
| 5,354,446 A | 10/1994 | Kida | 204/298.22 |
| 5,356,718 A | 10/1994 | Athey | 428/428 |
| 5,366,764 A | 11/1994 | Sunthankar | 427/248.1 |
| 5,378,527 A | 1/1995 | Nakanishi | 428/216 |
| 5,394,269 A | 2/1995 | Takamatsu | 359/580 |
| 5,401,543 A | 3/1995 | O'Neill | 427/580 |
| 5,405,517 A | 4/1995 | Lampkin | 204/192.12 |
| 5,415,756 A | 5/1995 | Wolfe | 204/192.23 |
| 5,424,130 A | 6/1995 | Nakanishi | 428/410 |
| 5,453,459 A | 9/1995 | Roberts | 524/123 |
| 5,470,661 A | 11/1995 | Bailey | 428/408 |
| 5,476,713 A | 12/1995 | Abiko | 428/332 |
| 5,482,602 A | 1/1996 | Cooper | 204/192.11 |
| 5,498,475 A | 3/1996 | Takigawa | 428/334 |
| 5,507,930 A | 4/1996 | Yamashita | 204/192.15 |
| 5,514,485 A | 5/1996 | Ando | 428/702 |
| 5,520,996 A | 5/1996 | Balian | 428/216 |
| 5,529,631 A | 6/1996 | Yoshikawa | 118/78 |
| 5,558,751 A | 9/1996 | Mahler | 204/298.26 |
| 5,563,734 A | 10/1996 | Wolfe | |
| 5,569,362 A | 10/1996 | Lerbet | 204/192.16 |
| 5,569,501 A | 10/1996 | Bailey | 427/577 |
| 5,589,280 A | 12/1996 | Gibbons | 428/626 |
| 5,593,784 A | 1/1997 | Chinzi | 428/413 |
| 5,593,786 A | 1/1997 | Parker | 428/426 |
| 5,594,585 A | 1/1997 | Komatsu | 359/512 |
| 5,595,813 A | 1/1997 | Ogawa | 428/212 |
| 5,595,825 A | 1/1997 | Guiselin | 428/428 |
| 5,597,622 A | 1/1997 | Zoller | 427/563 |
| 5,599,422 A | 2/1997 | Adams | 156/510 |
| 5,605,609 A | 2/1997 | Ando | 204/192.23 |
| 5,609,924 A | 3/1997 | McCurdy | 427/475 |
| 5,611,899 A | 3/1997 | Maass | 204/298.08 |
| 5,616,225 A | 4/1997 | Sieck | 204/298.14 |
| 5,616,532 A | 4/1997 | Heller | |
| 5,618,388 A | 4/1997 | Seeser | 204/192.12 |
| 5,618,590 A | 4/1997 | Naruse | 427/528 |
| 5,620,572 A | 4/1997 | Bjornard | 204/192.12 |
| 5,624,423 A | 4/1997 | Anjur | 604/385.21 |
| 5,624,760 A | 4/1997 | Collins | 428/426 |
| 5,633,208 A | 5/1997 | Ishikawa | 438/699 |
| 5,643,423 A | 7/1997 | Kimock | 204/192.35 |
| 5,643,432 A | 7/1997 | Qiu | 205/50 |
| 5,645,699 A | 7/1997 | Sieck | 204/192.12 |
| 5,645,900 A | 7/1997 | Ong | 427/571 |

| Patent No. | Date | Inventor | Class |
|---|---|---|---|
| 5,669,144 A | 9/1997 | Hahn | 30/346.54 |
| 5,674,625 A | 10/1997 | Takahashi | 428/428 |
| 5,674,658 A | 10/1997 | Burberry | 430/262 |
| 5,679,431 A | 10/1997 | Chen | 428/65.3 |
| 5,683,560 A | 11/1997 | Szczyrbowski | 204/298.23 |
| 5,683,561 A | 11/1997 | Hollars | 204/298 |
| 5,698,262 A | 12/1997 | Soubeyrand | 427/255.3 |
| 5,719,705 A | 2/1998 | Machol | |
| 5,723,172 A | 3/1998 | Sherman | 427/109 |
| 5,724,187 A | 3/1998 | Varaprasad | |
| 5,733,660 A | 3/1998 | Makita | 428/426 |
| 5,733,669 A | 3/1998 | Veyhl | 428/698 |
| 5,745,291 A | 4/1998 | Jenkinson | 359/586 |
| 5,750,265 A | 5/1998 | Goodman | |
| 5,755,867 A | 5/1998 | Chikuni | 106/287.16 |
| 5,762,674 A | 6/1998 | Maltby, Jr. | 65/60.1 |
| 5,763,087 A | 6/1998 | Falabella | 428/408 |
| 5,780,119 A | 7/1998 | Dearnaley | 427/528 |
| 5,780,149 A | 7/1998 | McCurdy | 428/336 |
| 5,780,380 A | 7/1998 | Endoh | 502/300 |
| 5,789,040 A | 8/1998 | Martinu | 427/575 |
| 5,811,191 A | 9/1998 | Neuman | 428/427 |
| 5,814,195 A | 9/1998 | Lehan | |
| 5,814,196 A | 9/1998 | Hollars | 204/298.15 |
| 5,820,994 A | 10/1998 | Gotoh | 428/451 |
| 5,830,252 A | 11/1998 | Finley | 65/60.5 |
| 5,830,327 A | 11/1998 | Kolenkow | 204/192.12 |
| 5,830,332 A | 11/1998 | Babich | 204/192.15 |
| 5,846,613 A | 12/1998 | Neuville | 427/575 |
| 5,849,200 A | 12/1998 | Heller | 210/748 |
| 5,853,866 A | 12/1998 | Watanabe | 428/312.8 |
| 5,854,708 A | 12/1998 | Komatsu | 359/512 |
| 5,866,199 A | 2/1999 | Swidler | 427/154 |
| 5,866,260 A | 2/1999 | Adams, Jr. | 428/426 |
| 5,869,187 A | 2/1999 | Nakamura | 428/428 |
| 5,869,808 A | 2/1999 | Hyllberg | 219/216 |
| 5,871,843 A | 2/1999 | Yoneda | 428/337 |
| 5,873,203 A | 2/1999 | Thiel | 52/172 |
| 5,874,701 A | 2/1999 | Watanabe | 204/157.15 |
| 5,888,593 A | 3/1999 | Petrmichl | 427/563 |
| 5,891,556 A | 4/1999 | Anderson | 428/216 |
| 5,935,716 A | 8/1999 | McCurdy | 428/428 |
| 5,939,194 A | 8/1999 | Hashimoto | 428/411 |
| 5,948,538 A | 9/1999 | Brochot | |
| 5,961,843 A | 10/1999 | Hayakawa | 210/748 |
| 5,962,115 A | 10/1999 | Zmelty | |
| 5,965,246 A | 10/1999 | Guiselin | 428/212 |
| 5,968,328 A | 10/1999 | Teschner | 204/298.25 |
| 5,972,184 A | 10/1999 | Hollars | 204/298.08 |
| 6,013,372 A | 1/2000 | Hayakawa | 428/411.1 |
| 6,027,766 A | 2/2000 | Greenberg | 427/226 |
| 6,037,289 A | 3/2000 | Chopin | 502/2 |
| 6,045,903 A | 4/2000 | Seino | 428/331 |
| 6,054,024 A | 4/2000 | Toyama | |
| 6,054,227 A | 4/2000 | Greenberg | 428/701 |
| 6,068,914 A | 5/2000 | Boire | 428/216 |
| 6,071,606 A | 6/2000 | Yamazaki | 428/325 |
| 6,071,623 A | 6/2000 | Sugawara | 428/428 |
| 6,074,981 A | 6/2000 | Tada | 502/224 |
| 6,090,489 A | 7/2000 | Hayakawa | 428/409 |
| 6,103,363 A | 8/2000 | Boire | 428/325 |
| 6,114,043 A | 9/2000 | Joret | 428/428 |
| 6,124,044 A | 9/2000 | Swidler | 428/500 |
| 6,139,803 A | 10/2000 | Watanabe | |
| 6,154,311 A | 11/2000 | Simmons | 359/359 |
| 6,156,171 A | 12/2000 | Hollars | 204/298.25 |
| 6,156,409 A | 12/2000 | Doushita | 428/143 |
| 6,165,256 A | 12/2000 | Hayakawa | 106/13 |
| 6,165,598 A | 12/2000 | Nelson | 428/212 |
| 6,165,616 A | 12/2000 | Lemelson | 428/408 |
| 6,171,659 B1 | 1/2001 | Vanden Brande | 427/523 |
| 6,191,062 B1 | 2/2001 | Hayakawa | 502/159 |
| 6,193,378 B1 | 2/2001 | Tonar | 359/603 |
| 6,193,856 B1 | 2/2001 | Kida | 204/192.22 |
| 6,197,101 B1 | 3/2001 | Matsumura | 106/287.11 |
| 6,210,750 B1 | 4/2001 | Cho | 427/190 |
| 6,210,779 B1 | 4/2001 | Watanabe | 428/208 |
| 6,242,752 B1 | 6/2001 | Soma | 250/504 |
| 6,261,693 B1 | 7/2001 | Veerasamy | 428/408 |
| 6,270,633 B1 | 8/2001 | Onaka | 204/192.12 |
| 6,299,981 B1 | 10/2001 | Azzopardi | 428/429 |
| 6,319,326 B1 | 11/2001 | Koh | 118/718 |
| 6,326,079 B1 | 12/2001 | Philippe | 428/325 |
| 6,329,925 B1 | 12/2001 | Skiver | |
| 6,333,084 B1 | 12/2001 | Woodard | 428/34 |
| 6,334,938 B2 | 1/2002 | Kida | 204/298.13 |
| 6,350,397 B1 | 2/2002 | Heikkila | 264/39 |
| 6,352,755 B1 | 3/2002 | Finley | 428/100 |
| 6,354,109 B1 | 3/2002 | Boire | 65/60.1 |
| 6,362,121 B1 | 3/2002 | Chopin | 502/2 |
| 6,365,010 B1 | 4/2002 | Hollars | 204/192.12 |
| 6,379,746 B1 | 4/2002 | Birch | 427/154 |
| 6,379,776 B1 | 4/2002 | Tada | 428/149 |
| 6,387,844 B1 | 5/2002 | Fujishima | 502/350 |
| 6,403,686 B1 | 6/2002 | Pickett et al. | 524/431 |
| 6,413,581 B1 | 7/2002 | Greenberg | 427/226 |
| 6,414,213 B2 | 7/2002 | Ohmori | 502/350 |
| 6,425,670 B1 | 7/2002 | Komatsu | 359/507 |
| 6,428,172 B1 | 8/2002 | Hutzel | |
| 6,447,123 B2 | 9/2002 | Tonar | 359/604 |
| 6,451,178 B2 | 9/2002 | Szczyrbowski | 204/192.13 |
| 6,461,686 B1 | 10/2002 | Vanderstraeten | 427/453 |
| 6,465,088 B1 | 10/2002 | Talpaert | 428/307.3 |
| 6,468,402 B1 | 10/2002 | Vanderstraeten | 204/192.15 |
| 6,488,824 B1 | 12/2002 | Hollars | 204/192.22 |
| 6,500,690 B1 | 12/2002 | Yamagishi | |
| 6,501,387 B2 | 12/2002 | Skiver | |
| 6,511,587 B2 | 1/2003 | Vanderstraeten | 204/298.13 |
| 6,570,709 B2 | 5/2003 | Katayama | 359/586 |
| 6,635,155 B2 | 10/2003 | Miyamura | 204/192.13 |
| 6,660,365 B1 | 12/2003 | Krisko | 428/149 |
| 6,677,063 B2 | 1/2004 | Finley | 428/701 |
| 6,679,978 B2 | 1/2004 | Johnson | 204/192.22 |
| 6,680,135 B2 | 1/2004 | Boire | 428/702 |
| 6,682,773 B2 | 1/2004 | Medwick | 427/154 |
| 6,720,066 B2 | 4/2004 | Talpaert | 428/307.3 |
| 6,777,091 B2 | 8/2004 | Kijima | 428/428 |
| 6,789,906 B2 | 9/2004 | Tonar | 359/604 |
| 6,800,183 B2 | 10/2004 | Takahashi | 204/298.28 |
| 6,818,309 B1 | 11/2004 | Talpaert | 428/432 |
| 6,829,084 B2 | 12/2004 | Takaki | 359/359 |
| 6,833,089 B1 | 12/2004 | Kawahara | 428/212 |
| 6,875,319 B2 | 4/2005 | Nadaud | 204/192.1 |
| 6,964,731 B1 | 11/2005 | Krisko | |
| 6,974,629 B1 | 12/2005 | Krisko | |
| 7,294,404 B2 * | 11/2007 | Krisko et al. | 428/428 |
| 7,534,466 B2 | 5/2009 | Hartig | |
| 7,604,865 B2 | 10/2009 | Krisko | |
| 2001/0007715 A1 | 7/2001 | Toyoshima | 428/426 |
| 2001/0016262 A1 | 8/2001 | Toyoshima | 204/192.12 |
| 2002/0012779 A1 | 1/2002 | Miyashita | |
| 2002/0014634 A1 | 2/2002 | Koyama | 257/192 |
| 2002/0046945 A1 | 4/2002 | Hosokawa | |
| 2002/0102352 A1 | 8/2002 | Hartig | |
| 2002/0155265 A1 | 10/2002 | Choi | 428/212 |
| 2002/0155299 A1 | 10/2002 | Harris | 428/428 |
| 2002/0189938 A1 | 12/2002 | Baldwin | |
| 2003/0039843 A1 | 2/2003 | Johnson | 428/432 |
| 2003/0043464 A1 | 3/2003 | Dannenberg | 359/585 |
| 2003/0045838 A1 | 3/2003 | Tonar | |
| 2003/0064231 A1 | 4/2003 | Hurst | 428/432 |
| 2003/0143437 A1 | 7/2003 | Ohtsu | 428/701 |
| 2003/0186089 A1 | 10/2003 | Kikuchi | 428/701 |
| 2003/0207028 A1 | 11/2003 | Boire | 427/226 |
| 2003/0235695 A1 | 12/2003 | Greenberg | 428/432 |
| 2004/0020761 A1 | 2/2004 | Thomsen | 204/192.12 |
| 2004/0032655 A1 | 2/2004 | Kikuchi | 359/444 |
| 2004/0063320 A1 | 4/2004 | Hollars | 438/689 |
| 2004/0146721 A1 | 7/2004 | Hartig | |
| 2004/0163945 A1 | 8/2004 | Hartig | |
| 2004/0180220 A1 | 9/2004 | Gueneau | 428/446 |
| 2005/0016835 A1 | 1/2005 | Krisko | |
| 2005/0020444 A1 | 1/2005 | Hiraoka | 502/350 |
| 2005/0025982 A1 | 2/2005 | Krisko | |
| 2005/0106397 A1 | 5/2005 | Krisko | |
| 2005/0221098 A1 | 10/2005 | Azzopardi | 428/446 |
| 2005/0233899 A1 | 10/2005 | Anzaki | 502/350 |
| 2005/0244678 A1 | 11/2005 | Arfsten | |

| | | | | | | |
|---|---|---|---|---|---|---|
| 2006/0014050 | A1 | 1/2006 | Gueneau ........................ 428/702 | JP | 01-118807 A | 5/1989 |
| 2006/0051597 | A1 | 3/2006 | Anzaki ........................ 428/432 | JP | 3-122274 A | 5/1991 |
| 2006/0105103 | A1 | 5/2006 | Hartig | JP | 3-187039 A | 8/1991 |
| 2007/0264494 | A1 | 11/2007 | Krisko | JP | 3-193872 A | 8/1991 |

FOREIGN PATENT DOCUMENTS

| | | |
|---|---|---|
| DE | 39 06 453 | 9/1990 |
| DE | 43 13 284 | 10/1994 |
| DE | 19736925 | 3/1998 |
| DE | 19644752 | 4/1998 |
| DE | 19831610 | 1/1999 |
| DE | 10100221 | 7/2001 |
| DE | 10100223 | 7/2001 |
| EP | 0 207 646 | 1/1987 |
| EP | 0 470 379 A | 2/1992 |
| EP | 0 279 550 | 4/1993 |
| EP | 0 369 581 B | 12/1993 |
| EP | 0 590 477 | 4/1994 |
| EP | 0 601 928 | 6/1994 |
| EP | 0 611 733 | 8/1994 |
| EP | 0 515 847 B1 | 2/1995 |
| EP | 0 636 702 | 2/1995 |
| EP | 0 637 572 | 2/1995 |
| EP | 0 639 655 | 2/1995 |
| EP | 0 657 562 | 6/1995 |
| EP | 0 689 096 A | 12/1995 |
| EP | 0 689 962 A | 1/1996 |
| EP | 0 737 513 | 10/1996 |
| EP | 0 328 257 A | 4/1997 |
| EP | 0 787 696 | 8/1997 |
| EP | 0 820 967 A | 1/1998 |
| EP | 0 771 766 | 9/1998 |
| EP | 0 870 530 | 10/1998 |
| EP | 0 753 882 | 11/1998 |
| EP | 0 884 288 | 12/1998 |
| EP | 0 799 255 | 2/1999 |
| EP | 0 901 991 | 3/1999 |
| EP | 0 838 535 | 2/2000 |
| EP | 0 850 203 | 1/2001 |
| EP | 0 850 204 | 12/2001 |
| EP | 1 179 515 | 2/2002 |
| EP | 0 944 557 | 11/2002 |
| EP | 1 254 870 | 11/2002 |
| EP | 0 887 104 | 11/2003 |
| EP | 1 046 727 | 11/2003 |
| EP | 1 375 444 | 1/2004 |
| EP | 1 411 386 | 4/2004 |
| EP | 1 074 525 | 9/2004 |
| EP | 1 466 665 A | 10/2004 |
| EP | 1 500 634 | 1/2005 |
| EP | 1 518 836 | 3/2005 |
| EP | 1 640 149 | 3/2006 |
| FR | 2699164 | 2/1995 |
| FR | 2738812 | 3/1997 |
| FR | 2738813 | 3/1997 |
| FR | 2738836 | 3/1997 |
| FR | 2800731 | 5/2001 |
| FR | 2814094 | 3/2002 |
| FR | 2838734 | 10/2003 |
| FR | 2838735 | 10/2003 |
| FR | 2857885 | 1/2005 |
| FR | 2861385 | 4/2005 |
| FR | 2861386 | 4/2005 |
| FR | 2869897 | 11/2005 |
| GB | 0232680 | 4/1925 |
| GB | 1231280 | 5/1971 |
| GB | 1426906 | 3/1976 |
| GB | 1438462 | 6/1976 |
| GB | 2028376 | 3/1980 |
| GB | 1595061 | 8/1981 |
| GB | 2201428 | 2/1988 |
| GB | 2302102 | 1/1997 |
| GB | 2316687 | 8/1997 |
| GB | 2327428 | 7/1998 |
| JP | 57-140339 A | 8/1982 |
| JP | 60081048 A | 5/1985 |
| JP | 61-091042 A | 5/1986 |
| JP | 62-161945 A | 7/1987 |
| JP | 01-014129 A | 1/1989 |
| JP | 7-149545 A | 6/1995 |
| JP | 7-215074 A | 8/1995 |
| JP | 7-233469 A | 9/1995 |
| JP | 7-508491 A | 9/1995 |
| JP | 7-315874 A | 12/1995 |
| JP | 7-315889 A | 12/1995 |
| JP | 8-011631 A | 1/1996 |
| JP | 8-012378 A | 1/1996 |
| JP | 8-109043 A | 4/1996 |
| JP | 8-134638 A | 5/1996 |
| JP | 8-227006 A | 9/1996 |
| JP | 9-189801 A | 7/1997 |
| JP | 9-202651 A | 8/1997 |
| JP | 9-249967 A | 9/1997 |
| JP | 10-36144 A | 2/1998 |
| JP | 10-048805 A | 2/1998 |
| JP | 11-095014 A | 4/1999 |
| JP | 2005-213585 | 8/2005 |
| WO | WO 87/06626 | 11/1987 |
| WO | WO 89/10430 | 11/1989 |
| WO | WO 92/17621 A | 10/1992 |
| WO | WO 96/25534 | 8/1996 |
| WO | WO 97/03763 | 2/1997 |
| WO | WO 97/07066 | 2/1997 |
| WO | WO 97/07069 | 2/1997 |
| WO | WO 97/08359 | 3/1997 |
| WO | WO 97/10185 | 3/1997 |
| WO | WO 97/10186 | 3/1997 |
| WO | WO 97/11916 | 4/1997 |
| WO | WO 97/15499 | 5/1997 |
| WO | WO 97/25201 | 7/1997 |
| WO | WO 97/37946 | 10/1997 |
| WO | WO 97/42351 | 11/1997 |
| WO | WO 97/42357 | 11/1997 |
| WO | WO 98/06675 | 2/1998 |
| WO | WO 98/23549 | 6/1998 |
| WO | WO 98/25700 | 6/1998 |
| WO | WO 00/13257 | 3/2000 |
| WO | WO 00/37376 | 6/2000 |
| WO | WO 00/37377 | 6/2000 |
| WO | WO 00/50354 | 8/2000 |
| WO | WO 00/75083 | 12/2000 |
| WO | WO 00/75087 | 12/2000 |
| WO | WO 01/02496 | 1/2001 |
| WO | WO 01/32578 | 5/2001 |
| WO | WO 01/71055 | 9/2001 |
| WO | WO 02/24971 | 3/2002 |
| WO | WO 02/085809 | 10/2002 |
| WO | WO 03/006393 | 1/2003 |
| WO | WO 03/012540 | 2/2003 |
| WO | WO 03/050056 | 6/2003 |
| WO | WO 03/053577 | 7/2003 |
| WO | WO 03/072849 | 9/2003 |
| WO | WO 03/080530 | 10/2003 |
| WO | WO 03/087002 | 10/2003 |
| WO | WO 03/087005 | 10/2003 |
| WO | WO 03/095695 | 11/2003 |
| WO | WO 03/106732 | 12/2003 |
| WO | WO 2004/061151 | 7/2004 |
| WO | WO 2004/067464 | 8/2004 |
| WO | WO 2004/085701 | 10/2004 |
| WO | WO 2004/108619 | 12/2004 |
| WO | WO 2004/113064 | 12/2004 |
| WO | WO 2005/000758 | 1/2005 |
| WO | WO 2005/000759 | 1/2005 |
| WO | WO 2005/009914 | 2/2005 |
| WO | WO 2005/012593 | 2/2005 |
| WO | WO 2005/040056 | 5/2005 |
| WO | WO 2005/040058 | 5/2005 |
| WO | 2005063646 A1 | 7/2005 |
| WO | WO 2005/102953 | 11/2005 |
| WO | WO 2005/110937 | 11/2005 |
| WO | WO 2006/017311 | 2/2006 |
| WO | WO 2006/017349 | 2/2006 |
| WO | WO 2006/036605 | 4/2006 |

OTHER PUBLICATIONS

Kobayashi et al., "$V_2O_5$-$WO_3$/$TiO_2$-$SiO_2$-$SO_4^{2-}$ catalysts: Influence of active components and supports on activities in the selective catalytic reduction of NO by $NH_3$ and in the oxidation of $SO_2$," *App. Cat. B: Enviro 63*. (2006), pp. 104-113.

Abstract—Japanese Patent Publication 4-276066.

Abstract—Japanese Patent Publication 5-214525.

Abstract—Japanese Patent Publication 6-330297.

Derwent Abstract 007612002 (Abstract of JP 879697).

Abstract Japanese Patent Publication 08158048A.

Anderson et al., "Improved Photocatalytic Activity and Characterization of Mixed $TiO_2$/$SiO_2$ and $TiO_2$/$Al_2O_3$ Materials", *J. Phys. Chem.*, 1997, 101, 2611-2616.

Anderson et al., "An Improved Photocatalyst of $TiO_2$/$SiO_2$ prepared by a Sol-Gel Synthesis", *J. Phys. Chem.*, 1995, 99, 9882-9885.

Chen Wen-mei et al, "The Effect of $SiO_2$ Additive on Super-hydrophilic Property of $TiO_2$-$SiO_2$ Thin Film by Sol-gel Method", *Journal of Wuhan University of Technology-Mater. Sci. Ed.* (Sep. 2001), vol. 16, No. 3, 30-33.

Guan et al, "Enhanced effect and mechanism of $SiO_2$ addition in super-hydrophilic property of $TiO_2$ films" *Surf. And Coating Tech 173* (2003) pp. 219-223.

Guan, "Relationship between photocatalytic activity, hydrophilicity and self-cleaning effect of $TiO_2$/$SiO_2$ films" *Surf. And Coating Tech 191* (2005) pp. 155-160.

Guan, "Hydrophilic property of $TiO_2$/$SiO_2$ mixing films" *Trans. Nonferrous Met. Soc. China* (2004), vol. 14, No. 2, pp. 251-254.

Ingo et al., "XPS studies of $SiO_2$—$TiO_2$ powders prepared by sol-gel process", *Appl. Surf. Sci.* 1993, 70/71A, pp. 230-234.

Lassaletta et al., "Spectroscopic Characterization of Quantum-Sized $TiO_2$ Supported on Silica: Influence of Size and $TiO_2$-$SiO_2$ Interface Composition", *J. Phys. Chem.*, 1995, 99, 484-1490.

Matthews et al., "An Adsorption Water Purifier with in Situ Photocatalytic Regeneration", *J. Catal.* 1988, 113, pp. 549-555.

Minero et al., "Role of Adsorption in Photocatalyzed Reactions of Organic Molecules in Aqueous of $TiO_2$ Suspensions", *Langmuir*, 1992, 113, pp. 481-486.

Miyashita, et al., "Enhanced Effect of Vacuum-deposited SiO2 Overlayer on Photo-induced Hydrophilicity of TiO2 Film", *Journal of Materials Science 36* (2001) p. 3877-3884.

Miyashita et al., "Spectrum response of the vacuum-deposited $SiO_2$/$TiO_2$ multilayer film with improved photo-catalytic activity", *Journal of Materials Science Letters*, 2001, 20, 2137-2140.

Nakamura, et al., "Hydrophilic property of $SiO_2$/$TiO_2$ double layer films" *Photocatalytic Coatings, Panel Session*, pp. 345-350.

Niwa et al., Ammoxidation of Toluene Over $SiO_2$—$Al_2O_3$ $ZrO_2$—$SiO_2$ and $TiO_2$—$SiO_2$, *J. Catal.* 1981, 69, pp. 69-76.

Novotná, et al., "Photocatalytical $TiO_2$/$SiO_2$—PDMS layers on glass" *Photocatalytic Coatings, Panel Session*, pp. 383-387.

Ohsaki, et al., "Photocatalytic properties of $SnO_2$/$TiO_2$ multilayers" *Photocatalytic Coatings, Panel Session*, pp. 369-376.

Ramirez-Del-Solar et al., "Effect of the Method of Preparation on the Texture of $TiO_2$—$SiO_2$ Gels", *J. Non-Cryst. Solids* 1990, 121, pp. 84-89.

Salvado et al., "$TiO_2$—$SiO_2$ glasses prepared by the alkoxide route", *J. Non-Cryst. Solids* 1992, 147/148, pp. 256-261.

Satoh et al., "Sol-gel-derived binary silica glasses with high refractive index", *J. Non-Cryst. Solids* 1992, 146, pp. 121-128.

Schraml-Marth et al., "Porous silica gels and $TiO_2$—$SiO_2$ mixed oxides prepared via the sol-gel process: characterization by spectroscopic techniques", *J. Non-Cryst. Solids* 1992, 143, pp. 93-111.

Shibata, K., et al., "Acidic Properties of Binary Metal Oxides", *Bull. Chem. Soc. Jpn.* 1973, 46, pp. 2985-2988.

Stakheev, et al., "XPS and XAES Study of $TiO_2$—$SiO_2$ Mixed Oxide System", *J. Phys. Chem.* 1993, 97, pp. 5668-5672.

Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", *J. Phys. Chem.* 2003, 107, pp. 14278-14282.

Yu et al., "The grain size and surface hydroxyl content of super-hydrophilic $TiO_2$—$SiO_2$ composite nanometer thin films" *J. Mat. Sci. Lett.* (2001) 20, pp. 1745-1748.

Veersamy, et al., "Optical and Electronic Properties of Amorphous Diamond." *Diamond and Related Materials*, vol. 2 (1993), pp. 782-787.

"Surface Hardening of Ceramic and Glass Materials," *IBM Technical Disclosure Bulletin*, vol. 36, Issue 1 (Jan. 1993), p. 225.

"Surface Hardening of Ceramic and Glass Materials," *IBM Technical Disclosure Bulletin*, vol. 36, Issue 3 (Mar. 1993), pp. 291-292.

Hans-Joachin Gläser, "Beschichtung großflächiger Substratscheiben durch Kathodenzerstäubung" Glastechnische Berichte 56 (1983) No. 9.

Hans-Joachim Becker et al., "Herstellung und Eigenschaften von Flachgläsern, die mittels Hochvakuum-zerstäu-bungsverfahrens beschichtet wurden" Magazine Silikattechnik 36 (1985) Issue 5.

Ion-Based Methods For Optical Thin Film Deposition (Journal of Material Science; J.P. Marting, 21 (1986) 1-25).

Vakuumbeschichtung 5 Anwendungen Teil II, VDI Verlag 1993, ISBN 3-18-401315-4.

English-language abstract—German Patent Publication 3906453 (Leybold AG).

English-language abstract for JP 2005-213585 (Konica Minolta).

\* cited by examiner

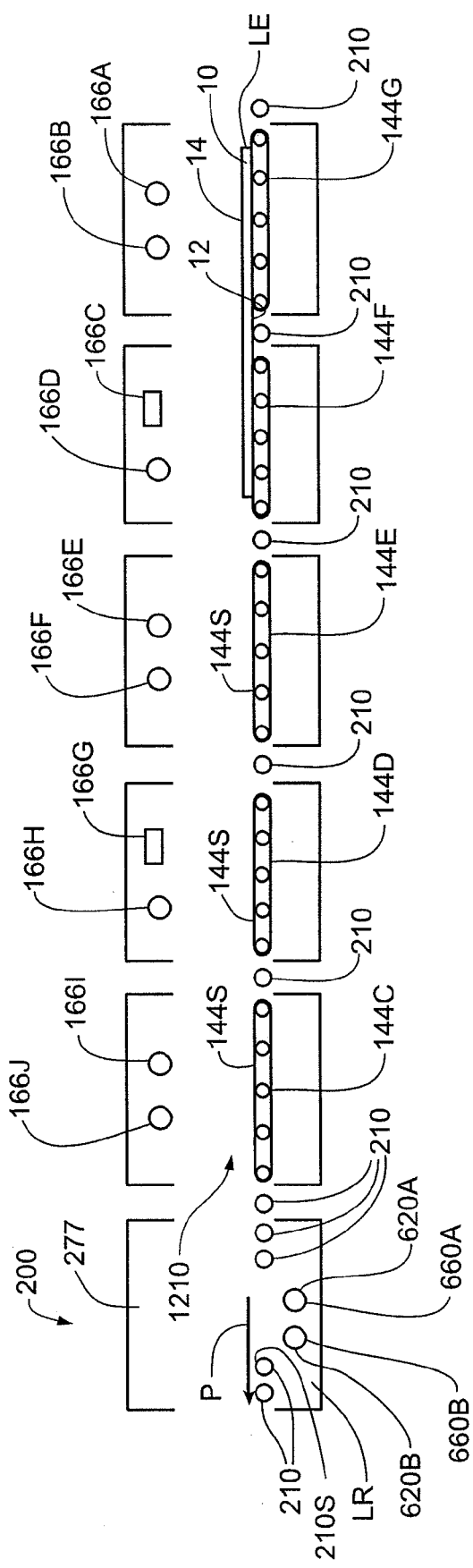
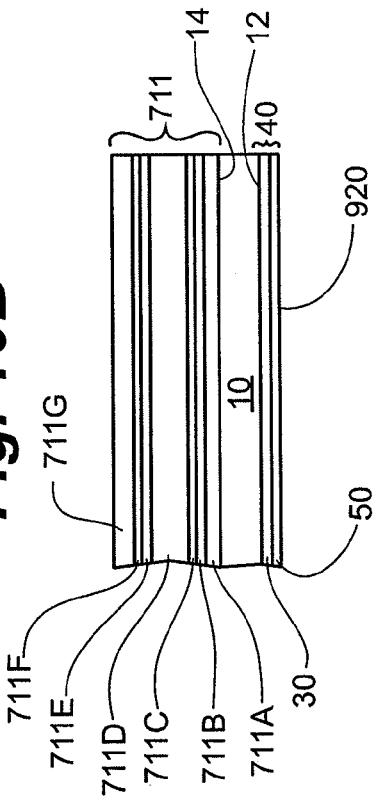
Fig. 10A
Fig. 10B

HYDROPHILIC COATINGS, METHODS FOR DEPOSITING HYDROPHILIC COATINGS, AND IMPROVED DEPOSITION TECHNOLOGY FOR THIN FILMS

CROSS-REFERENCE TO RELATED APPLICATIONS

The present application is a continuation of U.S. application Ser. No. 11/129,820, filed May 16, 2005, which in turn is a non-provisional of U.S. patent application No. 60/633,701, filed Dec. 3, 2004, and a non-provisional of U.S. patent application No. 60/659,529, filed Mar. 7, 2005, the entire disclosures of each of which are incorporated herein by reference.

FIELD OF THE INVENTION

The present invention provides thin film coatings for substrates. More particularly, the invention provides thin film coatings for glass and other sheet-like substrates. The invention also provides methods and apparatuses for depositing thin film coatings onto glass and other sheet-like substrates. Further, the invention provides substrates bearing such coatings, as well as windows and other glazings comprising such coated substrates.

BACKGROUND OF THE INVENTION

For many years, it has been known that titanium dioxide can be used as a photocatalyst. A great deal of research has been done with a view toward providing photocatalytic coatings that offer self-cleaning properties. The pursuit of self-cleaning window coatings, in particular, has been an active field of exploration. These coatings typically employ a titanium dioxide layer deposited over a glass pane. The layer of titanium dioxide, which has a high refractive index, is commonly quite thick. Thick titanium dioxide layers, unfortunately, produce high levels of visible reflectance, thus creating a somewhat mirror-like appearance. This high visible reflection tends to exaggerate the appearance of dirt on a window.

Further, many known photocatalytic coating references teach that supplemental heating (or other supplemental means for delivering energy to the growing film) should be performed during and/or after film deposition so as to achieve high levels of photoactivity.

Still further, many known photocatalytic coatings have properties that are less than ideal for window applications. As noted above, the visible reflectance of known photocatalytic coatings tends to be unacceptably high. Similarly, the reflected colors of these coatings tend not to be ideal. Further, some of these coatings have particularly great surface roughness, especially those designed to have large surface areas for facilitating high photoactivity levels. Such rough coatings, unfortunately, tend to be particularly vulnerable to being abraded. They may also be particularly susceptible to taking on and stubbornly retaining dirt and other contaminants. Finally, with some photocatalytic coatings, it does not appear that the coatings will exhibit the longevity (e.g., in-field durability over time) that is desired for number-one-surface coatings.

The invention provides coatings that offer exceptional durability, exceptional optical properties, reliable production processes, and desirable cleanliness/maintenance properties. Also provided are new deposition technologies (e.g., processes and equipment) for applying thin films (regardless of coating type) to glass and other sheet-like substrates. These technologies can be used in applying a wide variety of desired coating types, and are not limited to depositing photocatalytic or hydrophilic coatings.

BRIEF DESCRIPTION OF THE DRAWINGS

FIG. 10A is a schematic side view of a coater in accordance with certain embodiments of the invention;

FIG. 10B is a partially broken-away schematic side view of a substrate bearing a hydrophilic coating and a low-emissivity coating in accordance with certain embodiments of the invention;

DETAILED DESCRIPTION OF PREFERRED EMBODIMENTS

Figure 1:
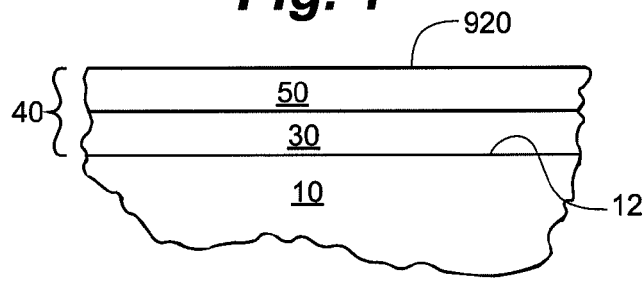
FIG. 1 is a partially broken-away schematic side view of a substrate bearing a hydrophilic coating in accordance with certain embodiments of the invention.
Figure 2:
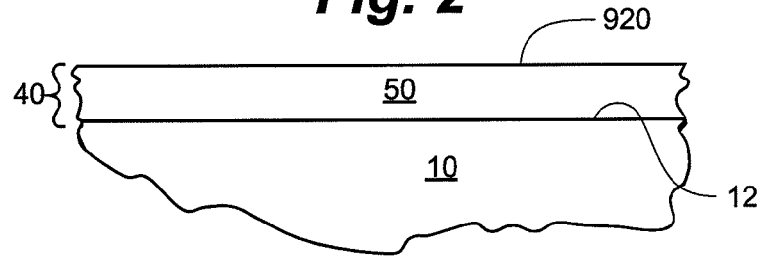
FIG. 2 is a partially broken-away schematic side view of a substrate bearing a hydrophilic coating in accordance with certain embodiments of the invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the given examples have many alternatives that fall within the scope of the invention.

Many embodiments of the invention involve a coated substrate. A wide variety of substrate types are suitable for use in the invention. In some embodiments, the substrate 10 is a sheet-like substrate having generally opposed first 12 and second 14 major surfaces. For example, the substrate can be a sheet of transparent material (i.e., a transparent sheet). The substrate, however, is not required to be a sheet, nor is it required to transparent.

The substrate can optionally be a component of any of a variety of building materials. Examples of anticipated applications include embodiments wherein the substrate is a sash (e.g., a window sash or a door sash), a siding panel (e.g., an aluminum siding panel), a tent panel, a tarpaulin (e.g., a fluorocarbon polymer tarpaulin), a plastic film (e.g., a fluorocarbon plastic film), a roofing shingle, a window blind (such as a metal, plastic, or paper window blind), a paper screen (e.g., a shoji), a railing, a baluster, or an escutcheon. In one embodiment, the substrate is a ceramic tile, such as a wall, ceiling, or floor tile. In another embodiment, the substrate is a glass block. A variety of suitable glass blocks can be obtained commercially from Saint-Gobain Oberland (Koblenz, Germany). In still other embodiments, the substrate is a polyester film, a polyethylene film, a terephthalate film, etc. Suitable films of this nature can be obtained commercially from Nippon Soda Co., Ltd. (Tokyo, Japan). In further embodiments, the substrate is a fence or wall, such as a noise-reduction fence or wall.

Other anticipated applications include embodiments wherein the substrate 10 is part of a sink, toilet, urinal cover, lighting fixture, a cover for a lighting fixture (e.g., a lamp cover), or another bathroom fixture or appliance. Still further, the substrate in one embodiment is a key, a button, or a key pad for a computer or another machine. In yet another embodiment, the substrate is an article of paper clothing (e.g., a paper-based shirt, dress, or pants for medical professionals), an article of cloth clothing, or an article of clothing of another fabric.

For many applications, the substrate will comprise a transparent (or at least translucent) material, such as glass or clear plastic. For example, the substrate is a glass sheet (e.g., a window pane) in certain embodiments. A variety of known glass types can be used, and soda-lime glass will commonly be preferred. In certain preferred embodiments, the substrate is part of a window, skylight, door, or other glazing. In some cases, the substrate is part of an automobile windshield, an automobile side window, an exterior or interior rear-view mirror, a bumper, a hubcap, a windshield wiper, or an automobile hood panel, side panel, trunk panel, or roof panel. In other embodiments, the substrate is a piece of aquarium glass, a plastic aquarium window, or a piece of greenhouse glass. In a further embodiment, the substrate is a refrigerator panel, such as part of a refrigerator door or window.

Substrates of various sizes can be used in the present invention. Commonly, large-area substrates are used. Certain embodiments involve a substrate 10 having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate 10 is a generally square or rectangular glass sheet. The substrate in these embodiments can have any of the dimensions described in the preceding paragraph and/or in the following paragraph. In one particular embodiment, the substrate is a generally rectangular glass sheet having a width of between about 3 meters and about 5 meters, such as about 3.5 meters, and a length of between about 6 meters and about 10 meters, such as about 6.5 meters.

Substrates of various thicknesses can be used in the present invention. In some embodiments, the substrate 10 (which can optionally be a glass sheet) has a thickness of about 1-5 mm. Certain embodiments involve a substrate 10 with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate (which can be glass, plastic, or another material) is between about 4 mm and about 20 mm. Thicknesses in this range, for example, may be useful for aquarium tanks (in which case, the substrate can optionally be glass or acrylic). When the substrate is float glass, it will commonly have a thickness of between about 4 mm and about 19 mm. In another group of embodiments, the substrate is a thin sheet (e.g., of glass) having a thickness of between about 0.35 mm and about 1.9 mm. Embodiments of this nature can optionally involve the substrate 10 being a sheet of display glass or the like.

In some embodiments, the substrate 10 is an engineered glass sheet having a desired outer thickness defining a major surface 12 of the glass sheet. Such engineered glass could, for example, be formed (e.g., as part of, or immediately following, a float process) so that the desired outer thickness serves as a foundation for a hydrophilic coating 40 of the invention. Preferably, this outer thickness has a different composition than the glass beneath it (i.e., than the glass forming the core, or the rest, of the glass sheet). For example, this outer thickness can optionally comprise silica, silicon nitride, alumina, or another dielectric material. This outer thickness of such an engineered glass sheet, could, for example, have a thickness of between about 40 angstroms and about one micron. In one embodiment, this thickness is between about 40 angstroms and about 1,000 angstroms. If so desired, the outer thickness of such an engineered glass sheet can be provided in place of, or in addition to, the optional film 30. In some embodiments, the outer thickness of such an engineered glass sheet provides a sodium ion diffusion barrier. An engineered glass sheet can have such an outer thickness on one or both major surfaces.

The invention provides a variety of product and process embodiments. In one group of product embodiments, there is provided a substrate (optionally a glass sheet or another sheet-like substrate having generally-opposed first and second major surfaces) having a first surface bearing a hydrophilic coating 40. The hydrophilic coating 40 comprises a compound region 50, which can optionally be an outermost region of the coating 40. The compound region 50 comprises a photocatalyst, which is a first material (optionally a first dielectric material, such as a first oxide). The compound region 50 also comprises a second material (optionally a second dielectric material, such as a second oxide), which is a different material than the photocatalyst/first material.

In some embodiments of the present group, the substrate when uncoated has a first visible reflectance, the substrate when bearing the coating 40 has a second visible reflectance, and the second visible reflectance is no more than about 3% greater (preferably no more than about 2% greater, more preferably no more than about 1% greater, and perhaps optimally no more than about 0.75% greater, such as about 0.5% greater) than the first visible reflectance. The visible reflectance here is the film-side visible reflectance measured from the surface 12 bearing the hydrophilic coating 40. Thus, in the present embodiments, when the coating 40 is deposited on the uncoated substrate 10, the visible reflectance either: increases by an amount not greater than about 3%; does not change; or decreases.

The term "visible reflectance" is well known in the present art. This term is used herein in accordance with its well-known meaning. Visible reflectance can be determined in accordance with NFRC 300, Standard Test Method for Determining the Solar and Infrared Optical Properties of Glazing Materials and Fading Resistance of Systems (National Fenestration Rating Council Incorporated, adopted December 2001, published January 2002), the entire contents of which are incorporated herein by reference.

In the present group of embodiments, the total thickness of the coating 40 preferably is less than about 500 angstroms. In some particularly preferred embodiments, the thickness is at least about 50 angstroms, but less than about 400 angstroms. In these embodiments, the coating can optionally also exhibit the low $\Delta R_v$ ranges noted above and/or the acetone decomposition slope ranges described below.

In some embodiments of the present group, the coating 40 has a photocatalytic reaction rate characterized by an acetone decomposition slope of at least about 0.03, preferably at least about 0.035, perhaps more preferably at least about 0.04, and perhaps optimally at least about 0.045. Further, some embodiments exhibit an acetone decomposition slope within one or more of these ranges at a total coating 40 thickness of less than about 250 angstroms, less than about 200 angstroms, or less than 100 angstroms. The coating can have an acetone decomposition slope in one or more of these ranges in addition to, or as an alternative to, having a $\Delta R_v$ in one or more of the ranges noted above. The acetone decomposition slope represents a rate at which the coating 40 reacts to decompose acetone when irradiated. The acetone decomposition slope is measured as follows.

Figure 38:
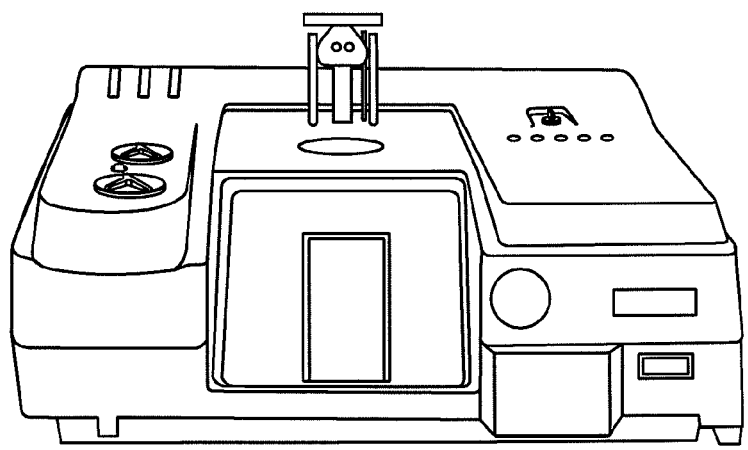
FIG. 38 is a photograph of a testing system used for calculating acetone decomposition slope in accordance with certain embodiments of the invention.
Figure 39:
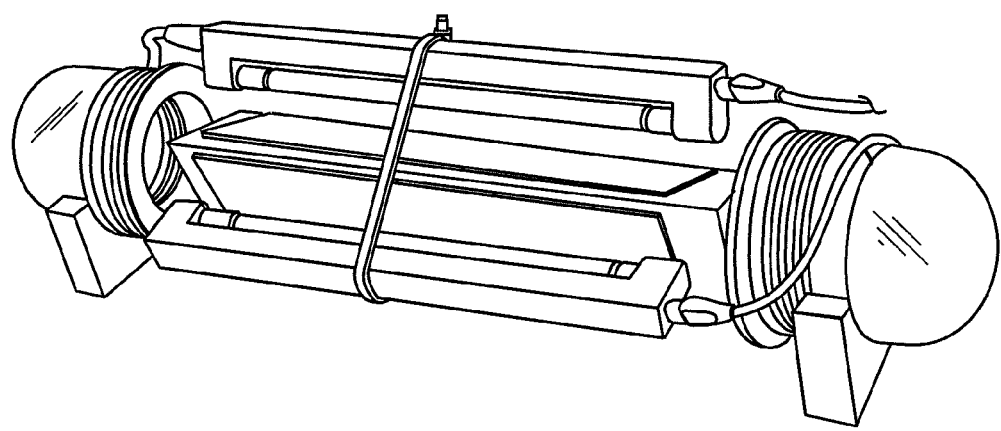
FIG. 39 is a photograph of a quartz reactor tube that is part of a testing system used for calculating acetone decomposition slope in accordance with certain embodiments of the invention.

The following system is used to determine the acetone decomposition slope. Reference is made to FIGS. 38 and 39. Fourier transform infrared (FT-IR) spectroscopy is used (Thermo Nicolet 8700 FT-IR with MCT-A liquid nitrogen cooled detector and a KBr beam splitter). In particular, the following system features are used: Nicolet 8700 Gold system optics; sealed, desiccated optical bench; Ge-on KBr beam splitter (7800—350 $cm^{-1}$); MCT-A liquid nitrogen cooled detector (11700—600 $cm^{-1}$); Research OMNIC Professional 7.1; Val-Q System validation package; OMNIC FT-IR Software Operations. The system is a recycling closed loop system, including a pump (a piston pump) and a reactor cell (a quartz reactor tube). Stainless steel tubing connects the components. The piston pump is commercially available from Fluid Metering, Inc. (Syosset, N.Y., USA): Item ID=Pump Drive Module, Q 115 VAC 60 Hz; Item ID=Q1CSY, Q Pump Head Module, and; Item ID=R412-2, Adapter, ⅜" ID Tube, SS (the pump setting used is 8 out of a possible 10). The quartz reactor tube can be obtained commercially from Allen Scientific Glass, Inc. (Boulder, Colo., USA), e.g., under product code 580. The inner diameter of the tube is about 3 inches, and the outer diameter of the tube is about 3¼ inches. The length of the quartz tube is about 18 inches. The length of the quartz tube with two end caps (e.g., Allen Scientific Glass product code 530) is about 24 inches. The tube slides into each end cap by approximately 3 inches, with the remaining 3 inches projecting beyond the end of the tube. Thus, the two end caps add about 6 inches to the total length of the tube. Each end cap is threaded and thus held on an end of the tube by a threaded polyethylene screw. A Viton o-ring is seated between the end cap and the polyethylene screw. Each end cap has two ports. One port on each end cap is attached to the stainless steel tubing and provides flow into or out of the quartz tube. The second port on the end cap through which gas flows into the quartz tube is sealed off. The second port on the end cap through which gas flows out of the quartz tube has a rubber disc that allows for the injection of acetone. Following acetone injection, the rubber disc seals the port so the system is closed. Within the quartz tube, three coated substrates are mounted on a substrate holder. The holder is formed of opaque white Teflon and has an overall length of about 14 inches. The holder has a triangular cross-section with three sides each measuring about 2½ inches and a hypotenuse of about 2¼ inches. The three substrates are mounted respectively on the three sides of the holder. Three bulbs are positioned to respectively radiate the three substrates. The distance from each bulb to the quartz tube is about 5/16 inch, the quartz thickness is about ⅛ inch, the distance from the quartz tube to the holder is about ¾ inch, and the total distance from each bulb to the holder is about 1 3/16 inches. The coated surface of each substrate faces one of the bulbs. Each coated substrate is rectangular piece of glass having a width of about 2¼ inches and length of about 12 inches. Each UV bulb is 12 inches long, ⅝ inch diameter, 8 Watt, such as the G8T54 bulb commercially available from the McMaster-Carr Supply Company (Atlanta, Ga., USA). The volume for the sample cell, quartz tube and stainless steel tubing are as follow: 500 milliliter sample cell; 2100 milliliter quartz tube; and 78 milliliter stainless steel tubing. The gas sample cell is commercially available from Infrared Analysis Inc. (Anaheim, Calif., USA) under the model number 7.2-V. The gas sample cell is the 6-PA customized to be a variable-path long path cell adjustable in steps of 0.6 meters from 0.6 meters to 7.2 meters. The gas sample cell has the following features: black-anodized aluminum endplates; interior mirror carriage hardware; glass mirror blanks with protected-Gold optical coating; KCI windows, Viton o-ring seals; laser for path length verification and mirror alignment.

The test is performed by closing the system and pumping for an hour to stabilize. Closed means there is no longer any dry air purging through the system, all valves are closed, and the pump is circulating air through the tubing, reactor cell, and sample cell. A background scan and three FT-IR scans are taken prior to injecting acetone into the closed system. One half micro liter of acetone is injected. Once the acetone is injected, FT-IR scans are taken every 5 minutes. The bulbs are turned on 2-3 hours after injecting the acetone. This allows the system to equilibrate prior to turning on the bulbs. The bulbs are on for 4-5 hours, during which time FT-IR scans are taken every 5 minutes. The data resulting from each scan are plotted as a curve of absorbance versus wavelength. The FT-IR peaks show the presence of acetone. The acetone peaks from 1260-1160 cm$^{-1}$ are used to calculate the acetone decomposition slope. In particular, the corrected peak area under the curve at 1260-1160 cm$^{-1}$ is calculated using a macro set up within the FT-IR software and plotted versus time in minutes to calculate the slope (thus, the reported slope is the change in this corrected peak area over time in minutes).

In more detail, the slope is determined using as the first data point the sixth measurement taken after the bulbs are turned on (i.e., the measurement taken 30 minutes after turning on the bulbs). After about 2-4 hours, the acetone begins to run out (and the slope at this point begins to turn). Thus, the final data point for calculating the slope is one taken at least 6 measurements prior this point (i.e., at least 30 minutes prior), preferably 6-10 measurements prior to this point. The corrected peak area under the curve at 1260-1160 cm$^{-1}$, during the noted period of time, is plotted versus time in minutes, and from this the slope is calculated, such plotting and slope calculation being performed with the Trendline option in Microsoft Excel 2000.

The following discussion of a few acetone peaks is useful to further illustrate the foregoing method. A first curve results from a scan done prior to the acetone being injected into the system, and therefore has no peak at 1260-1160 cm$^{-1}$. Another curve results from a scan taken once the acetone has equilibrated and just before UV is turned on. Subsequent curves show the decline in the acetone peak, illustrating photodecomposition of the acetone and hence a reduction in the amount of acetone measured by the FT-IR. Thus, the slope is calculated by plotting the change in the area under the noted curve after the UV light is turned on and prior to all the acetone being decomposed.

Figure 34:
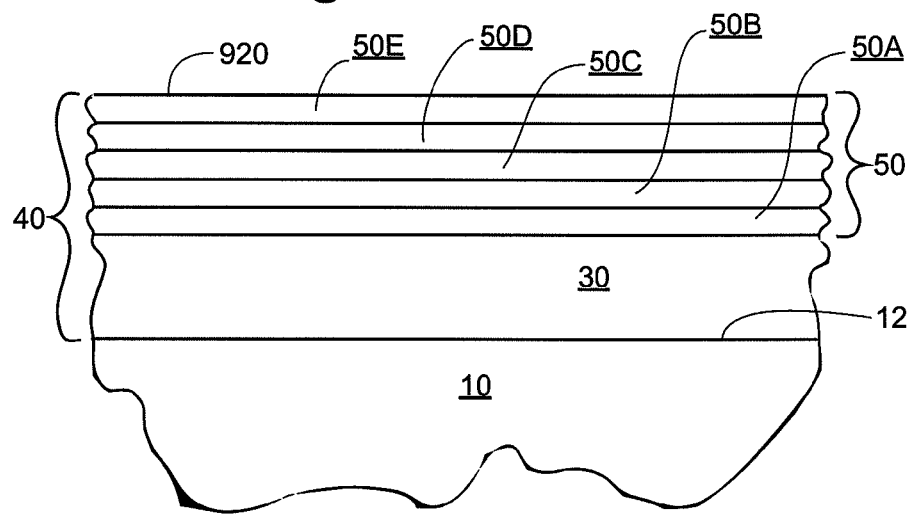
FIG. 34 is a partially broken-away schematic side view of a substrate bearing a hydrophilic coating in accordance with certain embodiments of the invention.
Figure 37:
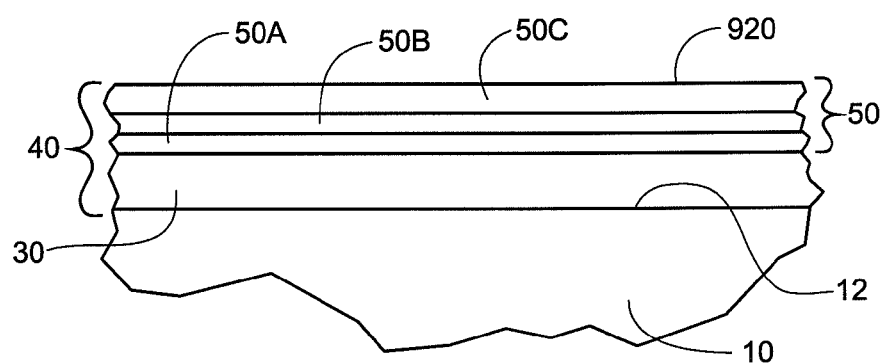
FIG. 37 is a partially broken-away schematic side view of a substrate bearing a hydrophilic coating in accordance with certain embodiments of the invention.

In a first subgroup of the present group of product embodiments, the compound region 50 has a nanolayered structure comprising a plurality of films each having a thickness of about 45 angstroms or less. This nanolayered compound region preferably comprises at least three such films (and in some cases at least five such films), each optionally having a thickness of between about 10 angstroms and about 45 angstroms (more preferably less than about 35 angstroms, and perhaps optimally less than about 30 angstroms). FIG. 37 shows a hydrophilic coating 40 that includes a nanolayered compound region 50 comprising three such films 50A-50C. FIG. 34 shows a hydrophilic coating 40 that includes a nanolayered compound region 50 comprising five such films 50A-50E.

In certain embodiments, the compound region 50 includes a subset of films, wherein the subset comprises at least two (and in some cases at least three) films each having a thickness of between about 10 angstroms and about 45 angstroms, and the subset has a composite refractive index of 2.1 or less (perhaps optimally 2.0 or less). For example, in FIG. 34, films 50A-50D can form a subset of this nature. The films 50A-50D, for example, can have a composite refractive index of about 2.0 when these films are contiguous and have the following characteristics: film 50A is about 10 angstroms of TiO$_2$; film 50B is about 15 angstroms of SiO$_2$; film 50C is about 10 angstroms of TiO$_2$; and film 50D is about 15 angstroms of SiO$_2$. Thus, films 50A-50D form the noted subset in certain embodiments.

The term "composite refractive index" is used herein to refer to the apparent average refractive index over a non-homogenous film or over a number of contiguous films. The composite refractive index can be calculated by depositing only the films of the noted subset on a glass substrate and measuring the apparent refractive index over the whole subset. This index can be measured using the n&k analyzer/method. The n&k analyzer is a well known film measurement system that includes a spectrophotometer to measure reflectance, software for thin film analysis, an x-y stage, a personal computer, and a printer.

In certain embodiments wherein the compound region 50 includes a low-index subset of films, the compound region further includes an exposed outermost film comprising titania and having a thickness of at least about 20 angstroms. In FIG. 34, for example, film 50E can optionally be an exposed titania-containing film (such as a film comprising or consisting essentially of $TiO_2$) having a thickness of between about 20 angstroms and about 45 angstroms, such as about 25 angstroms.

In some cases, the compound region 50 comprises a number of (at least three, at least five, etc.) alternating films of the first and second materials. For example, in the coating 40 of FIG. 37, films 50A and 50C can comprise (or consist essentially of) the first material, and film 50B can comprise (or consist essentially of) the second material. Similarly, in the coating 40 of FIG. 34, films 50A, 50C, and 50E can comprise (or consist essentially of) the first material, and films 50B and 50D can comprise (or consist essentially of) the second material. The alternating films can advantageously have a combined thickness of less than about 200 angstroms, preferably less than about 150 angstroms, perhaps more preferably less than 100 angstroms, and in some cases less than about 80 angstroms. As noted above, each film of the compound region 50 can advantageously have a thickness of less than about 45 angstroms.

In certain embodiments of the present subgroup, the photocatalyst/first material is titania, such that at least one film (preferably at least two films, and perhaps optimally at least three films) of the compound region 50 comprises titania. In some (though, by no means all) embodiments of this nature, the first material is titania that is entirely or substantially amorphous, such that at least one film (and perhaps at least two films) of the compound region 50 comprises titania that is entirely or substantially amorphous. The invention, for example, provides a variety of untempered (e.g., annealed) coated glass embodiments wherein the hydrophilic coating 40 comprises one or more amorphous titania films. Other embodiments involving untempered coatings need not include an amorphous film.

In some embodiments of the present subgroup, the second material is silica, such that at least one film (and in some cases at least two films) of the compound region 50 comprises silica. In other embodiments, the second dielectric material is zirconia, such that at least one film of the compound region 50 comprises zirconia. A variety of other materials can be used.

In some embodiments of the present subgroup, the compound 50 region comprises alternating films of the first material and the second material, the first material is titania, the second material is silica, and the compound region has at least three (or at least five) such alternating films each having a thickness of between about 10 Å and about 45 Å.

Further, some embodiments of the present subgroup provide a compound region 50 comprising the following films, in sequence outwardly (moving away from the substrate): a film comprising titania and having a thickness of between about 5 Å (or about 10 Å) and about 30 Å; a film comprising silica and having a thickness of between about 5 Å and about 30 Å; and an exposed outermost film comprising titania and having a thickness of between about 10 Å and about 45 Å. In some such embodiments, the film comprising silica has a thickness of less than about 15 Å, such as about 10 Å or less. Following is one such coating, with a $SiO_2$ film (optionally at 45 Å, 75 Å or 90 Å) providing foundation for the overlying compound region:

| |
|---|
| air |
| 30 Å $TiO_2$ |
| 15 Å $SiO_2$ |
| 10 Å $TiO_2$ |
| $SiO_2$ |
| glass |

Following is one exemplary method for producing the coating shown immediately above so that the $SiO_2$ film on the substrate has a thickness of about 45 angstroms. Here, the substrate (which in this case was 3.1 mm glass) was coated by conveying the substrate at a rate of about 300 inches per minute sequentially through nine sputter-up bays. Each of the first two bays had a cathode with two rotatable silicon targets. These two cathodes were each sputtered at a power level of about 61 kW in an oxidizing atmosphere at a pressure of about 4 mtorr. The substrate was then conveyed through two more sputtering bays each having a cathode with two rotatable titanium targets. These two cathodes were each sputtered at a power level of about 68 kW in an oxidizing atmosphere at a pressure of about 5 mtorr. The substrate was then conveyed through another sputtering bay with a cathode having two rotatable silicon targets. This cathode was sputtered at a power level of about 53 kW in an oxidizing atmosphere at a pressure of about 5 mtorr. Finally, the substrate was conveyed through four more sputtering bays each having a cathode with two rotatable titanium targets. These four cathodes were each sputtered at a power level of about 102 kW in an oxidizing atmosphere at a pressure of about 3 mtorr. Each of the silicon targets had about 10-15% aluminum. The resulting coating was found to exhibit a $\Delta R_y$, of about 0.26% (i.e., about ¼ of one percent). Further, this coating exhibited an acetone decomposition slope of about 0.0571.

Other embodiments of the present subgroup provide a compound region 50 comprising the following films, in sequence outwardly: a film comprising titania and having a thickness of between about 10 Å and about 30 Å; a film comprising silica and having a thickness of between about 5 Å and about 30 Å; a film comprising titania and having a thickness of between about 10 Å and about 30 Å; a film comprising silica and having a thickness of between about 5 Å and about 30 Å; and an exposed outermost film comprising titania and having a thickness of between about 10 Å and about 45 Å. In some embodiments of this nature, the film comprising silica has a thickness of less than about 15 Å, such as about 10 Å or less. Following is an exemplary coating of this nature, wherein a film of $SiO_2$ (optionally having a thickness of 45 Å, 75 Å, or 90 Å) provides a foundation for the overlying compound region:

| |
|---|
| air |
| 25 Å $TiO_2$ |
| 10 Å $SiO_2$ |
| 15 Å $TiO_2$ |
| 10 Å $SiO_2$ |
| 15 Å $TiO_2$ |
| 90 Å $SiO_2$ |
| glass |

In some embodiments of the present subgroup, the coating 40 includes a desired film 30 between the substrate's first surface 12 and the compound region 50. In these embodiments, the desired film preferably has a physical thickness of at least about 30 angstroms. The physical thickness of this film can optionally be at least about 40 angstroms. Further, the physical thickness of this film 30 can be less than 100 angstroms, if so desired. In some cases, the desired film 30 is entirely or substantially amorphous. Moreover, in some embodiments, the coating 40 includes an amorphous film (such as film 30, which can optionally be amorphous) directly over which there is provided a titania-containing film (such as film 50, 50A, which can optionally be a titania-containing film). The desired film 30 (which can optionally be a sputtered film) can, for example, comprise (e.g., consist essentially of) $SiO_2$. FIGS. 34 and 37 exemplify certain embodiments wherein the desired film 30 is present. It is to be understood, though, that this film 30 is not required in all embodiments.

In some embodiments of the present subgroup, the hydrophilic coating 40 has a total physical thickness of less than about 400 angstroms, preferably less than about 250 angstroms, and perhaps more preferably less than about 200 angstroms.

Figure 18A:
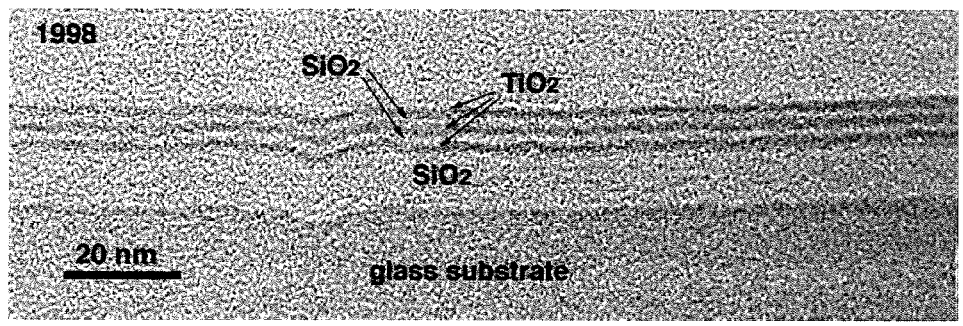
FIG. 18A is a cross-sectional transmission electron microscope brightfield image of a glass substrate bearing a hydrophilic coating in accordance with certain embodiments of the invention.
Figure 18B:
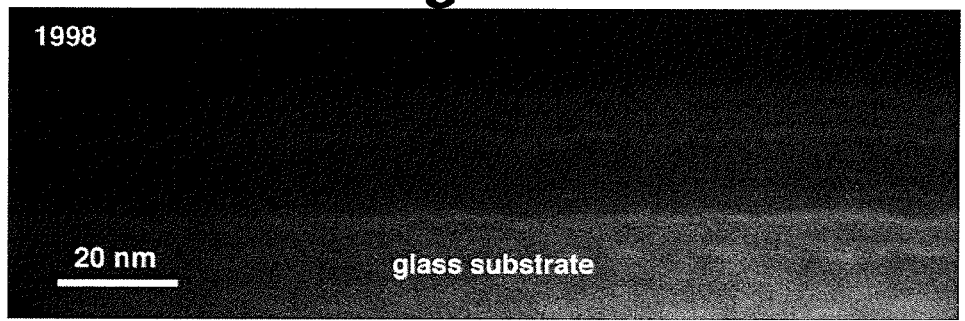
FIG. 18B is a cross-sectional transmission electron microscope darkfield image of a glass substrate bearing a hydrophilic coating in accordance with certain embodiments of the invention.
Figure 19:
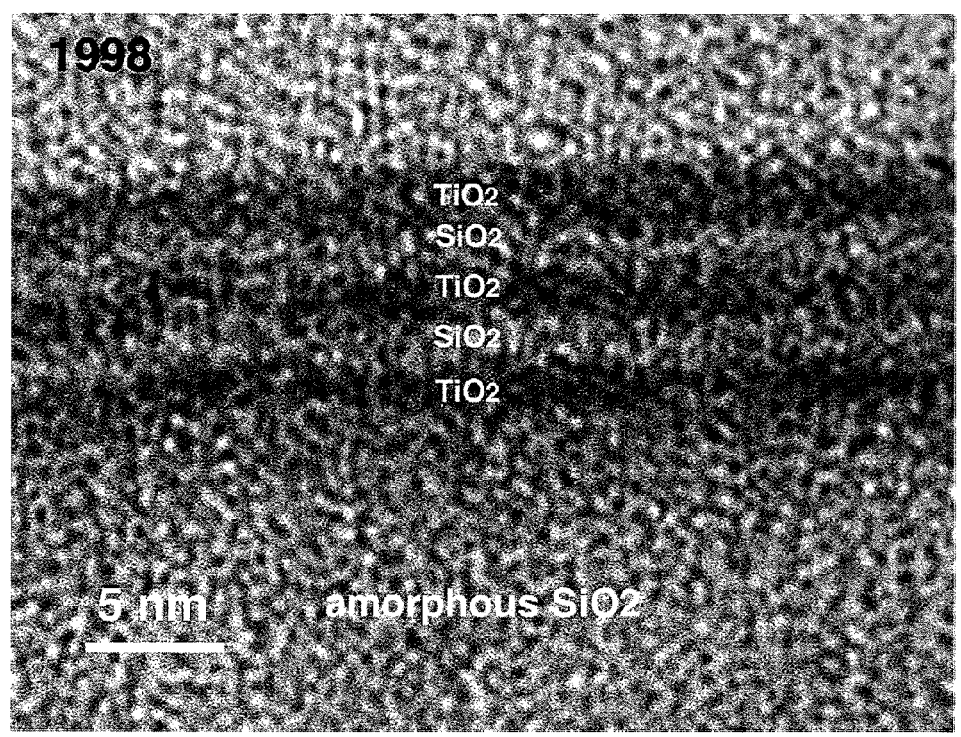
FIG. 19 is a cross-sectional high-resolution lattice-fringe image of a portion of a hydrophilic coating on a glass substrate in accordance with certain embodiments of the invention.
Figure 20:
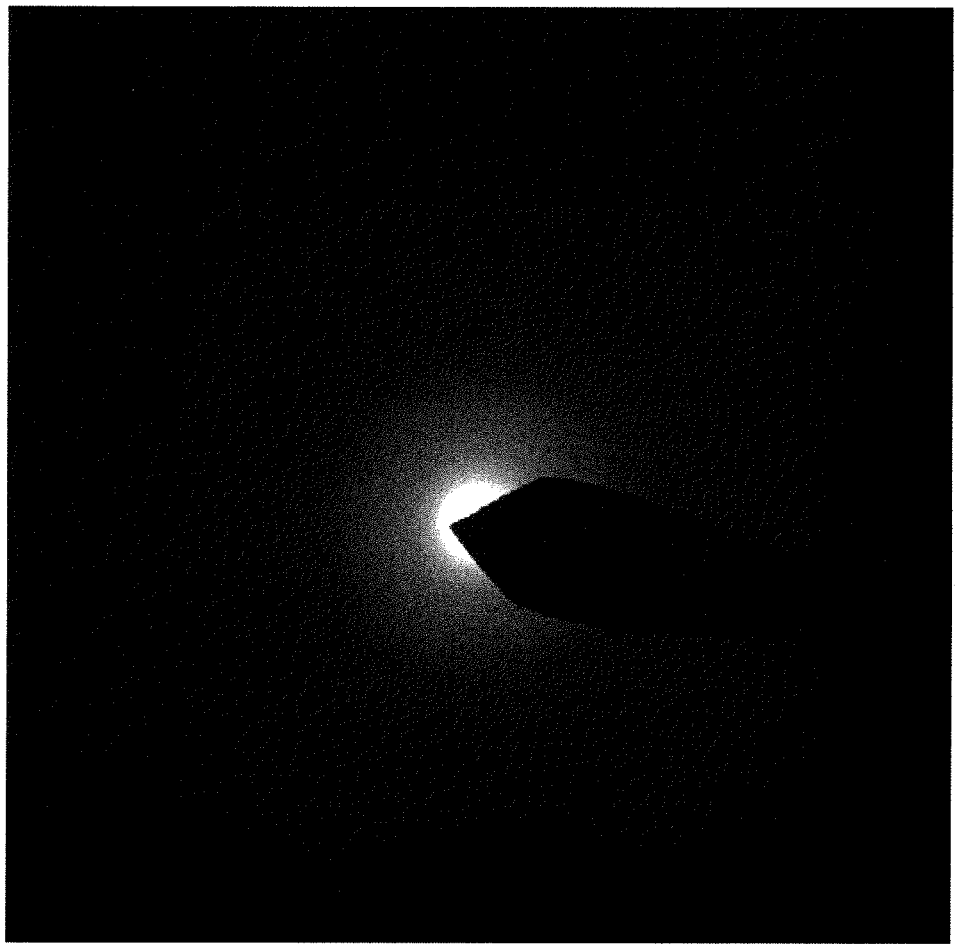
FIG. 20 is a selected area electron diffraction pattern of a hydrophilic coating on a glass substrate in accordance with certain embodiments of the invention.

FIGS. 18A, 18B, and 19 give appreciation for embodiments of the present subgroup wherein the compound region 50 is nanolayered and comprises alternating films of titania and silica. In these embodiments, the compound region preferably has at least three (and optionally at least five) alternating films, each having a thickness of less than about 45 angstroms (and perhaps more preferably less than about 35 angstroms). The compound region 50 shown in FIGS. 18A, 18B, and 19 (i.e., the film region further from the glass than the relatively thick $SiO_2$ base film, which is directly on the glass) includes three outer titania films and two outer silica films, each outer silica film being sandwiched between two outer titania films. In another embodiment, the compound region consists essentially of two outer titania films and one outer silica film, the outer silica film being sandwiched between the two outer titania films.

FIG. 18A is a cross-sectional transmission electron microscope brightfield image of a glass substrate bearing one particular hydrophilic coating 40 of the invention. Here, the light bands are $SiO_2$ and the dark bands are $TiO_2$, as labeled on the image. As noted above, the outer region (i.e., the compound region 50) of this particular coating comprises five alternating films of $SiO_2$ and $TiO_2$. In more detail, moving outwardly (i.e., away from the substrate), the illustrated compound region comprises: (1) a first outer band of film, which comprises $TiO_2$; (2) a second outer band of film, which comprises $SiO_2$; (3) a third outer band of film, which comprises $TiO_2$; (4) a fourth outer band of film, which comprises $SiO_2$; and (5) a fifth outer band of film, which comprises $TiO_2$. Each of the illustrated bands has a thickness of between about 20 angstroms and about 40 angstroms. FIG. 18B is a cross-sectional transmission electron microscope darkfield image of the same coated glass substrate. FIG. 19 is a cross-sectional high-resolution lattice-fringe image of the same coated glass.

Thus, in certain embodiments, the compound region 50 comprises alternating films of first and second materials. In some preferred embodiments of this nature, the first material is titania, the second material is silica, and the compound region 50 has at least three such alternating films each having a thickness of between about 10 angstroms and about 45 angstroms. As noted above, a coating of this nature can optionally include a desired film 30 between the substrate's first surface 12 and the compound region 50. When provided, the desired film 30 preferably has a physical thickness of at least about 30 angstroms, perhaps more preferably at least about 40 angstroms, while optionally being less than 100 angstroms. In some cases, this film 30 is an entirely or substantially amorphous film, such as a silica film, e.g., a sputtered silica film.

The coating imaged in FIGS. 18A, 18B, 19, and 20 is untempered. This particular coating exemplifies a class of embodiments wherein the hydrophilic coating 40 is entirely amorphous. The amorphous nature of this particular coating can be appreciated with reference to FIG. 20, which is a selected area electron diffraction pattern of a glass sheet bearing the coating. The lack of spots or rings in the pattern indicates that the coating is entirely amorphous. In cases involving an amorphous film, the specimen should be ion milled under cryo temperatures to facilitate testing to determine that the specimen is amorphous.

The invention also provides a number of methods for processing (e.g., coating) glass sheets and other sheet-like substrates. Some of these methods involve a coater in which there is provided a particular arrangement of sputtering targets. In more detail, these methods comprise providing a coater having a series of sputter deposition bays. The coater 2000 has a substrate transport system 1210 that defines a path of substrate travel P extending through the coater (e.g., through the noted series of bays). Preferably, a desired pair of these bays are contiguous (i.e., not separated from each other by any other deposition bay) and are equipped with sputtering targets arranged in a desired configuration. The methods involve conveying a sheet-like substrate (e.g., a glass sheet) along the path of substrate travel (e.g., after positioning the substrate on the transport system) so as to move the substrate through a first of the desired pair of bays and then through a second of the desired pair of bays. In the present methods, this results in the substrate being conveyed past a first target in the first bay, then past a second target in the first bay, then past a first target in the second bay, and then past a second target in the second bay. The first target in the first bay comprises (e.g., carries) a first sputterable target material, which comprises a first metal, while the second target in the first bay comprises a second sputterable target material, which comprises a second metal. Here, the first and second sputterable target materials are of different composition. Conjointly, the first target in the second bay comprises a third sputterable target material, which comprises the second metal, while the second target in the second bay comprises a fourth sputterable target material, which comprises the first metal. The third and fourth sputterable target materials are of different composition. Various embodiments of this nature will now be described.

Figure 35A:
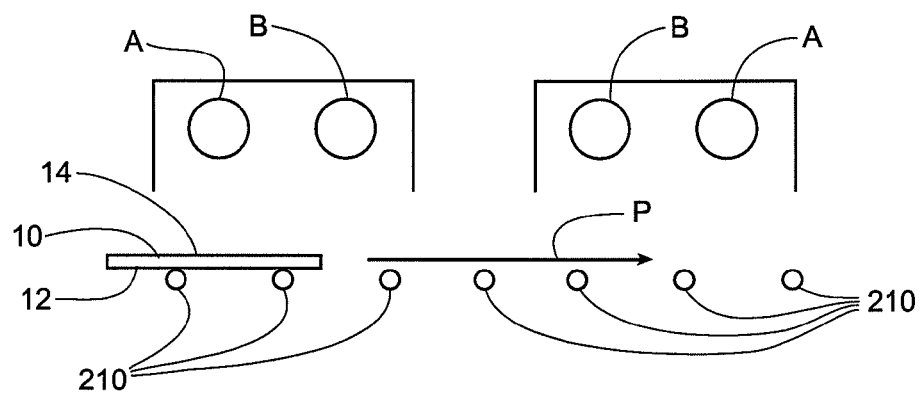
FIG. 35A is a schematic side view of a coater in accordance with certain embodiments of the invention.
Figure 35B:
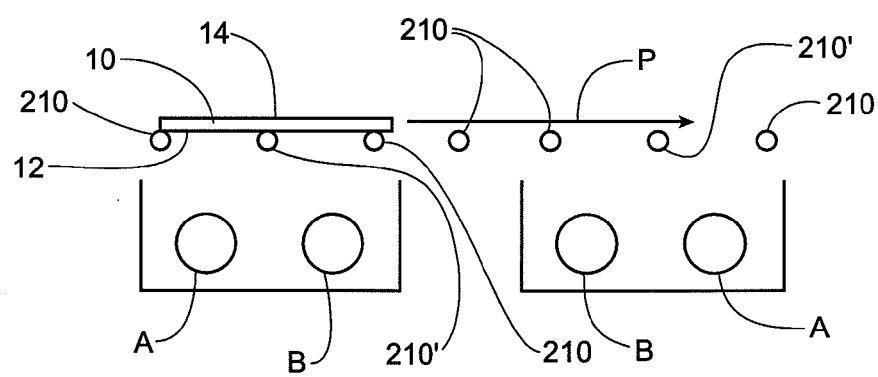
FIG. 35B is a schematic side view of a coater in accordance with certain embodiments of the invention.

In some of the present methods, the first and fourth target materials are the same sputterable target material. Conjointly, the second and third target materials can be the same sputterable target material. The two contiguous sputtering bays, for example, can be set-up as shown in FIG. 35A or 35B. Here, the reference character "A" represents one sputterable target material (which comprises the first metal), while the reference character "B" represents a different sputterable target material (which comprises the second metal). In some embodiments of this nature, either the first metal or the second metal is titanium. Additionally or alternatively, one of the first and second metals can be silicon. It is to be understood that in any embodiments of the invention involving one or more silicon targets, the silicon can optionally include a small amount of aluminum or another electrically-conductive material. In certain embodiments, either the first metal is titanium and the second metal is silicon or the first metal is silicon and the second metal is titanium.

Figure 26:
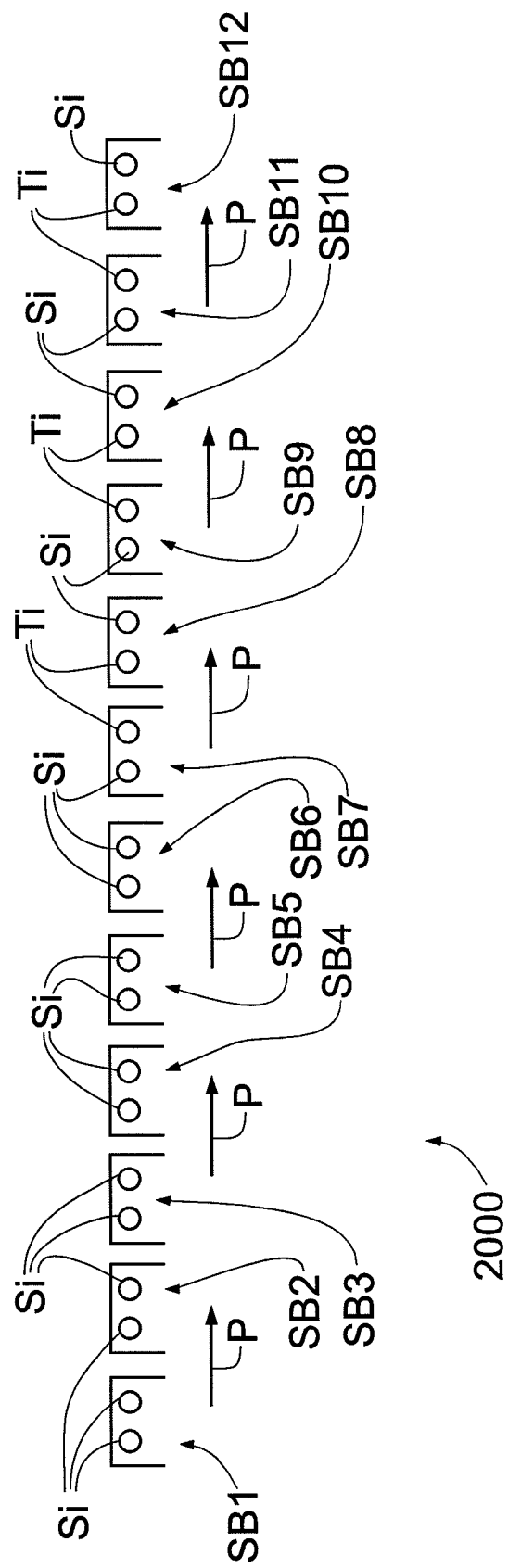
FIG. 26 is a schematic side view of a coater in accordance with certain embodiments of the invention.
Figure 27:
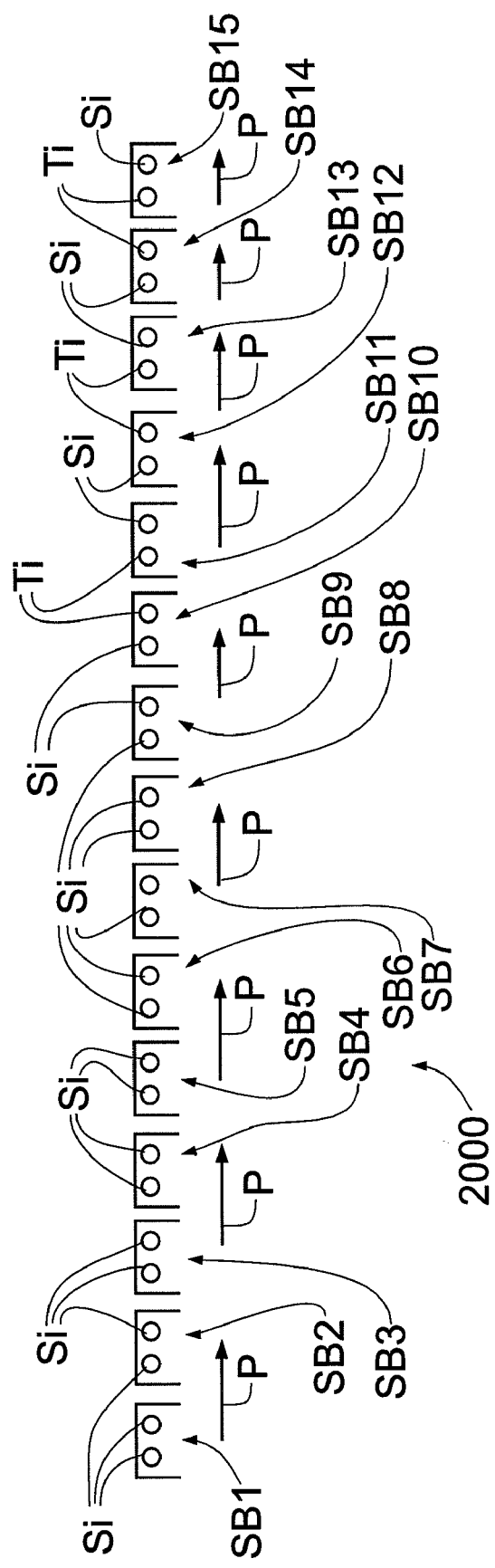
FIG. 27 is a schematic side view of a coater in accordance with certain embodiments of the invention.

In one particular embodiment, the first sputterable target material is silicon, the second sputterable target material is titanium, the third sputterable target material is titanium, and the fourth sputterable target material is silicon. Exemplary target arrangements of this nature are found in the seventh and eight sputtering bays SB7, SB8 of FIG. 25, in the ninth and tenth sputtering bays SB9, SB10 of FIG. 25, in the eleventh and twelfth sputtering bays SB11, SB12 of FIG. 25, in the seventh and eight sputtering bays SB7, SB8 of FIG. 26, in the ninth and tenth sputtering bays SB9, SB10 of FIG. 26, in the eleventh and twelfth sputtering bays SB11, SB12 of FIG. 26, in the tenth and eleventh sputtering bays SB10, SB11 of FIG. 27, in the twelfth and thirteenth sputtering bays SB12, SB13 of FIG. 27, and in the fourteenth and fifteenth sputtering bays SB14, SB15 of FIG. 27.

In another embodiment, the first sputterable target material is titanium, the second sputterable target material is silicon, the third sputterable target material is silicon, and the fourth sputterable target material is titanium. Exemplary target arrangements of this nature are found in the eighth and ninth sputtering bays SB8, SB9 of FIG. 25, in the tenth and eleventh sputtering bays SB10, SB11 of FIG. 25, in the eighth and ninth sputtering bays SB8, SB9 of FIG. 26, in the tenth and eleventh sputtering bays SB10, SB11 of FIG. 26, in the eight and ninth sputtering bays SB8, SB9 of FIG. 26, in the eleventh and twelfth sputtering bays SB11, SB12 of FIG. 27, and in the thirteenth and fourteenth sputtering bays SB13, SB14 of FIG. 27.

In some of the present methods, the first and second targets in the first bay are lower targets mounted below the path of substrate travel, and the first and second targets in the second bay are lower targets mounted below the path of substrate travel. FIG. 35B exemplifies target arrangements of this nature. Methods involving such a target arrangement can optionally be carried out using an intermediate roller 210' configuration like that exemplified, for example, in FIGS. 25 and 35B. Here, the intermediate transport roller 210' serves as a dividing member, which provides some separation of the plumes sputtered from the first and second targets. Intermediate roller 210' embodiments are described below in further detail.

In some the present methods (including embodiments where the first and second targets are sputtered upwardly), the substrate transport system 1210 is a roller transport system comprising a plurality of transport rollers 210. In these embodiments, the conveyance of the glass sheet 10 involves moving the glass 10 along the path of substrate travel P while a bottom major surface 12 of the glass contacts a plurality of the rollers 210. In more detail, the bottom surface 12 of the glass in these methods is in direct contact with a contact surface 210S of two or more rollers 210 during conveyance.

Figure 36A:
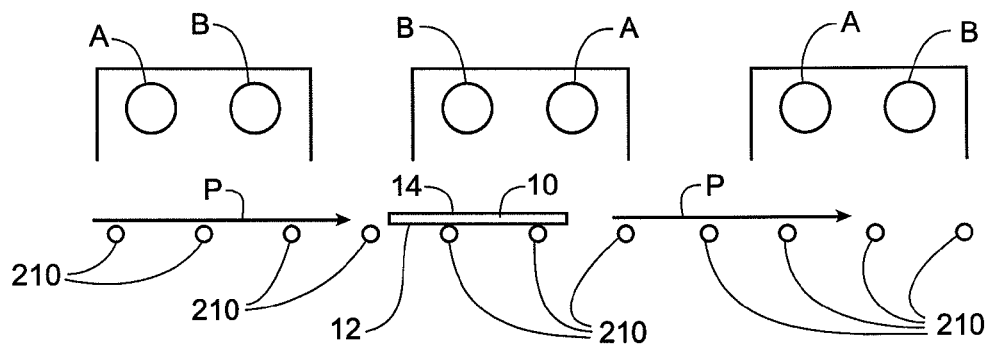
FIG. 36A is a schematic side view of a coater in accordance with certain embodiments of the invention.
Figure 36B:
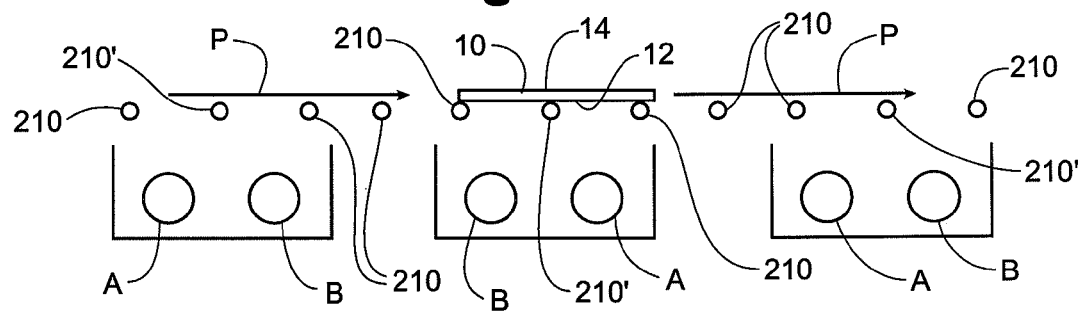
FIG. 36B is a schematic side view of a coater in accordance with certain embodiments of the invention.

In some of the present methods, after the glass sheet 10 is conveyed through the second bay of the desired pair, the glass 10 is conveyed through a further sputter deposition bay that is contiguous to the second bay of the desired pair. This can involve conveying the glass sheet past an initial target in the further bay, and then past a subsequent target in the further bay. Here, the initial target in the further bay comprises a fifth sputterable target material, which comprises the first metal, and the subsequent target in the further bay comprises a sixth sputterable target material, which comprises the second metal. The fifth and sixth sputterable target materials are of different composition. In some cases, the first, fourth, and fifth target materials are the same sputterable target material. Conjointly, the second, third, and sixth target materials can be the same sputterable target material. The three contiguous sputtering bays here can be set-up, for example, as shown in FIG. 36A or 36B. Here again, "A" represents one sputterable target material (which comprises the first metal), and "B" represents a different sputterable target material (which comprises the second metal). In some embodiments of this nature, either the first metal or the second metal is titanium. For example, in some cases, either the first metal is titanium and the second metal is silicon or the first metal is silicon and the second metal is titanium.

In one particular embodiment, the first sputterable target material is silicon, the second sputterable target material is titanium, the third sputterable target material is titanium, the fourth sputterable target material is silicon, the fifth sputterable target material is silicon, and the sixth sputterable target material is titanium. Exemplary target arrangements of this nature are found in the seventh through ninth bays SB7-SB9 of FIG. 25, in the ninth through eleventh bays SB9-SB11 of FIG. 25, in the seventh through ninth bays SB7-SB9 of FIG. 26, in the ninth through eleventh bays SB9-SB11 of FIG. 26, in the tenth through twelfth bays SB10-SB12 of FIG. 27, and in the twelfth through fourteenth bays SB12-SB14 of FIG. 27.

In another embodiment, the first sputterable target material is titanium, the second sputterable target material is silicon, the third sputterable target material is silicon, the fourth sputterable target material is titanium, the fifth sputterable target material is titanium, and the sixth sputterable target material is silicon. Exemplary target arrangements of this nature are found in the eighth through tenth bays SB8-SB10 of FIG. 25, in the tenth through twelfth bays SB10-SB12 of FIG. 25, in the eighth through tenth bays SB8-SB10 of FIG. 26, in the tenth through twelfth bays SB10-SB12 of FIG. 26, in the eleventh through thirteenth bays SB11-SB13 of FIG. 27, and in the thirteenth through fifteenth bays SB13-SB15 of FIG. 27.

In some cases, the first and second targets in the first bay are lower targets mounted below the path of substrate travel, the first and second targets in the second bay are lower targets mounted below the path of substrate travel, and the initial and subsequent targets in the further bay are lower targets mounted below the path of substrate travel. Reference is made to FIG. 36B.

One particular technique for coating a substrate 10 with a hydrophilic coating 40 will now be described. This technique is one useful way to deposit a coating like that imaged in FIGS. 18A-20. In some cases, this technique produces a film 30 of $SiO_2$ and a compound region 50 comprising alternating films of $TiO_2$ and $SiO_2$.

In the present technique, the substrate is positioned at the inlet of a sputtering line and conveyed to a first upward coat zone. This coat zone is provided with three lower cathodes, each carrying two rotary sputtering targets and each being operably coupled with an AC power supply. The lower sputtering targets in this coat zone are silicon sputtering targets. These silicon targets are sputtered upwardly, at a power of about 80 kW, in an oxidizing atmosphere to deposit silicon dioxide upon the substrate 10 (e.g., directly upon its first major surface 12). The atmosphere may consist essentially of oxygen (e.g., about 100% $O_2$). Alternatively, the atmosphere may comprise $Ar/O_2$ (e.g., oxygen and up to about 40% argon). The pressure can be about 3.5 mtorr. The substrate 10 is conveyed over all three of these cathodes at a rate of about 300 inches per minute, while sputtering each of these targets under the noted conditions. Each silicon target can include some aluminum or another material that enhances the conductivity of the target.

The substrate 10 is then conveyed into a second upward coat zone. This coat zone is also provided with three lower cathodes, each carrying two rotary sputtering targets and each being operably coupled with an AC power supply. The lower targets in this coat zone are also silicon targets. These targets are sputtered upwardly in an oxidizing atmosphere at a pressure of about 3.5 mtorr. The first two targets are operated at 80 kW, and the last four targets are operated at 60 kW. The substrate 10 is conveyed over all three of these cathodes at a rate of about 300 inches per minute, while sputtering each of these targets under the noted conditions.

The substrate 10 is then conveyed into a third upward coating zone. In this coat zone, two lower cathodes are operated, each carrying two rotary sputtering targets and each being operably coupled with an AC power supply. These four targets are also silicon targets. These targets are sputtered upwardly in an oxidizing atmosphere at a pressure of about 3.5 mtorr. Two of these targets are operated at 60 kW, and the other two of these targets are operated at 76 kW. The substrate 10 is conveyed over both of these cathodes at a rate of about 300 inches per minute, while sputtering each of these targets under the noted conditions.

Figure 11:
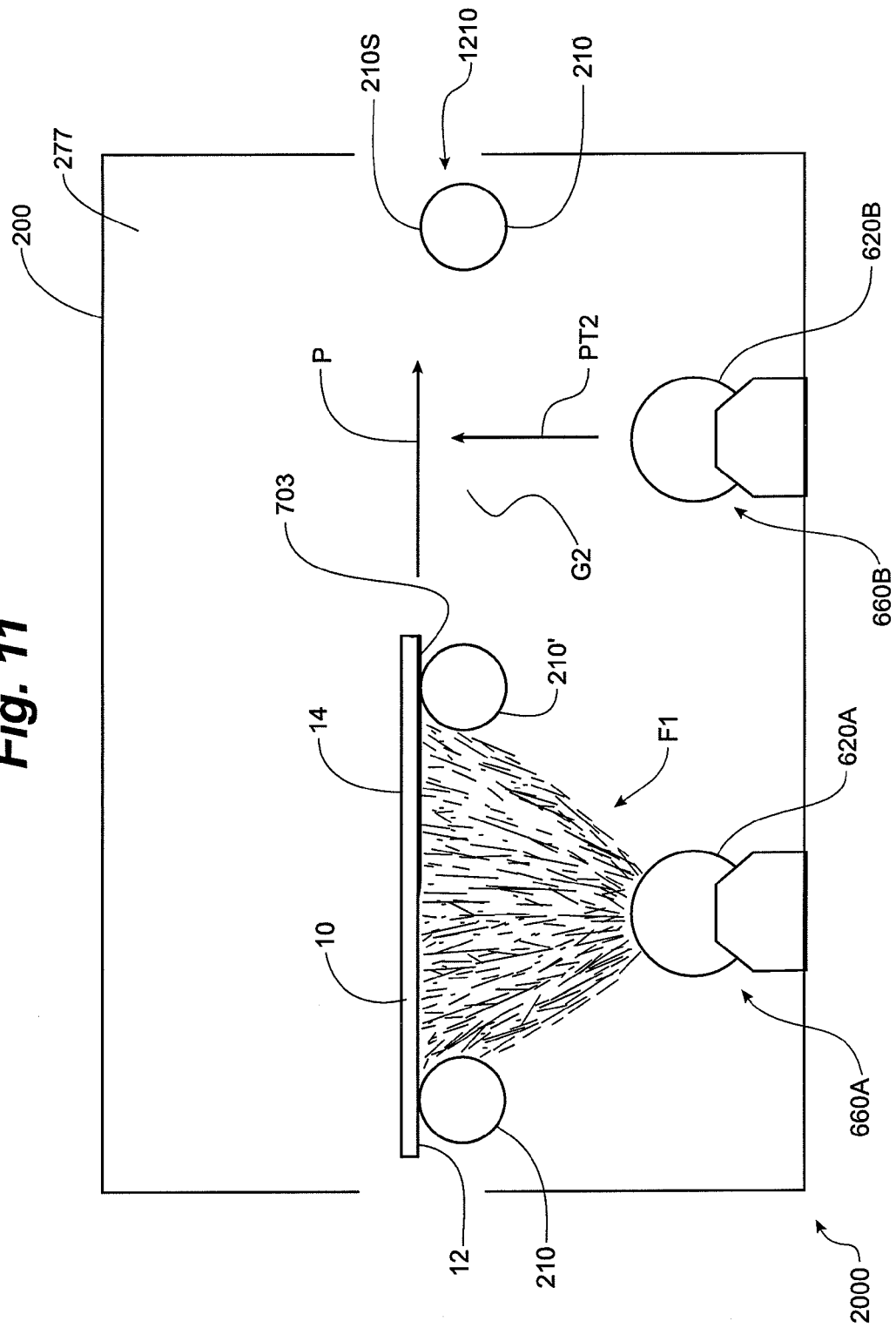
FIG. 11 is a schematic side view of a deposition chamber in accordance with certain embodiments of the invention.
Figure 12:
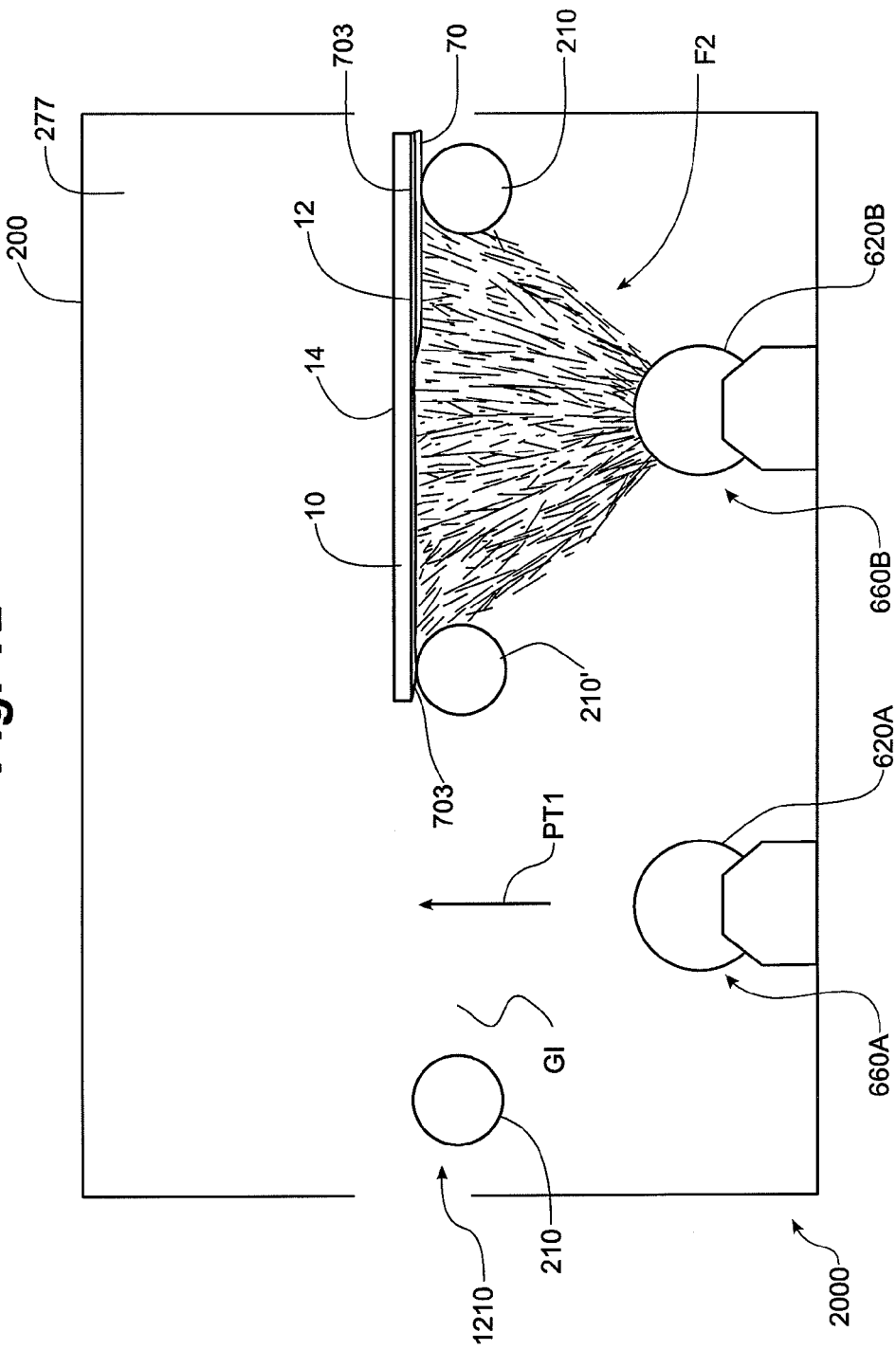
FIG. 12 is a schematic side view of a deposition chamber in accordance with certain embodiments of the invention.
Figure 13:
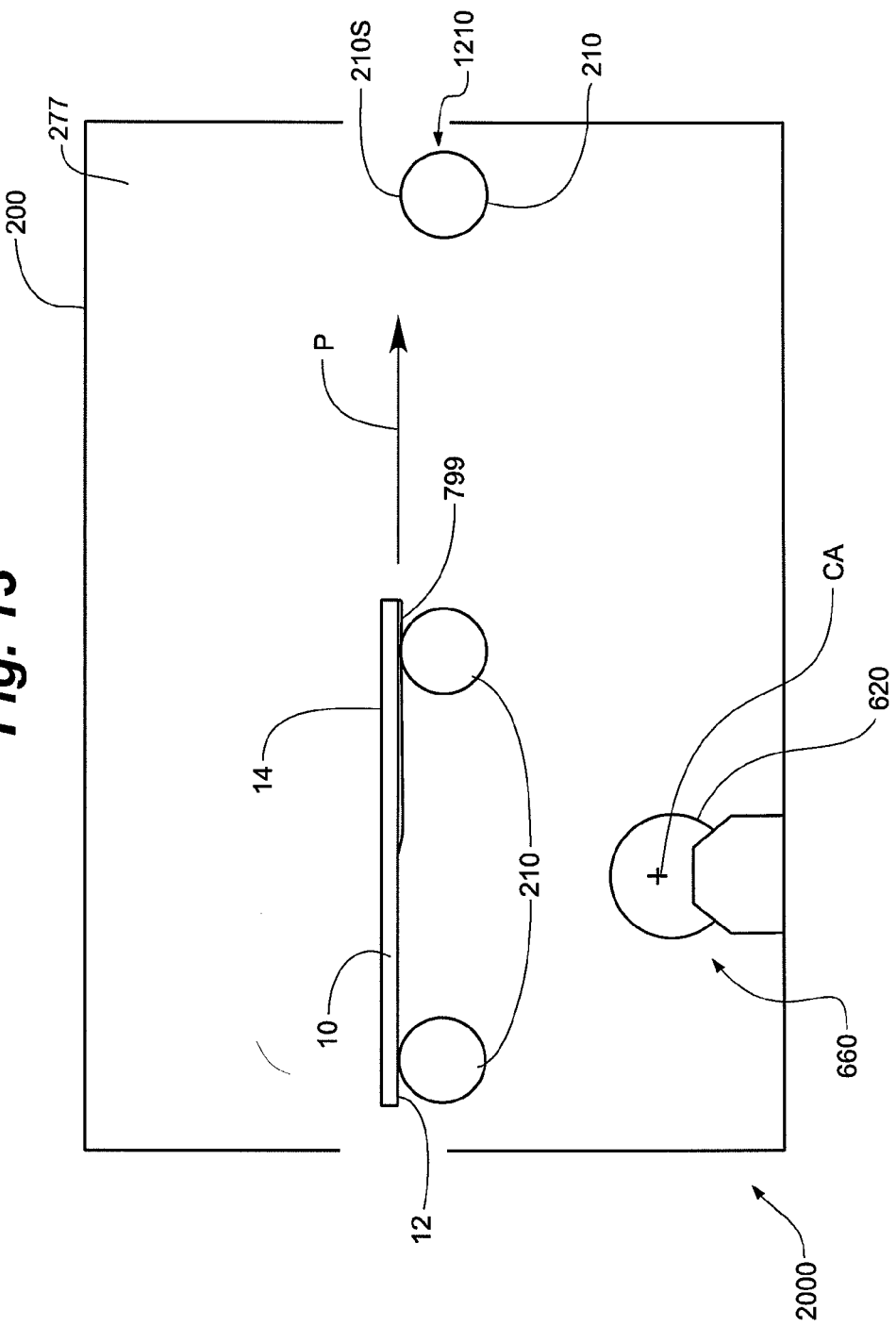
FIG. 13 is a schematic side view of a deposition chamber in accordance with certain embodiments of the invention.

The substrate 10 is then conveyed into a fourth upward coating zone. In this zone, there are provided three sputtering bays each having a cathode comprising two targets. Each cathode is operably coupled with an AC power supply. The first of these cathodes comprises a pair of sputtering targets—a first comprising silicon, and a second comprising titanium. A target arrangement of this nature is shown, for example, in the 7$^{th}$ illustrated sputtering bay SB7 of FIG. 25. The second of the cathodes also comprises a pair of sputtering targets—a first comprising titanium, and a second comprising silicon. A target arrangement of this nature is shown, for example, in the 8$^{th}$ illustrated sputtering bay SB8 of FIG. 25. Finally, the third of these cathodes comprises a pair of sputtering targets—a first comprising silicon, and a second comprising titanium. A target arrangement of this nature is shown in the 9$^{th}$ illustrated sputtering bay SB9 of FIG. 25. Each of the three bays here has an intermediate roller 210' configuration like that shown, for example, in FIGS. 11-12 and 25. Each of the three cathodes here is operated at a power level of 80 kW. The targets in this coat zone are sputtered in an oxidizing atmosphere at a pressure of about 3.5 mtorr. The atmosphere may consist essentially of oxygen. Alternatively, the atmosphere may comprise Ar/O$_2$. The substrate 10 is conveyed over all three of these cathodes at a rate of about 300 inches per minute, while sputtering each of these targets under the noted conditions.

The substrate 10 is then conveyed into a fifth upward coating zone. In this zone, there are provided three sputtering bays each having a cathode comprising two sputtering targets. Each cathode is operably coupled with an AC power supply. The first of these cathodes comprises a pair of sputtering targets—a first comprising titanium, and a second comprising silicon. A target arrangement of this nature is shown, for example, in the 10$^{th}$ illustrated sputtering bay SB10 of FIG. 25. The second of these cathodes also comprises a pair of sputtering targets—a first comprising silicon, and a second comprising titanium. A target arrangement of this nature is shown, for example, in the 11$^{th}$ illustrated sputtering bay SB11 of FIG. 25. Finally, the third of these cathodes comprises a pair of sputtering targets—a first comprising titanium, and a second comprising silicon. A target arrangement of this nature is shown, for example, in the 12$^{th}$ illustrated sputtering bay SB12 of FIG. 25. Each of thee three sputtering bays here has an intermediate roller 210' configuration like that shown, for example, in FIGS. 11-12 and 25. Each of the three cathodes here is operated at a power level of 80 kW. The targets in this coat zone are sputtered in an oxidizing atmosphere at a pressure of about 3.5 mtorr. The substrate 10 is conveyed over all three of these cathodes at a rate of about 300 inches per minute, while sputtering each of these targets under the noted conditions. The film deposited in this zone forms the outermost portion of the hydrophilic coating 40 in the present embodiment.

In one particular embodiment, there is provided a method that can be used to deposit a film 30 of SiO$_2$ having a thickness of about 100 angstroms, and a compound region 50 having a total thickness of about 50 angstroms, where the compound region 50 comprises five alternating films (each having a thickness of about 10 angstroms) of TiO$_2$ and SiO$_2$ (e.g., three such TiO$_2$ films and two such SiO$_2$ films). Here, the substrate is positioned at the inlet of a sputtering line and conveyed to a desired upward coat zone. This coat zone is provided with three lower cathodes, each carrying two rotary sputtering targets. The lower sputtering targets in this coat zone are silicon sputtering targets. These silicon targets are sputtered upwardly, at a power of about 52 kW, in an oxidizing atmosphere to deposit silicon dioxide upon the substrate 10 (e.g., directly upon its first major surface 12). The atmosphere may consist essentially of oxygen (e.g., about 100% O$_2$). Alternatively, the atmosphere may comprise Ar/O$_2$ (e.g., oxygen and up to about 40% argon). The pressure can be about 3.5 mtorr. The substrate 10 is conveyed over all three of these cathodes at a rate of about 161 inches per minute, while sputtering each of these targets under the noted conditions. Each silicon target can include some aluminum or another material that enhances the conductivity of the target.

The substrate 10 is then conveyed into a further upward coat zone. This coat zone is also provided with three lower cathodes each carrying two rotary sputtering targets. The first of these cathodes comprises a pair of sputtering targets—a first comprising silicon, and a second comprising titanium. The second of the cathodes also comprises a pair of sputtering targets—a first comprising silicon, and a second comprising titanium. Finally, the third of these cathodes comprises a pair of sputtering targets—a first comprising silicon, and a second comprising titanium. Each of the three bays here has an intermediate roller 210' configuration like that shown, for example, in FIGS. 11-12 and 25. The first of these three cathodes is operated at a power level of 90.4 kW. The second of these three cathodes is operated at a power level of 92.6 kW. The third of these three cathodes is operated at a power level of 90.4 kW. The targets in this coat zone are sputtered in an oxidizing atmosphere at a pressure of about 3.5 mtorr. The atmosphere may consist essentially of oxygen. Alternatively, the atmosphere may comprise Ar/O$_2$. The substrate 10 is conveyed over all three of these cathodes at a rate of about 161 inches per minute, while sputtering each of these targets under the noted conditions. The film deposited in this zone forms the outermost portion of the hydrophilic coating 40 in the present embodiment. The resulting coating was found to exhibit a $\Delta R_v$ of about 0.7% (i.e., about 7/10 of one percent). Further, this coating exhibited an acetone decomposition slope of about 0.0626.

In deposition techniques like that just described, it is to be appreciated that the second major surface 14 of the substrate 10 may previously have been, or may subsequently be, coated with an optional low-emissivity coating 711. For instance, the coat zones just described for use in depositing the hydrophilic coating 40 can be sputter-up coat zones located toward the end of a sputtering line that includes a series of preceding sputter-down coat zones (e.g., equipped with upper targets 166A-J) in which the optional low-emissivity coating 711 can be applied. Reference is made to FIG. 10A. Useful sputter-up/sputter-down methods and equipment are described in U.S. patent application Ser. No. 09/868,542, the entire contents of which are incorporated herein by reference.

The deposition technique just described is exemplary of a more broadly embodied class of methods involving an intermediate transport roller 210'. These methods involve depositing coatings upwardly onto substrates. In more detail, the methods comprise providing a coater 2000 having a substrate transport system 1210 defining a path of substrate travel P extending through the coater. In the present embodiments, the transport system 1210 includes an intermediate transport roller 210' located between first and second coating deposition paths PT1, PT2. Preferably, the intermediate roller 210' is located between two gaps G1, G2. The coater 2000 in the present methods includes first 660A and second 660B upward coating apparatuses mounted below the path of substrate travel P. Preferably, the first upward coating apparatus 660A is adapted for emitting a different composition of coating material than the second upward coating apparatus 660B. For example, the first upward coating apparatus 660A can comprise a source (a sputtering target, a supply of precursor gas, etc.) of a first coating material (e.g., silicon-containing material), and the second upward coating apparatus 660B can comprise a source of a second coating material (e.g., titanium-containing material). Preferably, the first and second coating materials are different materials.

The present methods involve conveying a glass sheet 10 along the path of substrate travel P (e.g., after positioning the glass sheet on the transport system 1210), such that the glass sheet is conveyed over (and past) the first 660A and second 660B upward coating apparatuses. The methods further comprise operating the first upward coating apparatus 660A so as to emit a first flux F1 of material upwardly along the first coating deposition path PT1 (e.g., through a first gap G1, which can optionally be defined between two transport rollers) and onto a bottom major surface 12 of the glass sheet 10, thereby depositing a first partial coating 703 over (e.g., directly on, or over one or more previously deposited films on) the bottom major surface of the glass sheet. This is perhaps best appreciated with reference to FIG. 11. The methods further comprise operating the second upward coating apparatus 660B so as to emit a second flux F2 of material upwardly along the second coating deposition path PT2 (e.g., through a second gap G2, which can optionally be defined between two transport rollers) and onto the partially-coated bottom major surface 12 of the glass sheet 10, thereby depositing a second partial coating 705 directly over the first partial coating 703. This is perhaps best appreciated with reference to FIG. 12.

Preferably, the first flux F1 of material has a different composition than the second flux F2 of material. In some embodiments, at least one of the first F1 and second fluxes F2 comprises titanium. One option is for the first flux F1 to comprise silicon and for the second flux F2 to comprise titanium. For example, the first upward coating apparatus 660A can comprise a source of silicon-containing material, and the second upward coating apparatus 660B can comprise a source of titanium-containing material. In one embodiment of this nature, the first upward coating apparatus comprises a silicon-containing sputtering target, and the second upward coating apparatus comprises a titanium-containing sputtering target.

Further, in some of the present methods, the first flux F1 comprises titanium and the second flux F2 comprises silicon. For example, the first upward coating apparatus 660A can comprise a source of titanium-containing material, and the second upward coating apparatus 660B can comprise a source of silicon-containing material. In one embodiment of this nature, the first upward coating apparatus comprises a titanium-containing sputtering target, and the second upward coating apparatus comprises a silicon-containing sputtering target.

In embodiments of the invention involving a "silicon-containing" material, the noted material includes at least some silicon. Similarly, in embodiments involving a "titanium-containing" material, the noted material includes at least some titanium. Any of these embodiments can optionally comprise 50 weight percent or more of the noted material. Further, in embodiments involving one or more titanium-containing targets, each such target can optionally consist essentially of titanium. Similarly, in embodiments involving one or more silicon-containing targets, each such target can optionally consist essentially of silicon (perhaps with a small amount of aluminum or the like to increase conductivity).

In the present methods, the coater 2000 preferably includes a deposition chamber 200 defining an interior cavity 277. The path of substrate travel P preferably extends through this deposition chamber (e.g., through cavity 277). Further, the first 660A and second 660B upward coating apparatuses preferably are disposed (at least in part) within this deposition chamber 200. In preferred embodiments of this nature, the deposition chamber 200 is a vacuum deposition chamber adapted for carrying out at least one vacuum deposition process. For example, the deposition chamber 200 can advantageously be adapted for establishing and maintaining a gas pressure in the interior cavity 277 of less than about 0.1 torr. Thus, in certain embodiments, the chamber 200 is operated at, or is adapted for use at (e.g., is provided with conventional gas delivery and pumping systems adapted for establishing and maintaining) pressures within this range.

In some embodiments of the present method, the first 660A and second 660B upward coating apparatuses are thin film deposition apparatuses selected from the group consisting of sputter deposition apparatuses, ion-assisted deposition apparatuses, chemical vapor deposition apparatuses, and vacuum evaporation apparatuses. For example, the first 660A and second 660B upward coating apparatuses can advantageously be sputter deposition apparatuses. That is, the first upward coating apparatus 660A can be a first sputter deposition apparatus comprising a first sputtering target 620A, and the second upward coating apparatus 660B can be a second sputter deposition apparatus comprising a second sputtering target 620B. In certain embodiments of this nature, the first target 620A has a length TL, the first coating deposition path PT1 extends through a first gap G1 having a length GL, and the first target is positioned directly beneath the first gap so that the length of the first target is generally parallel to the length of the first gap. The second target 620B and the second gap G2 can also be arranged in this manner. That is, the second target 620B can have a length TL, the second coating deposition path PT2 can extend through a second gap G2 having a length GL, and the second target can be positioned directly beneath the second gap so that the length of the second target is generally parallel to the length of the second gap. This relative positioning is perhaps best understood with reference to FIGS. 30 and 31.

Figure 30:
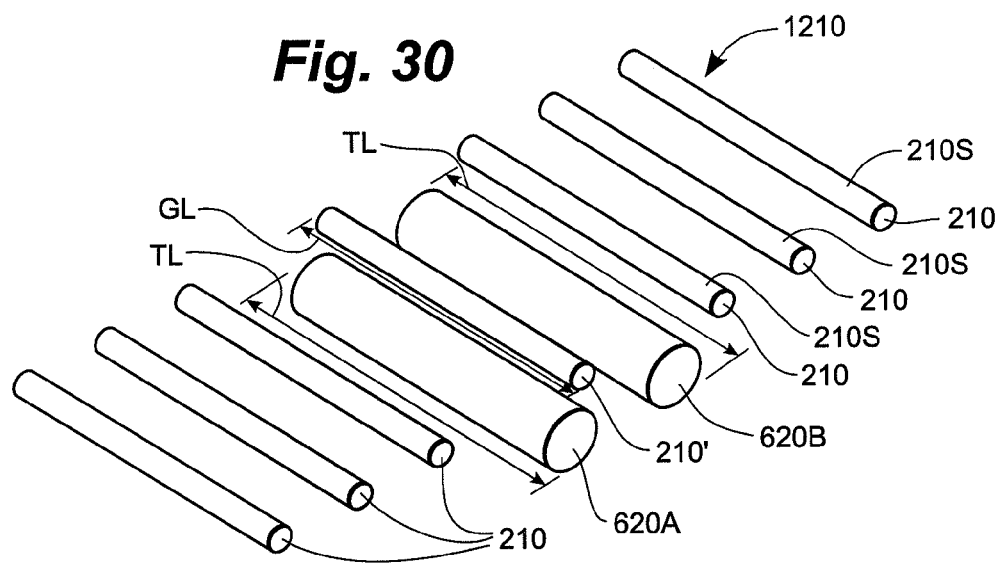
FIG. 30 is a schematic perspective view illustrating the arrangement of sputtering targets and transport rollers in accordance with certain embodiments of the invention.
Figure 31:
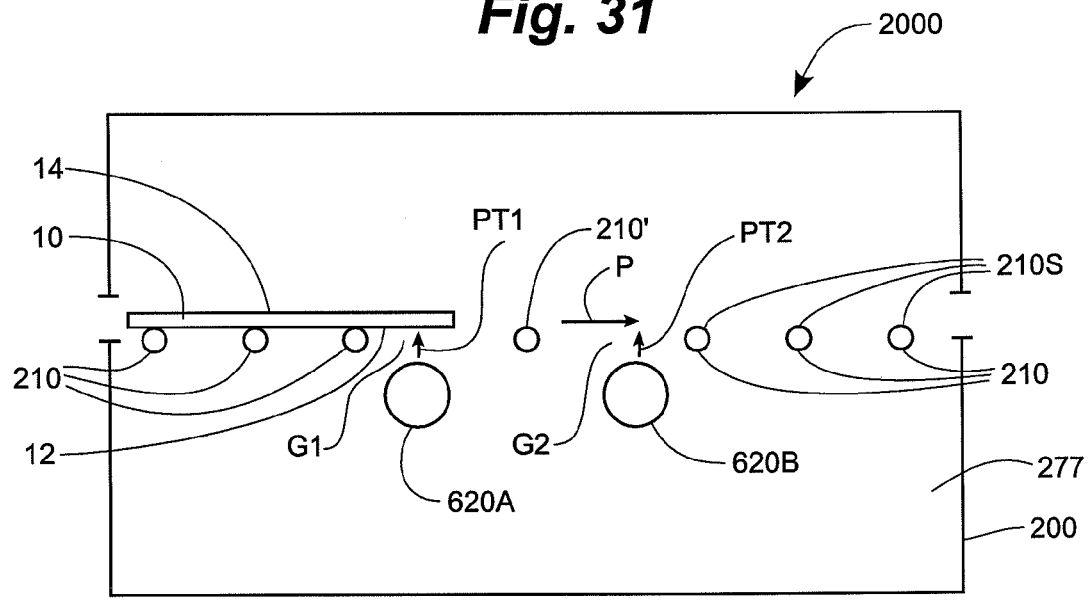
FIG. 31 is a schematic side view of a coater in accordance with certain embodiments of the invention.

With continued reference to FIGS. 30 and 31, the present methods encompass some embodiments wherein at least one of the first 620A and second 620B targets comprises titanium. In some embodiments of this nature, the first target has a first sputterable target material, the second target has a second sputterable target material, the first and second sputterable target materials are of different composition, the first sputterable target material comprises silicon, and the second sputterable target material comprises titanium. Both of these targets can optionally be sputtered reactively in an oxidizing atmosphere. If so desired, the second sputterable target material can be metallic titanium or a metallic compound (e.g., an alloy, a metallic non-alloy mixture of different metals, or a metallic composite having discrete areas of different metals) including titanium. This may be particularly beneficial for process stability. Alternatively, the second target can be a substoichiometric titania target. This may be particularly beneficial for achieving high deposition rates.

Thus, it can be appreciated that in certain embodiments, the first partial coating 703 comprises silica. In some embodiments of this nature, the operation of the first upward coating apparatus 660A comprises sputtering a first target 620A reactively in an oxidizing atmosphere. Conjointly, the second partial coating 705 can comprise titania. In such cases, the operation of the second upward coating apparatus 660B can optionally comprise sputtering a second target 620B reactively in an oxidizing atmosphere.

Further, in some of the present methods, the first target has a first sputterable target material, the second target has a second sputterable target material, the first and second sputterable target materials are of different composition, the first sputterable target material comprises titanium, and the second sputterable target material comprises silicon. Both of these targets can optionally be sputtered reactively in an oxidizing atmosphere. If so desired, the first sputterable target material can be metallic titanium or a metallic compound including titanium.

Thus, in certain embodiments, the second partial coating comprises silica. In some embodiments of this nature, the operation of the second upward coating apparatus 660B comprises sputtering a second target 620B reactively in an oxidizing atmosphere. Conjointly, the first partial coating 703 can optionally comprise titania. In such cases, the operation of the first upward coating apparatus 660A can comprise sputtering a first target 620A reactively in an oxidizing atmosphere.

In one of the present methods, the first 660A and second 660B upward coating deposition apparatuses are sputter deposition apparatuses that are positioned (e.g., mounted below the path of substrate travel) in a desired deposition bay (i.e., in the same bay) of the coater 2000. In this particular embodiment, the coater includes a plurality of subsequent deposition bays each having two upward sputter deposition apparatuses mounted below the path of substrate travel P. Here, the method can advantageously be performed such that after the substrate is conveyed out of the desired deposition bay the substrate is conveyed further along the path of substrate travel through the subsequent deposition bays so as to move the substrate past a lower titanium-containing target, then past a lower silicon-containing target, then past a lower silicon-containing target, and then past a lower titanium-containing target. In some cases, each of these titanium-containing targets consists essentially of titanium and each of these silicon-containing targets consists essentially of silicon.

Figure 25:
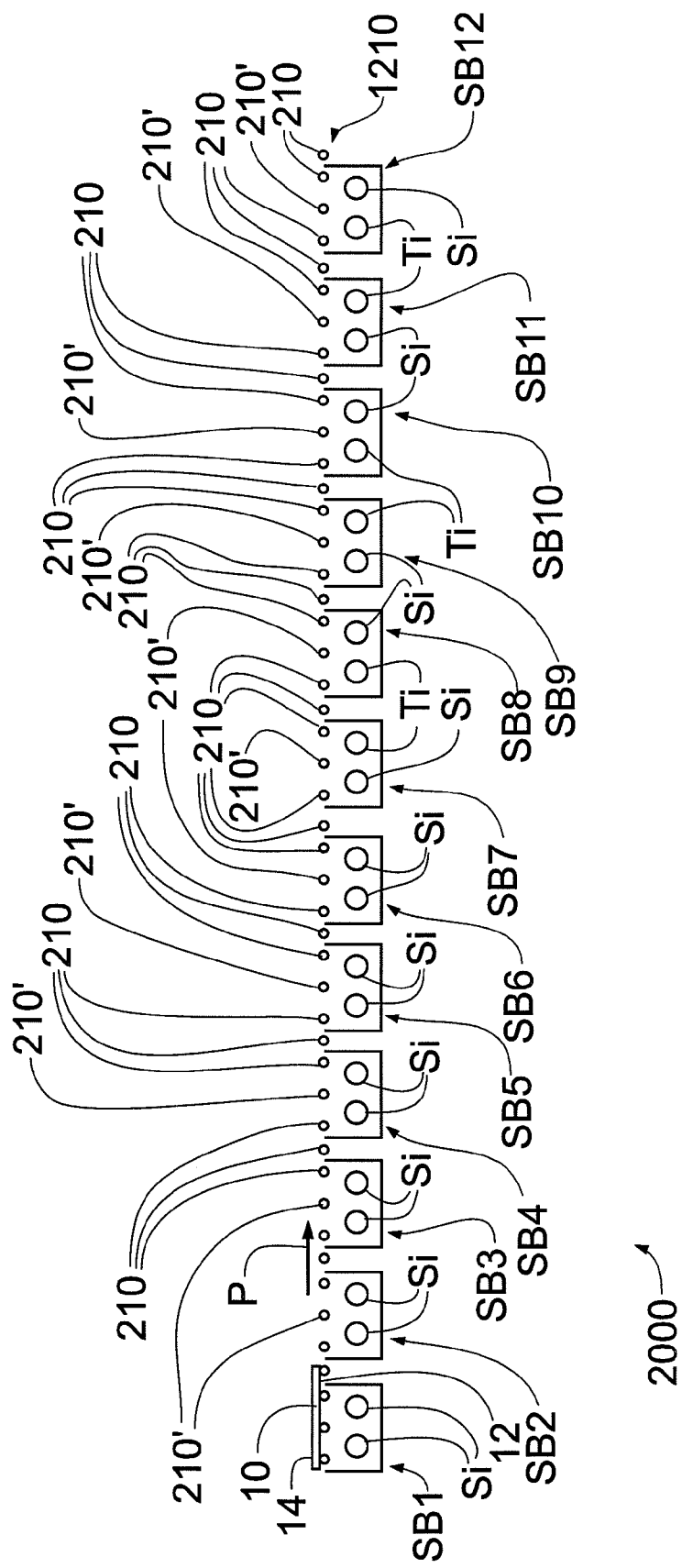
FIG. 25 is a schematic side view of a coater in accordance with certain embodiments of the invention.

The method described in the immediately preceding paragraph can be appreciated with reference to FIG. 25. The desired deposition bay can, for example, be the seventh illustrated bay SB7. Conjointly, the subsequent bays can be the eighth through twelfth illustrated bays SB8-SB12. Thus, in conveying the substrate 10 out of the desired bay SB7 and further along the path of substrate travel P, the substrate is moved past a lower titanium target, then past a lower silicon target, then past a lower silicon target, and then past a lower titanium target.

In another of the present methods, the first 660A and second 660B upward coating deposition apparatuses are first and second sputter deposition apparatuses that are positioned in a desired deposition bay of the coater 2000. In this particular embodiment, the coater includes a plurality of subsequent deposition bays each having two upward sputter deposition apparatuses mounted below the path of substrate travel P. Here, the method can advantageously be performed such that after the substrate is conveyed out of the desired deposition bay the substrate is conveyed further along the path of substrate travel through the subsequent deposition bays so as to move the substrate past a lower silicon-containing target, then past a lower titanium-containing target, then past a lower titanium-containing target, and then past a lower silicon-containing target. Each titanium-containing target can optionally consist essentially of titanium, and each silicon-containing target can optionally consist essentially of silicon.

The method described in the immediately preceding paragraph can also be appreciated with reference to FIG. 25. The desired deposition chamber can, for example, be the eighth illustrated bay SB8. Conjointly, the subsequent bays can be the ninth through twelfth illustrated bays SB9-SB12. Thus, in conveying the substrate 10 out of the desired bay SB8 and further along the path of substrate travel P, the substrate is moved past a lower silicon target, then past a lower titanium target, then past a lower titanium target, and then past a lower silicon target.

Figure 9:
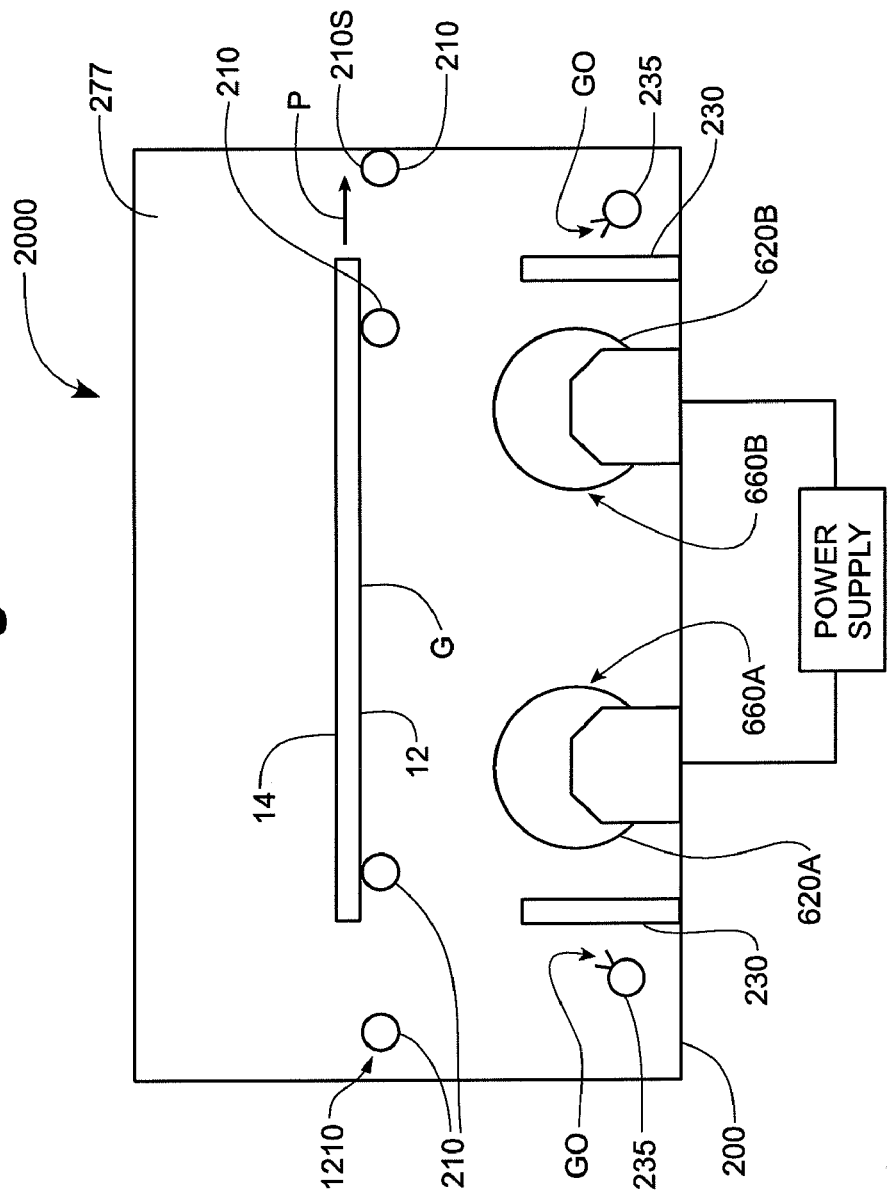
FIG. 9 is a schematic side view of a deposition chamber in accordance with certain embodiments of the invention.

In embodiments wherein the first 660A and second 660B upward coating apparatuses are sputter deposition apparatuses, the coater 2000 preferably includes a lower gas distribution system (e.g., comprising at least one gas-delivery outlet GO below the path of substrate travel P) adapted for delivering sputtering gas to a lower region of the coater (i.e., a region of the coater below the path of substrate travel). This is perhaps best appreciated with reference to FIG. 9, wherein the illustrated chamber 200 includes lower sputtering targets 620A, 620B and lower gas distribution pipes 235 adjacent to the lower targets. Also shown in FIG. 9 are optional anodes 230 (which in FIG. 9 are below the path of substrate travel). The anodes 230 can optionally be omitted, depending on the power supply used, whether gas anodes are used, etc. Gas anodes utilize gas distribution pipes 235 as anodes, thus obviating the need for separate anode bars. Particularly advantageous gas anodes are described in U.S. patent application Ser. No. 10/323,703, the entire contents of which are incorporated herein by reference. When provided, the lower anodes 230 are typically positioned adjacent to the lower targets.

In certain embodiments wherein the first 660A and second 660B upward coating apparatuses are sputter deposition apparatuses, a single AC power supply is operated to deliver alternating current electricity to the first and second targets. Reference is made to FIG. 9. Suitable AC power supplies are available from Advanced Energy Industries, Inc. (Fort Collins, Colo., USA), such as the AC model referred to commercially as the CRYSTAL power supply.

In some of the present methods, the first 660A and second 620B upward coating apparatuses are evaporation coating apparatuses. Typically, an apparatus of this nature comprises a source of coating material to be evaporated. The source material will commonly be positioned beneath the path of substrate travel. The source material can be provided in the form of a boat, crucible, strip, or coil that contains, or is formed of, the desired source material. Means are typically provided for delivering energy to the source material. For example, the source material can be provided in conjunction with a heat source adapted for heating such material by direct or indirect resistance, by thermal conduction, by radiation or induction, by electron beam, or by laser irradiation or arcing.

Useful processes for coating substrates by evaporation are known in the art. Briefly, evaporation is a form of physical vapor deposition that involves delivering energy to a source material in vacuum until it evaporates at adequate rates. The source material is transported in residual gas phase to the substrate, where the gas phase material condenses on the substrate and forms the desired coating. When the upward coating apparatuses 660A, 660B are evaporation apparatuses, it may be desirable to maintain the chamber 200 (i.e., the gaseous atmosphere in the deposition cavity 277) at pressures on the order of between about $7.5 \times 10^{-3}$ mtorr. and about 7.5 mtorr. Various known evaporation apparatuses and deposition methods can be used.

In other embodiments, the upward coating apparatuses 660A, 660B are chemical vapor deposition (i.e., CVD) apparatuses. An apparatus of this nature typically comprises a gas outlet for delivering precursor gas to the lower region of the coater. Preferably, the gas outlet is positioned below the path of the substrate travel P, such that from the precursor gas, coating material condenses upon the bottom surface 12 of the substrate 10. A CVD apparatus of this nature will typically comprise a gas supply from which the precursor gas is delivered through the gas outlet and into the lower region of the coater. Various known CVD apparatuses can be used. If so desired, the upward coating apparatuses 660A, 660B can be plasma-enhanced chemical vapor deposition apparatuses of the type described in U.S. patent application Ser. No. 10/373,703, entitled "Plasma-Enhanced Film Deposition" (Hartig), filed on Dec. 18, 2002, the entire contents of which are incorporated herein by reference.

Finally, in some of the present methods, the upward coating apparatuses 660A, 660B are ion-assisted deposition apparatuses, optionally equipped with respective ion guns. Each ion gun can be part of an ion-assisted film deposition (i.e., IAD) apparatus of known type. For example, each ion gun can be part of an ion beam sputter deposition source comprising a sputtering target against which the ion gun accelerates ions such that atoms of the target material are ejected from the target upwardly toward an overlying substrate. Alternatively, the ion gun can be part of an ion-assisted evaporation apparatus, such as those described in the publication "Ion-Based Methods For Optical Thin Film Deposition" (Journal of Material Science; J. P. Marting, 21 (1986) 1-25), the entire teachings of which are incorporated herein by reference. These useful types of IAD apparatuses and deposition methods are known in the art, as are other suitable IAD methods.

In the present methods, the first partial coating 703 preferably is deposited over an entirety of the bottom major surface 12 of the glass sheet. Preferably, the same is true of the second partial coating 705. Thus, the present methods preferably achieve full-area coating of the substrate's bottom surface 12.

The present methods can optionally include operating a plurality of other upward coating apparatuses (in addition to the first 660A and second 660B upward coating apparatuses). In some embodiments of this nature, all of the upward coating deposition apparatuses in the coater 2000 are upward sputter deposition apparatuses, and the method is performed such that no more than a total physical thickness of about 500 angstroms (perhaps optimally no more than about 300 angstroms) of film is sputter deposited on the bottom major surface of the substrate. In some of these embodiments, the substrate's bottom surface 12 once coated with this film comes into direct contact with at least one surface 210S, 144S of the transport system 1210. This surface 210S, 144S of the transport system 1210 can be a top surface of a transport roller 210 or a conveyor belt 144C-144G.

The coater in the present methods can optionally include a series of downward coating apparatuses (optionally being downward sputtering apparatuses comprising upper sputtering targets 166A-166J) positioned on a common side of the path of substrate travel P. Preferably, the downward coating apparatuses of this series are mounted above (i.e., at a higher elevation than) the path of substrate travel. The downward coating apparatuses of this series, for example, can be operated so as to deposit a low-emissivity coating 711 on a top major surface 14 of the glass sheet. Reference is made to FIGS. 10A and 10B.

Figure 7:
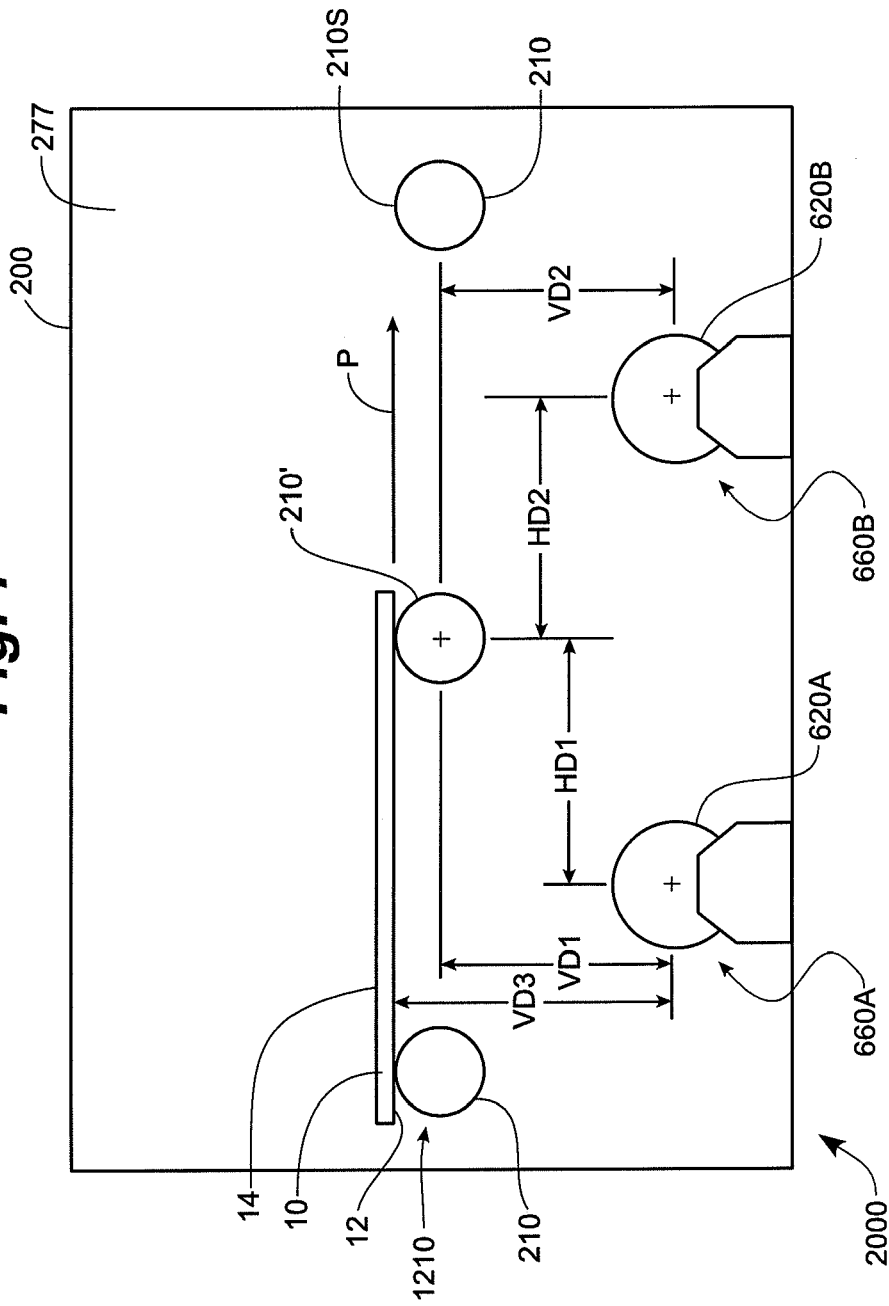
FIG. 7 is a schematic side view of a deposition chamber in accordance with certain embodiments of the invention.

With respect to the coater 2000 in the present methods, this coater preferably is a large-area coater and the glass sheet conveyed through the coater preferably has a major dimension of at least about 1 meter. With reference to FIG. 7, useful exemplary dimensions are as follows: (1) HD1 and HD2 are each between about 4 inches and about 8 inches, such as about 6 inches; and (2) VD3 is between about 3.75 inches and about 7.75 inches, such as about 5.75 inches. In conjunction with the foregoing dimensions, the intermediate roller 210' preferably has an outer diameter of between about 2.25 inches and about 6.25 inches, such as about 4.25 inches, while the targets 620A, 620B preferably each have an outer diameter of between about 4 inches and about 8 inches, such as about 6 inches. Further, VD1 and VD2 can be between about 4.5 inches and about 8.5 inches, such as about 6.5 inches. In certain embodiments, the invention provides a chamber arranged according to these dimensions, and methods are provided wherein a plurality of chambers arranged in this manner are operated so as to deposit film upwardly onto the bottom surface 12 of a substrate 10.

In a second subgroup of the product embodiment group described above, the compound region 50 of the hydrophilic coating 40 comprises (e.g., is) a mixed film including both (optionally consisting essentially of) the photocatalyst/first material and the second material. In some cases, the first material is titania and the second material is silica. In other cases, the first material is titania and the second material is zirconia. Embodiments of both types are described below. It is to be understood, however, that materials other than titania can be used as the photocatalyst/first material, and materials other than silica and zirconia can be used as the second material.

The mixed film in some of the present embodiments comprises (or consists essentially of) a mixed oxide material or a mixed oxynitride material. In some preferred embodiments, the mixed film consists essentially of a mixed oxide material that includes at least some titania. Such mixed oxide material, for example, can be an oxide that includes titanium, silicon, and oxygen. In some cases, the oxide comprises or consists essentially of silica and titania, such oxide optionally be a sputtered mixed oxide film.

Preferably, in the present subgroup of embodiments, the mixed film has a refractive index of greater than 1.4 but less than 2.45. Perhaps more preferably, the refractive index is greater than 1.45 but less than 2.4. In some cases, the refractive index is greater than 1.5 but less than 2.25. In certain particularly preferred embodiments, the mixed film has a refractive index of less than about 2.1 or less than about 1.7 (e.g., greater than 1.4, greater than 1.45, or greater than 1.5, but less than about 1.7), perhaps more preferably less than about 1.66, and perhaps optimally less than about 1.57.

To achieve a desired refractive index, the mixed film can, for example, be provided as a mix comprising titania and silica. Particularly preferred mixes of this nature comprise titania in an amount that is less than about 30% by weight relative to the total weight of the mixed film. For example, when the mixed film is a mixed oxide film comprising titania, the titania can advantageously be present in an amount that is less than about 30% by weight relative to the total weight of the mixed oxide film. Titania weight percentages of less than about 30% are particularly advantageous in a mix that consists essentially of titania and silica.

In certain embodiments of the present subgroup, the mixed film is a mixed oxide film having a thickness of about 125 Å or less. Following is an exemplary coating of this nature, wherein a film of SiO$_2$ (optionally having a thickness of 45 Å, 75 Å, or 90 Å) provides a foundation for the overlying mixed oxide film/compound region:

---
air
100 Å SiO$_x$TiO$_x$
SiO$_2$
glass

---

Following is one exemplary method for producing the coating shown immediately above so that the SiO$_2$ film on the substrate has a thickness of about 90 angstroms. Here, the substrate was coated using a 1 meter wide coater, such that the power levels were relatively low. The substrate (which in this case was 3.0 mm glass) was coated by first conveying the substrate at a rate of about 50 inches per minute in one pass through two sputter-down bays, and thereafter conveying the substrate at a rate of about 30 inches per minute in two passes through a subsequent sputter-down bay. Each of the first two bays had a cathode with two rotatable silicon targets. These two cathodes were each sputtered at a power level of about 6.8 kW in an oxidizing atmosphere at a pressure of about 4.5 mtorr. The substrate was then conveyed twice through the next sputtering bay, which had a cathode with a first rotatable silicon target and a second rotatable titanium target. The silicon target in this bay was sputtered at a power level of about 7 kW in an oxidizing atmosphere at a pressure of about 4.5 mtorr. The titanium target in this bay was sputtered at a power level of about 8.3 kW in the same oxidizing atmosphere. Each of the silicon targets had about 10-15% aluminum. The resulting coating was found to exhibit a ΔR$_y$ of about 1.1%. Further, this coating exhibited an acetone decomposition slope of about 0.0367.

In certain embodiments of the present subgroup, the mixed film has a thickness of less than 100 angstroms, and the mixed film defines an exposed outermost face of the coating. In these embodiments, the coating can optionally include a desired film between the substrate's first surface and the mixed oxide film, the desired film having a physical thickness of at least about 30 angstroms. In some of these embodiments, the thickness of the desired film is less than 100 angstroms, and/or the desired film is entirely or substantially amorphous, and/or the desired film comprises silica.

In some embodiments of the present subgroup, the mixed film is a mixed oxide film having a thickness of less than 100 Å, less than 75 Å, or less than 65 Å, such as about 50 Å. Following is an exemplary coating of this nature, wherein a film of SiO$_2$ (optionally having a thickness of 45 Å, 75 Å, or 90 Å) provides a foundation for the overlying mixed oxide film/compound region:

---
air
50 Å SiO$_x$TiO$_x$
SiO$_2$
glass

---

In some particular embodiments, the mixed film is a sputtered film comprising silica and titania, the sputtered film having been produced by co-sputtering first and second targets, where the first target carried a sputterable material consisting essentially of a metallic material comprising titanium (optionally consisting essentially of titanium), and the second target carried a sputterable material containing silicon as a major component (optionally consisting essentially of silicon and aluminum), these targets having been co-sputtered in a single sputtering bay (optionally by sputtering reactively in an oxidizing atmosphere). The inventors have discovered that a mixed oxide film produced by these co-sputtering methods exhibits surprising durability properties.

In certain embodiments of the present subgroup, the mixed film includes both amorphous and crystalline domains. In some embodiments of this nature (such as those where titania is the first material), the mixed film has a low density of crystals, such as a degree of crystallization that is less than about 50%, and perhaps more preferably less than about 20% (by weight relative to the total weight of the mixed film). This, however, is by no means required. Such a low degree of crystallization is found in the mixed film imaged in FIGS. 21A-24.

Thus, in the present subgroup of embodiments, the compound region 50 comprises a mixed film including both the photocatalyst/first material and the second material, and this mixed film can optionally include both amorphous and crystalline domains. In some preferred embodiments of this nature, the first material is titania and the crystalline domains comprise titanium dioxide crystals. For example, the mixed film can comprise titanium dioxide crystals embedded in an otherwise entirely or substantially amorphous film. The titanium dioxide crystals can advantageously have an average size of between about 5 nm and about 50 nm, perhaps more preferably between about 5 nm and about 25 nm. This is perhaps best appreciated with reference to FIGS. 21A, 21B, and 22.

In some embodiments of the present subgroup, the mixed film includes an inner thickness and an outer thickness. Optionally, the inner thickness comprises (e.g., is) an entirely or substantially amorphous mix of the first and second materials, while the outer thickness comprises crystals of the photocatalyst/first material. In some embodiments of this nature, the outer thickness includes crystals of the photocatalyst/first material embedded in a film that is otherwise entirely or substantially amorphous. Thus, the outer thickness in these embodiments can be characterized as having crystal inclusions in an amorphous film. In some embodiments of this nature, the outer thickness defines an outermost face 920 of the coating 40. This is exemplified by the coating imaged in FIGS. 21A-24.

In some particularly preferred embodiments of the present subgroup, the first material is titania, the mixed film has an inner thickness and an outer thickness, the inner thickness is an entirely or substantially amorphous mix of titania and the second material, and the outer thickness comprises titanium dioxide crystals embedded in an otherwise entirely or substantially amorphous mix of titania and the second material. This is perhaps best appreciated with reference to FIG. 22. Here, the second material is silica (in particular, SiO$_2$), although other materials can be used.

Figure 21A:
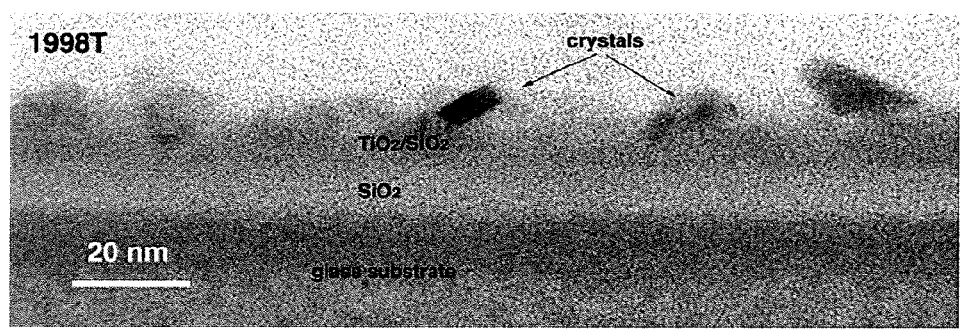
FIG. 21A is a cross-sectional transmission electron microscope brightfield image of a glass substrate bearing a hydrophilic coating in accordance with certain embodiments of the invention.

With reference to FIG. 21A, this image is a cross-sectional transmission electron microscope brightfield image of a glass substrate bearing a hydrophilic coating that has been subjected to glass tempering. The glass substrate of FIG. 21A was provided with a coating which before tempering had the same structure as the coating of FIGS. 18A-20. The outer region of this tempered coating comprises a mix of SiO$_2$ and TiO$_2$. In more detail, the outer region of this coating has an inner thickness that is an amorphous mix of $SiO_2$ and $TiO_2$ and an outer thickness that comprises $TiO_2$ crystals embedded in an amorphous mix of $SiO_2$ and $TiO_2$. This is perhaps best appreciated with reference to FIG. 22.

Figure 21B:
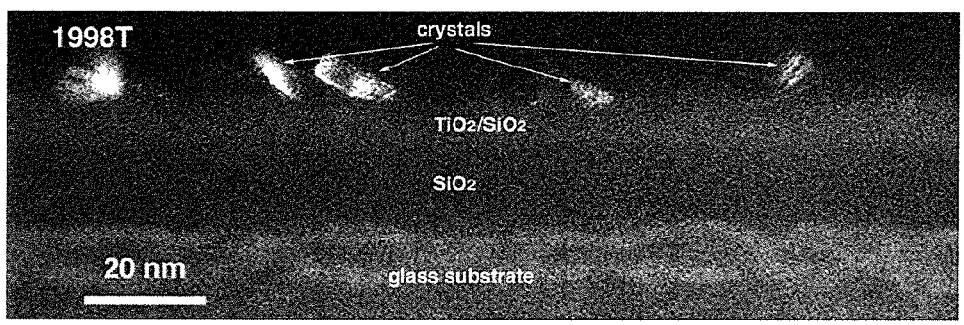
FIG. 21B is a cross-sectional transmission electron microscope darkfield image of a glass substrate bearing a hydrophilic coating in accordance with certain embodiments of the invention.
Figure 22:
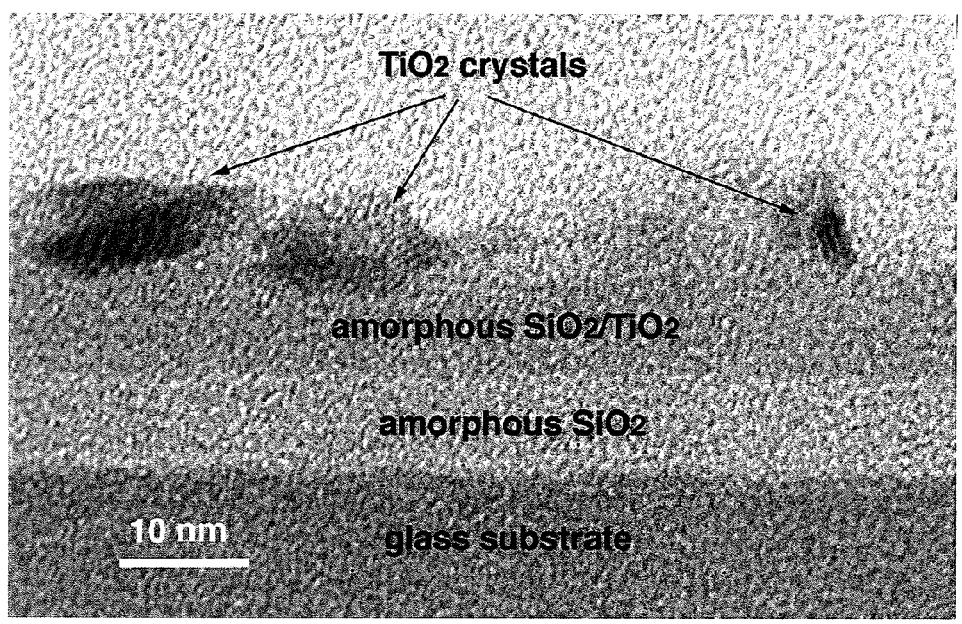
FIG. 22 is a cross-sectional high-resolution lattice-fringe image of a hydrophilic coating on a glass substrate in accordance with certain embodiments of the invention.
Figure 23:
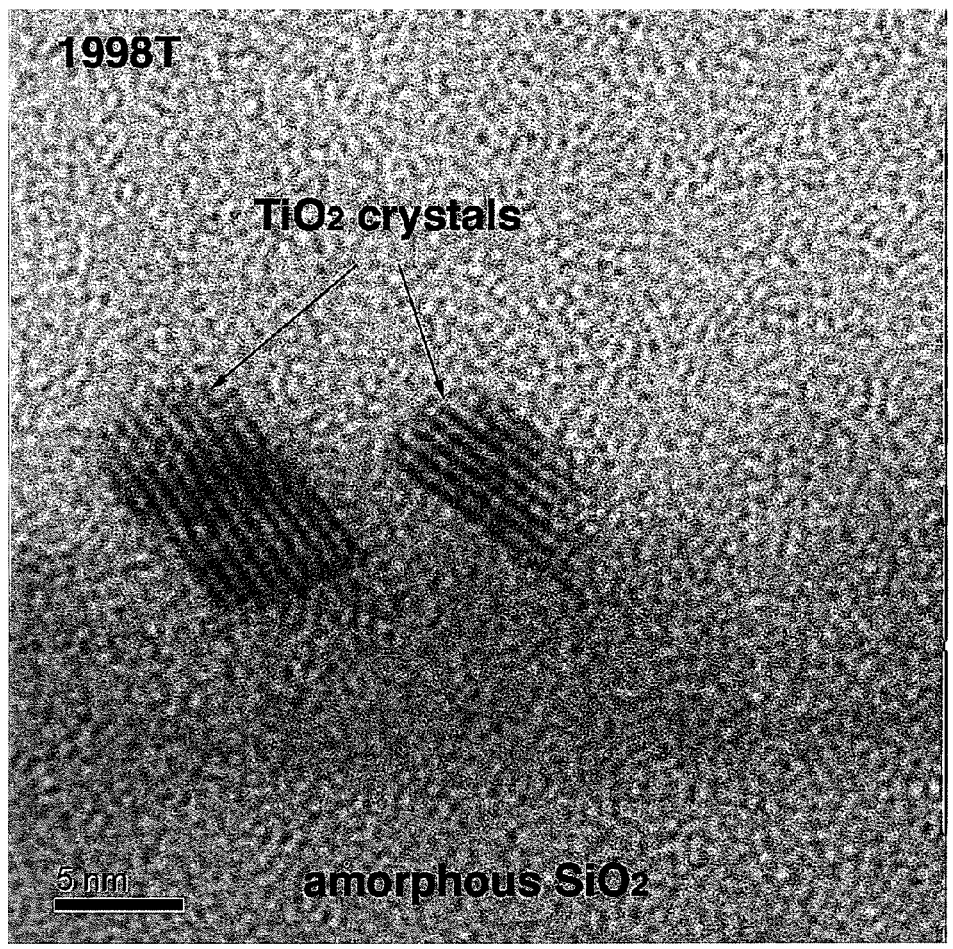
FIG. 23 is a cross-sectional high-resolution lattice-fringe image of a portion of a hydrophilic coating on a glass substrate in accordance with certain embodiments of the invention.
Figure 24:
FIG. 24 is a selected area electron diffraction pattern of a hydrophilic coating on a glass substrate in accordance with certain embodiments of the invention.

FIG. 21B is a cross-sectional transmission electron microscope darkfield image of the coated glass substrate shown in FIG. 21A FIG. 22 is a higher magnification image of the same coated glass, showing the $TiO_2$ crystals embedded in the amorphous $SiO_2/TiO_2$. FIG. 23 is a cross-sectional high-resolution lattice-fringe image of the same coated glass, again showing the $TiO_2$ crystals. The polycrystalline nature of the present coating can also be appreciated with reference to FIG. 24, which is a selected area electron diffraction pattern of the same coated substrate. The spots and rings in the pattern indicate that the coating is polycrystalline.

In another embodiment of the present subgroup, the mixed film is a mixed oxide film having a thickness of less than about 75 angstroms, the mixed oxide film defines an exposed outermost face of the coating, the first material is titania, the mixed oxide film comprises titania in an amount that is less than about 30% by weight relative to the total weight of the mixed oxide film, and the mixed oxide film is substantially or entirely amorphous.

In certain embodiments of the present subgroup, the first material is titania and the second material is zirconia. In some cases, the mixed film (which can optionally be a mixed oxide material or a mixed oxynitride material) consists essentially of titania and zirconia. A mixed film of this nature can optionally be produced by reactively co-sputtering a titanium target and a zirconium target in an oxidizing atmosphere.

Figure 32:
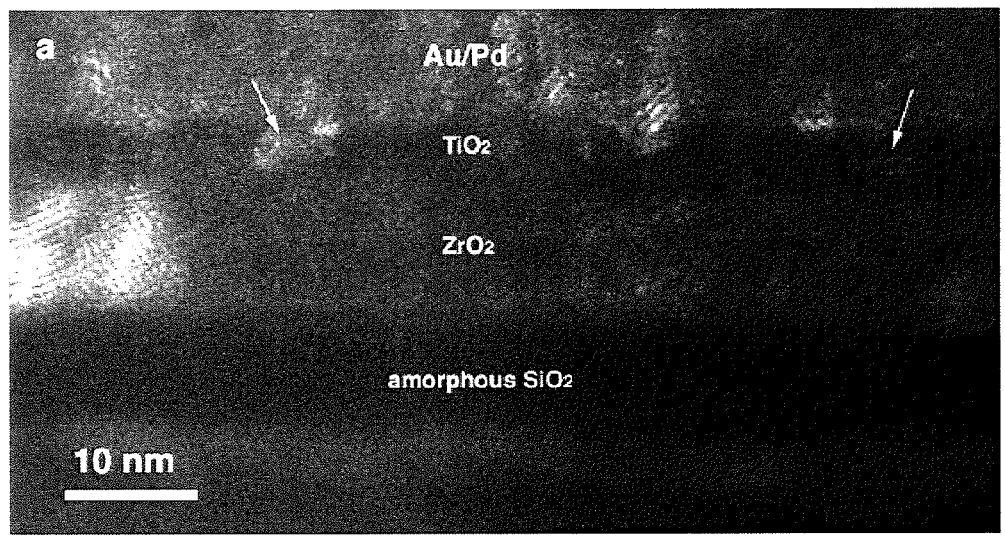
FIG. 32 is a cross-sectional high magnification transmission electron microscope darkfield image of a glass substrate bearing a hydrophilic coating in accordance with certain embodiments of the invention.
Figure 33:
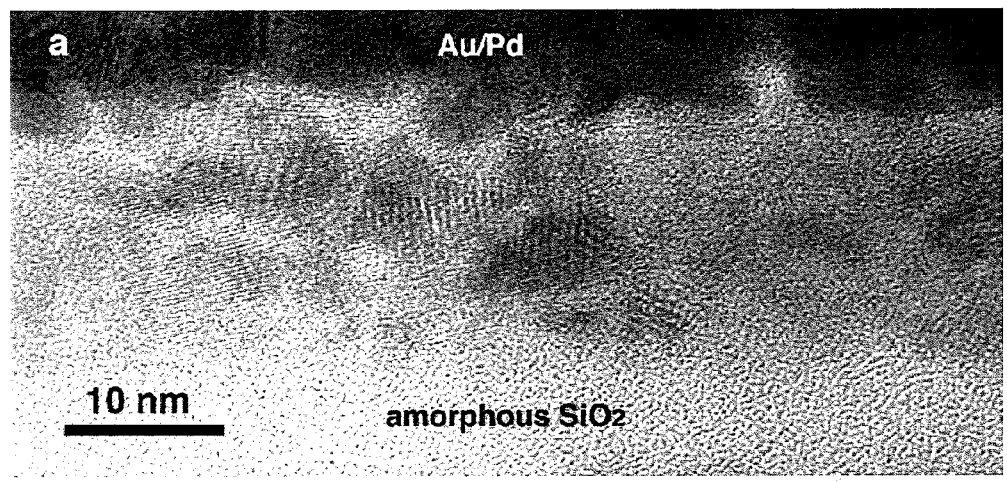
FIG. 33 is a cross-sectional high magnification transmission electron microscope brightfield image of a glass substrate bearing a hydrophilic coating in accordance with certain embodiments of the invention.

In one particular embodiment, the compound region 50 includes plurality of domains consisting essentially of titania that is entirely or substantially amorphous, and at least one domain characterized by a blending together (i.e., a mix) of titania and zirconia. Optionally, this embodiment can also include a plurality of domains consisting essentially of crystalline $TiO_2$. FIGS. 32 and 33 are images of two different regions of such a coating. In FIG. 32, there is shown a coating region where $ZrO_2$ and $TiO_2$ films are relatively distinct from one another. In this region of the coating, the $TiO_2$ film has both amorphous domains and crystalline domains. Crystalline domains are identified by arrows in FIG. 32. In FIG. 33, which shows a different region of the same coating, the $ZrO_2$ and $TiO_2$ films are completely blended together to form a single film.

The coated glass imaged in FIGS. 32 and 33 was produced by sputter depositing a 90 Å $SiO_2$ film directly over a major surface of a glass sheet, then sputter depositing a 100 Å $ZrO_2$ film directly over the $SiO_2$ film, and then sputter depositing a 50 Å $TiO_2$ film directly over the $ZrO_2$ film, whereafter the coated glass was subjected to glass tempering. As noted above, this left certain regions of the coating where the $ZrO_2$ and $TiO_2$ films were substantially unmixed, and other regions where the $ZrO_2$ and $TiO_2$ films here were completely blended together to form a single film.

In some embodiments where the first material is titania and the second material is zirconia, the mixed film comprises at least some $ZrTiO_4$. This appears to be the case in the coating of FIGS. 32 and 33, as selected area electron diffraction patterning of this coating shows rings that match $ZrTiO_4$. Further, in some embodiments, the mixed film comprises a mixture including both $ZrTiO_4$ and $ZrO_2$. The electron diffraction patterns for the coating of FIGS. 32 and 33 are consistent with a mixture of $ZrTiO_4$ and $ZrO_2$.

In the present subgroup of embodiments, the coating 40 can advantageously have a total physical thickness of less than about 400 angstroms, preferably less than about 250 angstroms, and perhaps more preferably less than about 200 angstroms. In one particular embodiment, the coating 40 consists essentially of: (1) between about 40 Å and about 95 Å (e.g., about 45 Å, about 75 Å, or about 90 Å) of $SiO_2$ film directly over a major surface of a glass sheet; and (2) between about 40 Å and about 150 Å (e.g., about 50 Å, or about 95 Å) of mixed titania-silica film or mixed titania-zirconia film directly over the $SiO_2$ film.

The mixed film in the present subgroup of embodiments can form the entire coating 40, or it can simply form a portion of the coating. Either way, the mixed film (which forms the compound region 50 in the present subgroup of embodiments) can advantageously have a total thickness of less than about 250 angstroms, preferably less than about 200 angstroms, and perhaps more preferably less than about 150 angstroms. In some embodiments, the compound region 50 consists essentially of a mixed silica-titania film having a thickness of between about 40 angstroms and about 150 angstroms (e.g., about 50 angstroms or about 95 angstroms).

In the present subgroup of embodiments, the mixed film can optionally be a sputtered film. The nanolayered compound region provided in the previous embodiment subgroup can also be sputtered, if so desired. More generally, the coating 40 can be deposited by any suitable thin film deposition technique(s). While certain embodiments involve sputtering, the coatings described in this disclosure can be deposited by any suitable thin film deposition technique unless a given embodiment is expressly said to require sputtering. For instance, a mixed film serving as the compound region 50 can be deposited by a pyrolysis method in which suitable precursor gases are mixed. Alternatively, a nanolayered compound region can be deposited pyrolytically using a series of applicators.

In certain embodiments, the coating 40 (or just an outermost film of the coating) is non-continuous. For example, such a coating or film can be characterized by a field of islands. Embodiments of this nature can involve evenly-spaced islands or randomly-distributed islands (optionally comprising or consisting essentially of titania). Thus, the coating 40 need not be continuous.

Further, in certain embodiments, the coating (or just an outermost film of the coating) is a foam-like film. Here, the foam-like coating or film can have a particularly high porosity.

Thus, the invention provides a number of embodiments involving a hydrophilic coating 40. In some of these embodiments, the compound region 50 of the coating 40 is a mixed film that includes at least one hydrophilic material (i.e., a material having an affinity for water, at least under certain circumstances, such as when the material is irradiated). Thus, the compound region 50 in some embodiments of the invention is a hydrophilic film. Several groups of embodiments involving such a hydrophilic film 50 will now be described.

One group of these embodiments provides a sheet-like substrate 10 (e.g., a sheet of glass, optionally containing sodium) having generally-opposed first 12 and second 14 major surfaces. In the present embodiments, the first major surface 12 bears a coating 40 comprising a compound region 50 that is a hydrophilic film. In these embodiments, the hydrophilic film 50 comprises (and optionally consists essentially of) a material (such as a mixed oxide material or a mixed oxynitride material) that includes (and optionally consists essentially of) atoms of titanium, silicon, and oxygen. The hydrophilic film 50 in these embodiments preferably has a physical thickness of less than about 300 angstroms. Optionally, the hydrophilic film 50 in the present group of embodiments can have an outermost face 920 with an average surface roughness $R_a$ of less than 1.8 nm (preferably less than 1.6 nm, perhaps more preferably less than 1.0 nm, and in some cases less than 0.6 nm).

In the present group of embodiments, the substrate 10 when uncoated has a first visible reflectance, the substrate when bearing the coating 40 has a second visible reflectance, and the second visible reflectance preferably is not more than about 3% greater (more preferably not more than about 1% greater, and perhaps optimally no more than about 0.75% greater, such as about 0.5% greater) than the first visible reflectance. In some embodiments of this nature, the coating 40 has a physical thickness of greater than 45 angstroms, greater than 75 angstroms, greater than 100 angstroms, or greater than 150 angstroms, and yet still achieves a $\Delta R_v$ within one or more of these ranges. Thus, the coating 40 can provide hydrophilic functionality, while at the same time having virtually no impact on the optical properties of the substrate 10.

As noted above, the term "visible reflectance", which is well known in the present art, is used herein in accordance with its well-known meaning. Visible reflectance, as well as visible transmittance, can be determined in accordance with NFRC 300, Standard Test Method for Determining the Solar and Infrared Optical Properties of Glazing Materials and Fading Resistance of Systems (National Fenestration Rating Council Incorporated, adopted December 2001, published January 2002).

To achieve a preferred $\Delta R_v$, the hydrophilic film 50 can, for example, be provided as a mixed film having a refractive index and thickness selected to achieve the desired $\Delta R_v$. As noted above, the physical thickness of the hydrophilic film 50 preferably is less than about 300 angstroms. Generally, the $\Delta R_v$ can be lowered by selecting a particularly small thickness (e.g., less than about 250 angstroms, perhaps more preferably less than about 200 angstroms) and/or by selecting a particularly low refractive index (e.g., less than about 2.1, perhaps more preferably less than about 1.7, and perhaps optimally less than the refractive index of the substrate itself) for the hydrophilic film 50.

Thus, the physical thickness of the hydrophilic film 50 in the present group of embodiments preferably is less than about 300 angstroms. In particular, some of these embodiments provide the hydrophilic film 50 at a physical thickness of between about 30 angstroms and about 200 angstroms, such as between about 40 angstroms and about 190 angstroms. In one particular embodiment, the physical thickness of the hydrophilic film 50 is about 90 Å-100 Å, such as about 95 Å. In another embodiment, the physical thickness of the hydrophilic film 50 is about 45 Å-55 Å, such as about 50 Å.

Generally, in the present group of embodiments, the hydrophilic film 50 has a refractive index of greater than 1.4 but less than 2.45. Perhaps more preferably, the refractive index is greater than 1.45 but less than 2.4. In some cases, the refractive index is greater than 1.5 but less than 2.25. In a particularly preferred subgroup of the present embodiments, the hydrophilic film has a refractive index of less than about 2.1 or less than about 1.7 (e.g., greater than 1.4, greater than 1.45, or greater than 1.5, but less than about 1.7), more preferably less than about 1.66, and perhaps optimally less than about 1.57.

To achieve a desired refractive index, the hydrophilic film 50 can, for example, be provided as a mix comprising titania and silica. Particularly preferred mixes of this nature comprise titania in an amount that is less than about 30% by weight relative to the total weight of the hydrophilic film 50. For example, when the hydrophilic film 50 is a mixed oxide film comprising titania, the titania can advantageously be present in an amount that is less than about 30% by weight relative to the total weight of the mixed oxide film. Titania weight percentages of less than about 30% are particularly advantageous in a mix that consists essentially of titania and silica.

Thus, the hydrophilic film 50 can optionally consist essentially of a mix of titania and silica. In embodiments of this nature, when the mixed film is about 30% titania and about 70% silica, the refractive index of the mixed film will be about 1.7. When the mixed film is about 20% titania and about 80% silica, the refractive index of the mixed film will be about 1.66. When the mixed film is about 10% titania and about 90% silica, the refractive index of the mixed film will be about 1.57. Thus, in some preferred embodiments, the mixed film comprises between about 10 and about 30 weight percent titania, with the remainder being essentially silica.

In the present group of embodiments, the hydrophilic film 50 can optionally have between about 10 and about 50 atomic percent titanium, relative to the total number of metal atoms in the hydrophilic film 50. Whether or not the hydrophilic film 50 (which can optionally be a mixed oxide or a mixed oxynitride) in the present embodiments has an amount of titanium in this range, the film 50 can advantageously have between about 90 and about 50 atomic percent silicon, relative to the total number of metal atoms in the film 50. In some embodiments, the hydrophilic film consists essentially of a mix of silica and titania, and the atomic percentages of titanium and silicon fall in the ranges noted in this paragraph.

The relative amounts of the different materials in a mixed film can be controlled in various ways. For example, if a film consisting essentially of a mix of titania and silica is to be co-sputtered from respective titanium and silicon targets, the rate of emission from each silicon target can be controlled by selecting the power on each silicon target, and the rate of emission from each titanium target can be controlled by selecting the power on each titanium target. Sputtering tends to proceed at different rates for titanium and silicon targets, even when the targets are sputtered at the same power and in the same oxidizing atmosphere. By taking into consideration these different rates, the power level on each target is selected so as to achieve a mixed silica-titania film having the desired relative amounts (e.g., weight percentages) of titania and silica and/or the desired relative amounts (e.g., atomic percentages) of titanium atoms and silicon atoms. Alternatively, a film consisting essentially of a mix of titania and silica can be deposited by sputtering one or more targets carrying a sputterable target material consisting essentially of silicon, titanium, and oxygen, optionally together with some aluminum. Here, the relative amounts of titanium and silicon in the resulting film can be controlled by selecting desired relative percentages for the titanium and silicon in the target(s). Still further, a mixed film consisting essentially of silica and titania in desired relative amounts can be deposited using a pyrolysis method in which desired relative amounts of titania and silica precursor materials are used. The same is true of sol gel methods and other deposition methods involving precursors and/or other starting materials. Moreover, these and other methods can be used to deposit a mixed film having many compositions other than one consisting essentially of silica and titania.

In the present group of embodiments, the coating 40 can optionally include at least one amorphous film between the hydrophilic film 50 and the first surface 12 of the substrate 10. This amorphous film, for example, can be a silica film, such as a sputtered silica film. Any of the thicknesses described in the present disclosure with reference to the optional first film 30 can be used for the present amorphous film.

Figure 3:
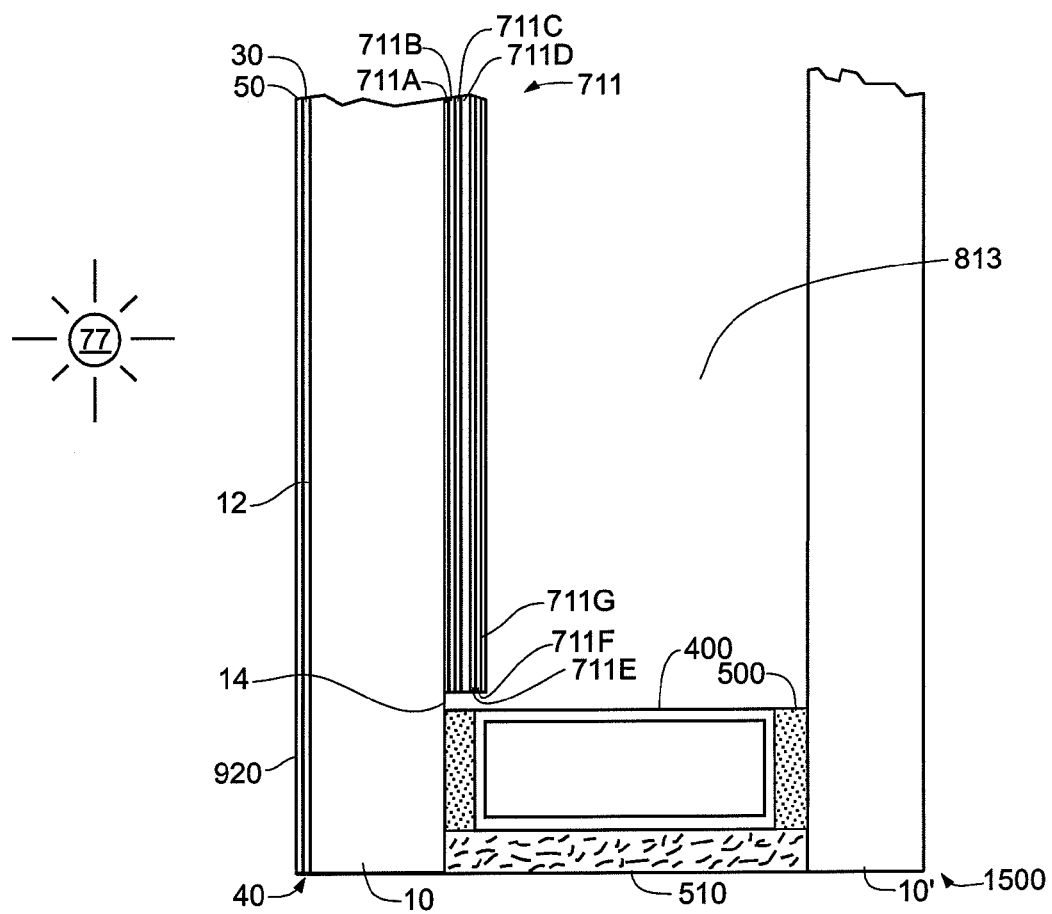
FIG. 3 is a partially broken-away schematic cross-sectional side view of a multiple-pane insulating glass unit that includes a pane bearing a hydrophilic coating and a low-emissivity coating in accordance with certain embodiments of the invention.

The substrate 10 in the present group of embodiments can be of any type described above. Preferably, it is a glass sheet having a major dimension of at least 1 meter. Whether or not the substrate 10 is glass, it can optionally be incorporated into (e.g., can be part of) a multiple-pane insulating glass unit 1500. Reference is made to FIG. 3. Further, the second major surface 14 of the substrate (whether it is monolithic or part of an IG unit) can optionally be provided with a low-emissivity coating 711. It is to be understood that the terms "first surface 12", "second surface 14", and the like are used for convenient reference. Thus, surface 12 need not be an exterior surface, a downwardly-facing surface, etc., absent an express indication to the contrary. The optional low-emissivity coating 711, when provided, preferably includes at least one infrared-reflective film comprising silver. Suitable low-emissivity coatings and deposition methods are described in U.S. patent application Ser. No. 09/728,435, entitled "Haze-Resistant Transparent Film Stacks", the entire teachings of which are incorporated herein by reference.

In certain embodiments of the present group, the substrate 10 is provided in combination with a window frame 95 on an exterior wall 98 of a building 99. Preferably, the substrate 10 is mounted in the window frame 95 such that the hydrophilic coating 40 is (e.g., in some embodiments, such that the hydrophilic film 50 is) exposed to an outdoor environment. In many embodiments of this nature, the hydrophilic coating 40 is (e.g., the hydrophilic film 50 is) exposed to periodic contact with rain.

The hydrophilic film 50 in the present group of embodiments can advantageously be a sputtered film. In such cases, the physical thickness of this film 50 preferably varies by less than 40 angstroms, and more preferably by less than 20 angstroms, over the first surface 12. That is, the maximum local physical thickness of this film 50 preferably is not more than 40 angstroms greater than the minimum local physical thickness of the film 50, taking into account the thickness of the film 50 at all locations across the first surface 12. The process parameters of the exemplary sputter deposition technique detailed above can be used to achieve such thickness uniformity. As noted above, however, the hydrophilic film 50 in the present group of embodiments can generally be produced by any suitable thin film deposition technique.

The invention provides a further group of embodiments wherein the compound region 50 is a hydrophilic film. This group of embodiments provides a glass sheet having generally-opposed first and second major surfaces, where the first major surface 12 bears a coating 40 comprising a compound region 50 that is a hydrophilic film. In the present embodiments, the hydrophilic film 50 comprises (and optionally consists essentially of) a material (such as a mixed oxide material or a mixed oxynitride material) that includes (and optionally consists essentially of) atoms of titanium, silicon, and oxygen. Preferably, in the present group of embodiments, the glass sheet when uncoated has a first visible reflectance, the glass sheet when bearing the coating 40 has a second visible reflectance, and the second visible reflectance is no more than about 3% greater (more preferably no more than about 1% greater, and perhaps optimally no more than about 0.75% greater, such as about 0.5% greater) than the first visible reflectance.

In some embodiments of the present group, the coating 40 has a physical thickness of greater than 45 Å, greater than 75 Å, greater than 100 Å, or greater than 150 Å, and yet still achieves a $\Delta R_v$ within one or more of the ranges noted in the immediately preceding paragraph. Thus, the coating 40 can provide hydrophilic functionality, while at the same time having virtually no impact on the optical properties of the substrate 10.

To achieve a preferred $\Delta R_v$, the hydrophilic film 50 can, for example, be provided as a mixed film having a refractive index and thickness selected to achieve the desired $\Delta R_v$. Preferably, the physical thickness of the hydrophilic film 50 is less than about 300 angstroms. Generally, the $\Delta R_v$ can be lowered by selecting a particularly small thickness (e.g., less than about 250 angstroms, perhaps more preferably less than about 200 angstroms) and/or by selecting a particularly low refractive index (e.g., less than about 2.1, perhaps more preferably less than about 1.7, and perhaps optimally less than the refractive index of the substrate itself) for the hydrophilic film 50.

Thus, the physical thickness of the hydrophilic film 50 in the present group of embodiments preferably is less than about 300 angstroms. In particular, some of these embodiments provide the hydrophilic film 50 at a physical thickness of between about 30 angstroms and about 200 angstroms, such as between about 40 angstroms and about 190 angstroms. In one particular embodiment, the physical thickness of the hydrophilic film 50 is about 90-100 angstroms, such as about 95 angstroms. In another embodiment, the physical thickness of the hydrophilic film 50 is about 45-55 angstroms, such as about 50 angstroms.

Generally, in the present group of embodiments, the hydrophilic film 50 has a refractive index of greater than 1.4 but less than 2.45. Perhaps more preferably, the refractive index is greater than 1.45 but less than 2.4. In some cases, the refractive index is greater than 1.5 but less than 2.25. In a particularly preferred subgroup of the present embodiments, the hydrophilic film as a refractive index of less than about 2.1 or less than about 1.7 (e.g., greater than 1.4, greater than 1.45, or greater than 1.5, but less than about 1.7), more preferably less than about 1.66, and perhaps optimally less than about 1.57.

To achieve a desired refractive index, the hydrophilic film 50 can, for example, be provided as a mix comprising titania and silica. Particularly preferred mixes of this nature comprise titania in an amount that is less than about 30% by weight relative to the total weight of the hydrophilic film 50. For example, when the hydrophilic film 50 is a mixed oxide film comprising titania, the titania can advantageously be present in an amount that is less than about 30% by weight relative to the total weight of the mixed oxide film. Titania weight percentages of less than about 30% are particularly advantageous in a mix that consists essentially of titania and silica.

Thus, the hydrophilic film 50 can optionally consist essentially of a mix of titania and silica. In embodiments of this nature, when the mixed film is about 30% titania and about 70% silica, the refractive index of the mixed film will be about 1.7. When the mixed film is about 20% titania and about 80% silica, the refractive index of the mixed film will be about 1.66. When the mixed film is about 10% titania and about 90% silica, the refractive index of the mixed film will be about 1.57. Thus, in some preferred embodiments, the mixed film comprises between about 10 and about 30 weight percent titania, with the remainder being essentially silica.

In the present group of embodiments, the hydrophilic film 50 can optionally have between about 10 and about 50 atomic percent titanium, relative to the total number of metal atoms in the hydrophilic film 50. Whether or not the hydrophilic film 50 (which can optionally be a mixed oxide or a mixed nitride) in the present embodiments has an amount of titanium in this range, the film 50 can advantageously have between about 90 and about 50 atomic percent silicon, relative to the total number of metal atoms in the film 50. In some embodiments, the hydrophilic film consists essentially of a mix of silica and titania, and the atomic percentages of titanium and silicon fall in the ranges noted in this paragraph. In some embodiments, the hydrophilic film consists essentially of a mix of silica and titania, and the atomic percentages of titanium and silicon fall in the ranges noted in this paragraph.

In the present group of embodiments, the hydrophilic film 50 can optionally have an outermost face 920 with an average surface roughness $R_a$ of less than 1.8 nm, and more preferably less than 1.6 nm. If so desired, the average surface roughness $R_a$ can be less than 1.0 nm, and in some embodiments is less than 0.6 nm. The process parameters of the exemplary sputter deposition technique detailed above can be used to achieve surface roughnesses within these ranges.

In the present group of embodiments, the coating 40 can optionally include at least one amorphous film between the hydrophilic film 50 and the first major surface 12 of the substrate 10. This amorphous film, for example, can be a silica film, such as a sputtered silica film. Any of the thicknesses described in the present disclosure with reference to the optional first film 30 can be used for the present amorphous film.

The substrate 10 in the present embodiment group is a glass sheet, preferably having a major dimension of at least 1 meter. The glass sheet can optionally be incorporated into (e.g., can be part of) a multiple-pane insulating glass unit 1500. Reference is made to FIG. 3. Further, the second major surface 14 of the glass sheet (whether it is monolithic or part of an IG unit) can optionally be provided with a low-emissivity coating 711. It is to be understood that the terms "first surface 12", "second surface 14", and the like are used for convenient reference. Thus, surface 12 need not be an exterior surface, a downwardly-facing surface, etc. absent an express indication to the contrary. The optional low-emissivity coating 711, when provided, preferably includes at least one infrared-reflective film comprising silver. Suitable low-emissivity coatings and deposition methods are described in U.S. patent application Ser. No. 09/728,435.

In certain embodiments of the present group, the glass sheet 10 is provided in combination with a window frame 95 on an exterior wall 98 of a building 99. Preferably, the glass sheet 10 is mounted in the frame 95 such that the hydrophilic coating 40 is (e.g., in some embodiments, such that the hydrophilic film 50 is) exposed to an outdoor environment. In many embodiments of this nature, the hydrophilic coating 40 is (e.g., the hydrophilic film 50 is) exposed to periodic contact with rain.

The hydrophilic film 50 in the present embodiment group can advantageously be a sputtered film. In such cases, the physical thickness of this film 50 preferably varies by less than 40 angstroms, and more preferably by less than 20 angstroms, over the first surface 12. That is, the maximum local physical thickness of this film 50 is preferably not more than 40 angstroms greater than the minimum local physical thickness of the film 50, taking into account the thickness of the film 50 at all locations across the first surface 12. The process parameters of the exemplary sputter deposition technique detailed above can be used to achieve such thickness uniformity. As noted above, however, the hydrophilic film 50 in the present group of embodiments can generally be produced by any suitable thin film deposition technique.

The invention provides still another group of embodiments wherein the compound region 50 is a hydrophilic film. This group of embodiments provides a glass sheet having generally-opposed first and second major surfaces, where the first major surface 12 bears a coating 40 comprising a compound region 50 that is a sputtered hydrophilic film. In the present embodiments, the sputtered hydrophilic film 50 comprises (and optionally consists essentially of) atoms of titanium, silicon, and oxygen. Preferably, the sputtered hydrophilic film 50 in the present group of embodiments has a physical thickness of between about 30 angstroms and about 200 angstroms. Conjointly, the present sputtered hydrophilic film 50 preferably has a refractive index of greater than 1.45 but less than 2.25. In a particularly preferred subgroup of the present embodiments, the sputtered hydrophilic film has a refractive index of greater than 1.45 but less than about 2.1 or less than about 1.7 (e.g., greater than 1.5, but less than about 1.7).

To achieve a desired refractive index, the sputtered hydrophilic film 50 of the present group of embodiments can, for example, be provided as a mix comprising (i.e., as a material including both) titania and silica. Particularly preferred mixes of this nature comprise titania in an amount that is less than about 30% by weight relative to the total weight of the sputtered hydrophilic film. For example, when the present sputtered hydrophilic film 50 is a mixed oxide film comprising titania, the titania can advantageously be present in an amount that is less than about 30% by weight relative to the total weight of the mixed oxide film. Titania weight percentages of less than about 30% are particularly advantageous in a mix that consists essentially of silica and titania.

Thus, the hydrophilic film 50 can optionally consist essentially of a sputtered mix of titania and silica. In embodiments of this nature, when the mixed film is about 30% titania and about 70% silica, the refractive index of the mixed film will be about 1.7. When the mixed film is about 20% titania and about 80% silica, the refractive index of the mixed film will be about 1.66. When the mixed film is about 10% titania and about 90% silica, the refractive index of the mixed film will be about 1.57. Thus, in some preferred embodiments, the mixed film comprises between about 10 and about 30 weight percent titania, with the remainder being essentially silica.

In the present group of embodiments, the sputtered hydrophilic film 50 can optionally have between about 10 and about 50 atomic percent titanium, relative to the total number of metal atoms in the hydrophilic film 50. Whether or not the hydrophilic film 50 (which can optionally be a mixed oxide or a mixed oxynitride) in the present embodiments has an amount of titanium in this range, the film 50 can advantageously have between about 90 and about 50 atomic percent silicon, relative to the total number of metal atoms in the film 50. In some embodiments, the hydrophilic film 50 consists essentially of a mix of silica and titania, and the atomic percentages of titanium and silicon fall in the ranges noted in this paragraph.

In the present group of embodiments, the substrate 10 when uncoated has a first visible reflectance, the substrate when bearing the coating 40 has a second visible reflectance, and the second visible reflectance preferably is no more than about 3% greater (more preferably no more than about 1% greater, and perhaps optimally no more than about 0.75% greater, such as about 0.5% greater) than the first visible reflectance. In some embodiments of this nature, the coating 40 has a thickness of greater than 45 angstroms, greater than 75 angstroms, greater than 100 angstroms, or greater than 150 angstroms, and yet still achieves a $\Delta R_y$ within one or more of these ranges. Thus, the coating 40 can provide hydrophilic functionality, while at the same time having virtually no impact on the optical properties of the substrate 10.

To achieve a preferred $\Delta R_y$, the hydrophilic film 50 can, for example, be provided as a mixed film having a refractive index and thickness selected to achieve the desired $\Delta R_y$. As noted above, the physical thickness of the hydrophilic film 50 preferably is between about 30 angstroms and about 200 angstroms. Generally, the $\Delta R_v$ can be lowered by selecting a particularly small thickness (e.g., between about 40 angstroms and about 190 angstroms) and/or by selecting a particularly low refractive index (e.g., less than about 2.1, perhaps more preferably less than about 1.7, and perhaps optimally less than the refractive index of the substrate itself) for the hydrophilic film 50.

In one particular embodiment, the physical thickness of the hydrophilic film 50 is about 90 Å-100 Å, such as about 95 Å. In another embodiment, the physical thickness of the hydrophilic film 50 is about 45 Å-55 Å, such as about 50 Å.

The sputtered hydrophilic film in the present embodiment group can optionally have an outermost face 920 with an average surface roughness $R_a$ of less than 1.8 nm, and more preferably less than 1.6 nm. If so desired, the average surface roughness $R_a$ can be less than 1.0 nm, and in some embodiments is less than 0.6 nm. The process parameters of the exemplary deposition technique detailed above can be used to provide coatings having surface roughnesses within these ranges.

The sputtered hydrophilic film in the present embodiment group preferably has a physical thickness that varies by less than 40 angstroms, and more preferably by less than 20 angstroms, over the first surface 12. That is, the maximum local physical thickness of this film 50 is preferably not more than 40 angstroms greater than the minimum local physical thickness of the film 50, taking into account the thickness of the film 50 at all locations across the first surface 12. The process parameters of the exemplary sputter deposition technique detailed above can be used to achieve such thickness uniformity.

In the present group of embodiments, the coating 40 can optionally include at least one amorphous film between the sputtered hydrophilic film 50 and the first major surface 12 of the substrate 10. This amorphous film, for example, can be a silica film, such as a sputtered silica film. Any of the thicknesses described in the present disclosure with reference to the optional first film 30 can be used for the present amorphous film.

In the present embodiment group, the substrate 10 is a glass sheet, preferably having a major dimension of at least 1 meter. The glass sheet can optionally be incorporated into (e.g., can be part of) a multiple-pane insulating glass unit. Reference is made to FIG. 3. Further, the second major surface 14 of the glass sheet (whether it is monolithic or part of an IG unit) can optionally be provided with a low-emissivity coating 711. It is to be understood that the terms "first surface 12", "second surface 14", and the like are used for convenient reference. Thus, surface 12 need not be an exterior surface, a downwardly-facing surface, etc. absent an express indication to the contrary. The optional low-emissivity coating 711, when provided, preferably includes at least one infrared-reflective film comprising silver. Suitable low-emissivity coatings and deposition methods are described in U.S. patent application Ser. No. 09/728,435.

In certain embodiments of the present group, the glass sheet 10 is provided in combination with a window frame 95 on an exterior wall 98 of a building 99. Preferably, the glass sheet 10 is mounted in the frame 95 such that the hydrophilic coating 40 is (e.g., in some embodiments, such that the hydrophilic film 50 is) exposed to an outdoor environment. In many embodiments of this nature, the hydrophilic coating 40 is (e.g., the hydrophilic film 50 is) exposed to periodic contact with rain.

The invention provides yet another group of embodiments wherein the compound region 50 is a hydrophilic film. This group of embodiments provides a glass sheet having generally-opposed first 12 and second 14 major surfaces, where the first major surface 12 bears a coating comprising a compound region 50 that is an amorphous hydrophilic film. In the present embodiments, the hydrophilic film 50 is entirely or substantially amorphous. Here, the amorphous hydrophilic film comprises (and optionally consists essentially of) atoms of titanium, silicon, and oxygen. Preferably, the amorphous hydrophilic film 50 in the present group of embodiments has a physical thickness of less than about 300 angstroms.

In the present group of embodiments, the amorphous hydrophilic film 50 can optionally have between about 10 and about 50 atomic percent titanium, relative to the total number of metal atoms in the hydrophilic film 50. Whether or not the hydrophilic film 50 (which can optionally be a mixed oxide or a mixed oxynitride) in the present embodiments has an amount of titanium in this range, the film 50 can advantageously have between about 90 and about 50 atomic percent silicon, relative to the total number of metal atoms in the film 50. In some embodiments, the hydrophilic film 50 consists essentially of a mix of silica and titania, and the atomic percentages of titanium and silicon fall in the ranges noted in this paragraph.

In the present embodiment group, the glass sheet 10 when uncoated has a first visible reflectance, the glass sheet when bearing the coating 40 has a second visible reflectance, and the second visible reflectance preferably is no more than about 3% greater (more preferably no more than about 1% greater, and perhaps optimally no more than about 0.75% greater, such as about 0.5% greater) than the first visible reflectance. In some embodiments of this nature, the coating 40 has a thickness of greater than 45 angstroms, greater than 75 angstroms, greater than 100 angstroms, or even greater than 150 angstroms, and yet still achieves a $\Delta R_v$ within one or more of these ranges. Thus, the coating 40 can provide hydrophilic functionality, while at the same time having virtually no impact on the optical properties of the substrate 10.

To achieve a preferred $\Delta R_v$, the hydrophilic film 50 can, for example, be provided as a mixed film having a refractive index and thickness selected to achieve the desired $\Delta R_v$. As noted above, the physical thickness of the hydrophilic film 50 preferably is less than about 300 angstroms. Generally, the $\Delta R_v$ can be lowered by selecting a particularly small thickness (e.g., less than about 250 angstroms, perhaps more preferably less than about 200 angstroms) and/or by selecting a particularly low refractive index (e.g., less than about 2.1, perhaps more preferably less than about 1.7, and perhaps optimally less than the refractive index of the substrate itself) for the hydrophilic film 50.

Thus, the physical thickness of the hydrophilic film 50 in the present group of embodiments preferably is less than about 300 angstroms. In particular, some of these embodiments provide the hydrophilic film 50 at a physical thickness of between about 30 angstroms and about 200 angstroms, such as between about 40 angstroms and about 190 angstroms. In one particular embodiment, the physical thickness of the hydrophilic film 50 is about 90 Å-100 Å, such as about 95 Å. In another embodiment, the physical thickness of the hydrophilic film 50 is about 45 Å-55 Å, such as about 50 Å.

Generally, in the present group of embodiments, the amorphous hydrophilic film has a refractive index of greater than 1.4 but less than 2.45. Perhaps more preferably, the refractive index is greater than 1.45 but less than 2.4. In some cases, the refractive index is greater than 1.5 but less than 2.25. In a particularly preferred subgroup of the present embodiments, the amorphous hydrophilic film has a refractive index of less than about 2.1 or less than about 1.7 (e.g., greater than 1.4, greater than 1.45, or greater than 1.5, but less than about 1.7), more preferably less than about 1.66, and perhaps optimally less than about 1.57.

To achieve a desired refractive index, the amorphous hydrophilic film of the present group of embodiments can, for example, be provided as a mix comprising titania and silica. Particularly preferred mixes of this nature comprise titania in an amount that is less than about 30% by weight relative to the total weight of the amorphous hydrophilic film. For example, when the present amorphous hydrophilic film is a mixed oxide film comprising titania, the titania can advantageously be present in an amount that is less than about 30% by weight relative to the total weight of the mixed oxide film. Titania weight percentages of less than about 30% are particularly advantageous in a mix that consists essentially of silica and titania.

Thus, the hydrophilic film 50 can optionally consist essentially of an amorphous mix of titania and silica. In embodiments of this nature, when the mixed film is about 30% titania and about 70% silica, the refractive index of the mixed film will be about 1.7. When the mixed film is about 20% titania and about 80% silica, the refractive index of the mixed film will be about 1.66. When the mixed film is about 10% titania and about 90% silica, the refractive index of the mixed film will be about 1.57. Thus, in some preferred embodiments, the mixed film comprises between about 10 and about 30 weight percent titania, with the remainder being essentially silica.

The amorphous hydrophilic film in the present embodiment group can optionally have an outermost face 920 with an average surface roughness $R_a$ of less than 1.8 nm, and more preferably less than 1.6 nm. If so desired, the average surface roughness $R_a$ can be less than 1.0 nm, and in some embodiments is less than 0.6 nm. The process parameters of the exemplary deposition technique detailed above can provide surface roughnesses within these ranges.

The amorphous hydrophilic film in the present embodiment group can advantageously be a sputtered film. In such cases, the physical thickness of this film 50 preferably varies by less than 40 angstroms, and more preferably by less than 20 angstroms, over the first surface 12. That is, the maximum local physical thickness of this film 50 is not more than 40 angstroms greater than the minimum local physical thickness of the film 50, taking into account the thickness of the film 50 at all locations across the first surface 12. The process parameters of the exemplary sputter deposition technique detailed above can be used to achieve such thickness uniformity. As noted above, however, the hydrophilic film 50 in the present embodiment group can generally be produced by any suitable thin film deposition technique.

In the present group of embodiments, the coating 40 can optionally include at least one amorphous film between the amorphous hydrophilic film 50 and the first major surface 12 of the glass sheet 10. This amorphous film, for example, can be a silica film, such as a sputtered silica film. Any of the thicknesses described in the present disclosure with reference to the optional first film 30 can be used.

In the present embodiment group, the substrate 10 is a glass sheet, preferably having a major dimension of at least 1 meter. The glass sheet can optionally be incorporated into (e.g., can be part of) a multiple-pane insulating glass unit. Reference is made to FIG. 3. Further, the second major surface 14 of the glass sheet (whether it is monolithic or part of an IG unit) can optionally be provided with a low-emissivity coating 711. It is to be understood that the terms "first surface 12", "second surface 14", and the like are used for convenient reference. Thus, surface 12 need not be an exterior surface, a downwardly-facing surface, etc. absent an express indication to the contrary. The optional low-emissivity coating 711, when provided, preferably includes at least one infrared-reflective film comprising silver. Suitable low-emissivity coatings and deposition methods are described in U.S. patent application Ser. No. 09/728,435.

In certain embodiments of the present group, the glass sheet 10 is provided in combination with a window frame 95 on an exterior wall 98 of a building 99. Preferably, the glass sheet 10 is mounted in the frame 95 such that the hydrophilic coating 40 is (e.g., in some embodiments, such that the hydrophilic film 50 is) exposed to an outdoor environment. In many embodiments of this nature, the hydrophilic coating 40 is (e.g., the hydrophilic film 50 is) exposed to periodic contact with rain.

In some embodiments of the invention, a co-sputtering method is used to deposit the compound region 50 of the coating 40 in the form of a mixed film. A group of these embodiments will now be described. The method comprises providing a sputter deposition chamber 200 in which there is mounted a first sputtering target 220A, 260A, 620A having a first sputterable target material and a second sputtering target 220B, 260B, 620B having a second sputterable target material. The first and second sputterable target materials here are of different composition (i.e., these targets carry different sputterable materials). In particular, the first sputterable target material comprises (e.g., consists essentially of) atoms of silicon (optionally together with atoms of aluminum or another material that increases the conductivity of the target), and the second sputterable target material comprises (e.g., consists essentially of) atoms of titanium. It is to be understood that the substrate 10 in the present co-sputtering method may first be conveyed past the "first" target and then past the "second" target, or the substrate may first be conveyed past the "second" target and then past the "first" target. Thus, by identifying the targets in these particular embodiments as "first" and "second" targets, no particular sequence is required.

Preferably, the first and second sputtering targets 220A, 220B, 260A, 260B, 620A, 620B in the present co-sputtering method are sputtered while maintaining the gaseous atmosphere in the deposition chamber 200 at a pressure of between about 0.1 mtorr. and about 10 mtorr., perhaps more preferably between about 1 mtorr. and about 5 mtorr. (e.g., about 3.5 mtorr.). These pressures can be achieved with conventional sputtering equipment. Thus, in certain embodiments, the chamber 200 is operated at, or is adapted for use at (e.g., is provided with conventional gas delivery and pumping systems adapted for establishing and maintaining) pressures within any range or ranges described in this paragraph.

Thus, in the present co-sputtering method, the deposition chamber 200 contains a gaseous atmosphere (e.g., an oxidizing and/or nitriding atmosphere). In certain preferred embodiments, this atmosphere is an oxidizing atmosphere consisting essentially of oxygen or a mix of oxygen and inert gas (e.g., argon).

The present co-sputtering method comprises providing a sheet-like substrate 10 in the deposition chamber 200, and sputtering the first 220A, 260A, 620A and second 220B, 260B, 620B targets such that a hydrophilic film 50 is deposited upon a first major surface 12 of the substrate 10. The hydrophilic film 50 here is a mixed film comprising (e.g., consisting essentially of) atoms of silicon, titanium, and oxygen. For example, the hydrophilic film 50 deposited in the present co-sputtering method can advantageously be a mixed oxide film or a mixed oxynitride film, perhaps optimally a mixed oxide film.

The present co-sputtering method is perhaps best appreciated with reference to FIGS. 5, 8-9, and 17. In the present method, the first sputtering target 220A, 260A, 620A can advantageously be a silicon target (optionally comprising a small amount of aluminum or the like). Suitable silicon targets are available commercially from a number of commercial suppliers, such as Bekaert VDS nv, which is located in Deinze, Belgium. Conjointly, the second sputtering target 220B, 260B, 620B can advantageously be a titanium target. Suitable titanium targets are available commercially from a number of commercial suppliers, such as TICO Titanium Inc., New Hudson, Mich., U.S.A. Alternatively, the second target can be a substoichiometric $TiO_x$ target, where x is less than 2. Targets of this nature are described in U.S. Pat. Nos. 6,461,686 and 6,468,402 and 6,511,587, the entire contents of each of which are incorporated herein by reference. Substoichiometric $TiO_x$ targets are commercially available from Bekaert VDS nv (Deinze, Belgium).

Generally, in the present co-sputtering method, the deposited film has a refractive index of greater than 1.4 but less than 2.45. Perhaps more preferably, the refractive index is greater than 1.45 but less than 2.4. In some cases, the refractive index is greater than 1.5 but less than 2.25. In a particularly preferred subgroup of the present embodiments, the mixed film (which can optionally be a mix of titania and silica) has a refractive index of less than about 1.7 (e.g., greater than 1.4, greater than 1.45, or greater than 1.5, but less than about 1.7), more preferably less than about 1.66, and perhaps optimally less than about 1.57.

To achieve a desired refractive index, the hydrophilic film deposited in the present co-sputtering method can, for example, be provided as a mix comprising titania and silica. Particularly preferred mixes of this nature comprise titania in an amount that is less than about 30% by weight relative to the total weight of the hydrophilic mixed film. For example, when the hydrophilic film 50 is a mixed oxide film comprising titania, the titania can advantageously be present in an amount that is less than about 30% by weight relative to the total weight of the mixed oxide film. Titania weight percentages of less than about 30% are particularly advantageous in a mix that consists essentially of titania and silica.

Thus, the present hydrophilic film 50 can optionally consist essentially of a mix of titania and silica. In embodiments of this nature, when the mixed film is about 30% titania and about 70% silica, the refractive index of the mixed film will be about 1.7. When the mixed film is about 20% titania and about 80% silica, the refractive index of the mixed film will be about 1.66. When the mixed film is about 10% titania and about 90% silica, the refractive index of the mixed film will be about 1.57. Thus, in some preferred embodiments, the mixed film comprises between about 10 and about 30 weight percent titania, with the remainder being essentially silica.

In the present co-sputtering method, the hydrophilic film 50 can optionally have between about 10 and about 50 atomic percent titanium, relative to the total number of metal atoms in the hydrophilic film 50. Whether or not the hydrophilic film 50 (which can optionally be a mixed oxide or a mixed oxynitride) deposited in the present co-sputtering method has an amount of titanium in this range, the film 50 can advantageously have between about 90 and about 50 atomic percent silicon, relative to the total number of metal atoms in the film 50. As noted above, in certain embodiments of the present co-sputtering method, the hydrophilic film comprises (e.g., is) a mixed oxide consisting essentially of silica and titania. In some embodiments, the hydrophilic film consists essentially of a mix of titania and silica, and the atomic percentages fall in the ranges noted in this paragraph.

In the present co-sputtering method, the mixed film can optionally be deposited to a physical thickness of less than about 300 angstroms, perhaps more preferably less than 200 angstroms, and perhaps optimally less than about 160 angstroms. In one particular embodiment, the physical thickness of the mixed film is about 90 Å-100 Å, such as about 95 Å. In another embodiment, the physical thickness of the mixed film is about 45 Å-55 Å, such as about 50 Å.

In some embodiments of the co-sputtering method, the mixed film is deposited as an exposed outermost film of the coating 40. Here, the mixed film can be the only film of the coating, or one or more underlying films can be provided.

Figure 8:
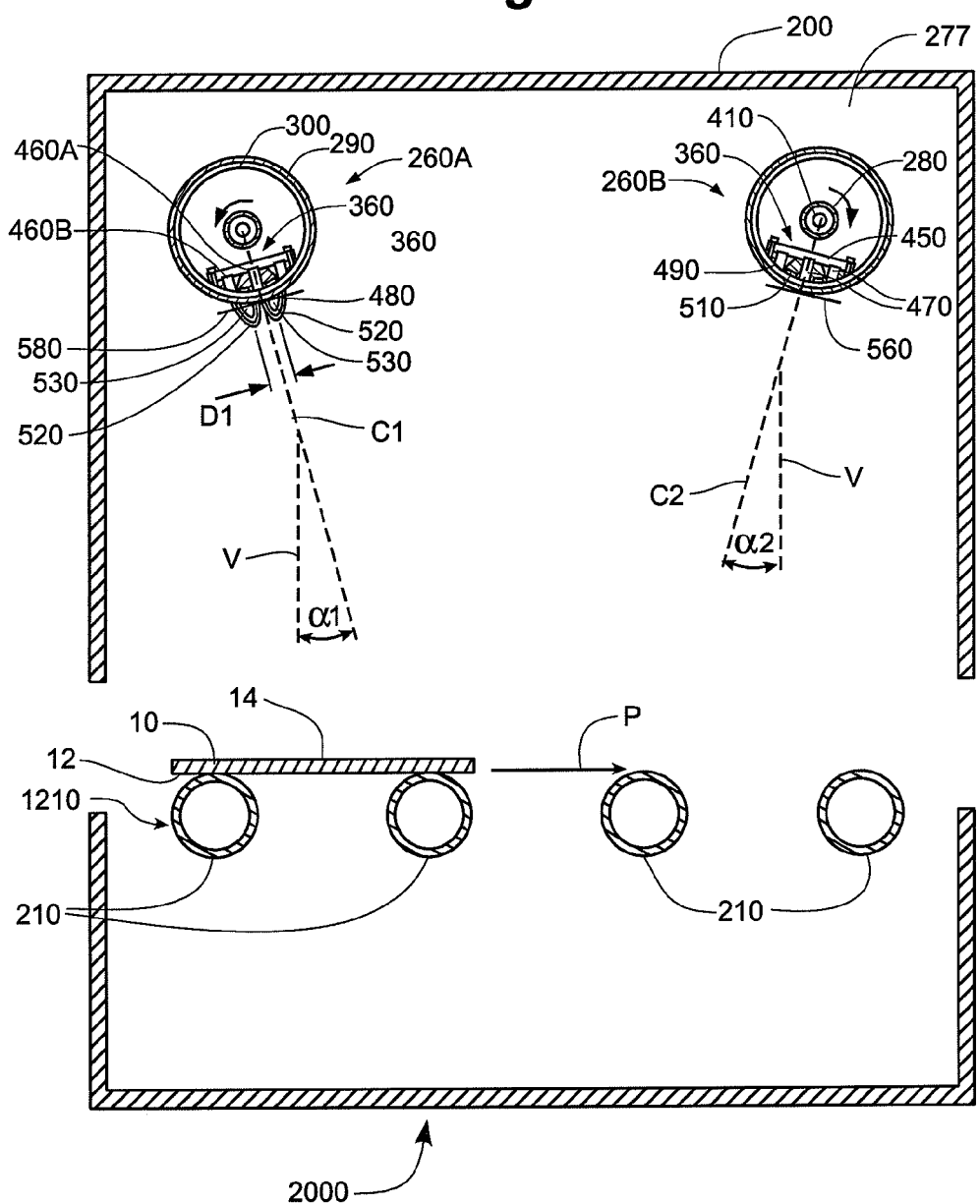
FIG. 8 is a schematic cross-sectional side view of a deposition chamber in accordance with certain embodiments of the invention.
Figure 17:
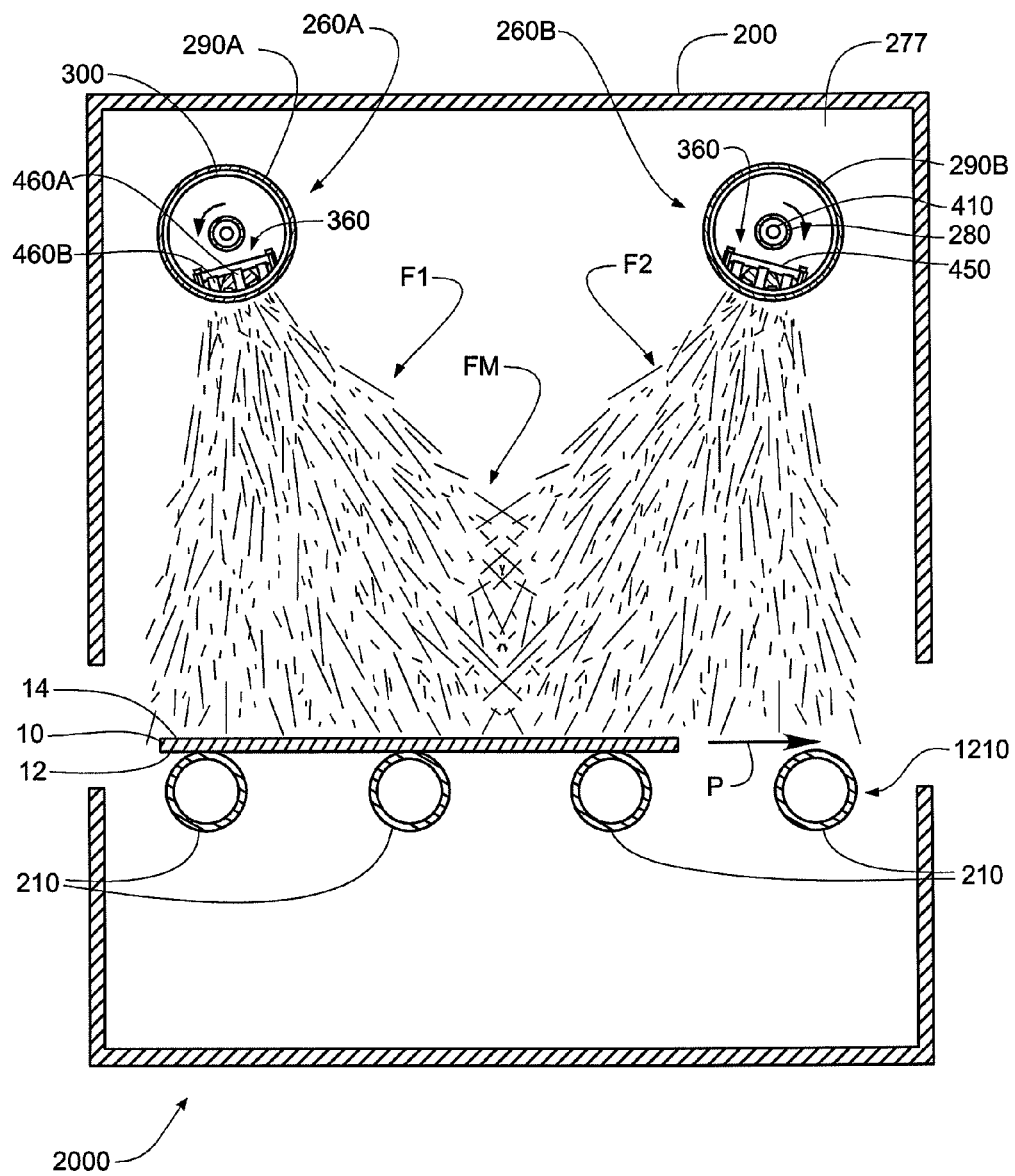
FIG. 17 is a schematic side view of a deposition chamber adapted for use in certain methods of the invention.

In the present co-sputtering method, the first and second targets 220A, 220B, 260A, 260B, 620A, 620B can optionally be sputtered so as to emit generally converging fluxes (or "plumes" or "beams") F1, F2 of material. For example, the first and second targets can optionally be provided with magnet assemblies 360 that cause the fluxes F1, F2 to be generally converging. In some embodiments of this nature, the first and second targets are rotary targets inside each of which there is provided a magnet assembly 360, at least one of these magnet assemblies being mounted in an orientation offset from vertical. That is, at least one of the magnet assemblies 360 is not oriented in a vertical direction, but rather is mounted in a position turned (e.g., offset) from the conventional vertical position, so as to somewhat face the other target. Reference is made to FIGS. 8 and 17. The magnet assemblies here can comprise components like those described in U.S. Pat. No. 6,488,824, the entire contents of which are incorporated herein by reference.

Thus, in certain embodiments of the present co-sputtering method, the first target 220A, 260A, 620A is sputtered so as to emit a first flux F1 of material, and the second target 220B, 260B, 620B is sputtered so as to emit a second flux F2 of material. The first target 220A, 260A, 620A can optionally be provided with a first magnet assembly 360 that causes the first flux F1 to have a desired distribution (e.g., of sputtered particles) oriented along a centerline C1 that is offset from vertical V by a first angle α1. Additionally or alternatively, the second target 220B, 260B, 620B can optionally be provided with a second magnet assembly 360 that causes the second flux F2 to have a desired distribution oriented along a centerline C2 that is offset from vertical V by a second angle α2. Reference is made to FIGS. 8 and 17. Here, both of the illustrated magnet assemblies 360 are offset from vertical. The first and second angles α1, α2, for example, can optionally each be at least about five degrees. In some embodiments of this nature, each of the angles α1, α2 is between about five degrees and about 40 degrees.

In certain embodiments of the present co-sputtering method, one of the magnet assemblies 360 is in a conventional vertical position, while the other magnet assembly 360 is offset from vertical by a desired angle. For example, the magnet assemblies 360 can optionally be configured such that one of the corresponding flux centerlines is about vertical V, while the other is offset from vertical V, preferably by at least about 5 degrees, and perhaps more preferably by at least about 10 degrees. In one embodiment of this nature, the target with the offset magnet assembly is a silicon target, while the target with the vertical magnet assembly is a titanium target. In other embodiments, the target with the offset magnet assembly is a titanium target, while the target with the vertical magnet assembly is a silicon target.

In one particular co-sputtering embodiment, the first and second targets are provided with respective magnet assemblies 360 that are offset from the conventional vertical configuration and turned inwardly (i.e., toward each other) such that the respective flux distributions of the first and second targets have centerlines C1, C2 that intersect at (or within about an inch of) a point on a surface of an adjacent substrate 10 to be coated. This technique can be used, for example, to provide a particularly uniform mixed film.

As exemplified in FIG. 17, in the present co-sputtering method, the first F1 and second F2 fluxes of material flow into each other at least to a partial extent, such that a mixed flow FM impinges at least one area of the substrate's first surface 12. In some embodiments of this nature, the first target 220A, 260A, 620A is sputtered so as to emit a first flux F1 of material comprising silicon atoms (optionally, at least about 20% of the atoms of this flux F1 are silicon atoms), and the second target 220B, 260B, 620B is sputtered so as to emit a second flux F2 comprising titanium atoms (optionally, at least about 20% of the atoms of this flux F2 are titanium atoms). In these embodiments, when the first F1 and second F2 fluxes flow into each other, the resulting mixed flow FM comprises silicon atoms and titanium atoms. In some embodiments of this nature, the mixed flow FM also includes oxygen atoms, as would be the case, for example, if one or both of the targets carry a sputterable oxide target material.

Thus, in some embodiments of the present co-sputtering method, the first target 220A, 260A, 620A is sputtered so as to emit a first flux F1 that includes silicon atoms, and the second target 220B, 260B, 620B is sputtered so as to emit a second flux F2 that includes titanium atoms. In some of these embodiments, the first flux F1 of material is emitted from the first target 220A, 260A, 620A at a first emission rate, the second flux F2 of material is emitted from the second target 220B, 260B, 620B at a second emission rate, and the first and second emission rates are different. This can be accomplished, for example, by selecting the first and second targets such that they carry (i.e., comprise) target materials that sputter at different rates and/or by sputtering these two targets at different power levels. By providing different emission rates from the first and second targets, the relative amounts of the different metals in the co-sputtered film can be controlled and varied to meet the requirements of a wide range of applications.

Figure 5:
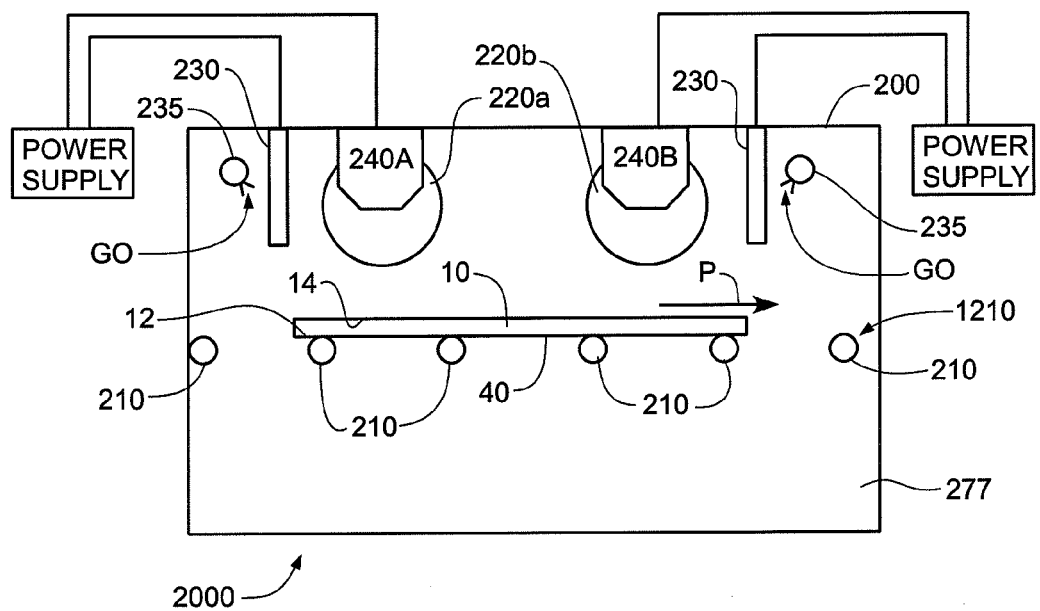
FIG. 5 is a schematic side view of a deposition chamber in accordance with certain embodiments of the invention.
Figure 6:
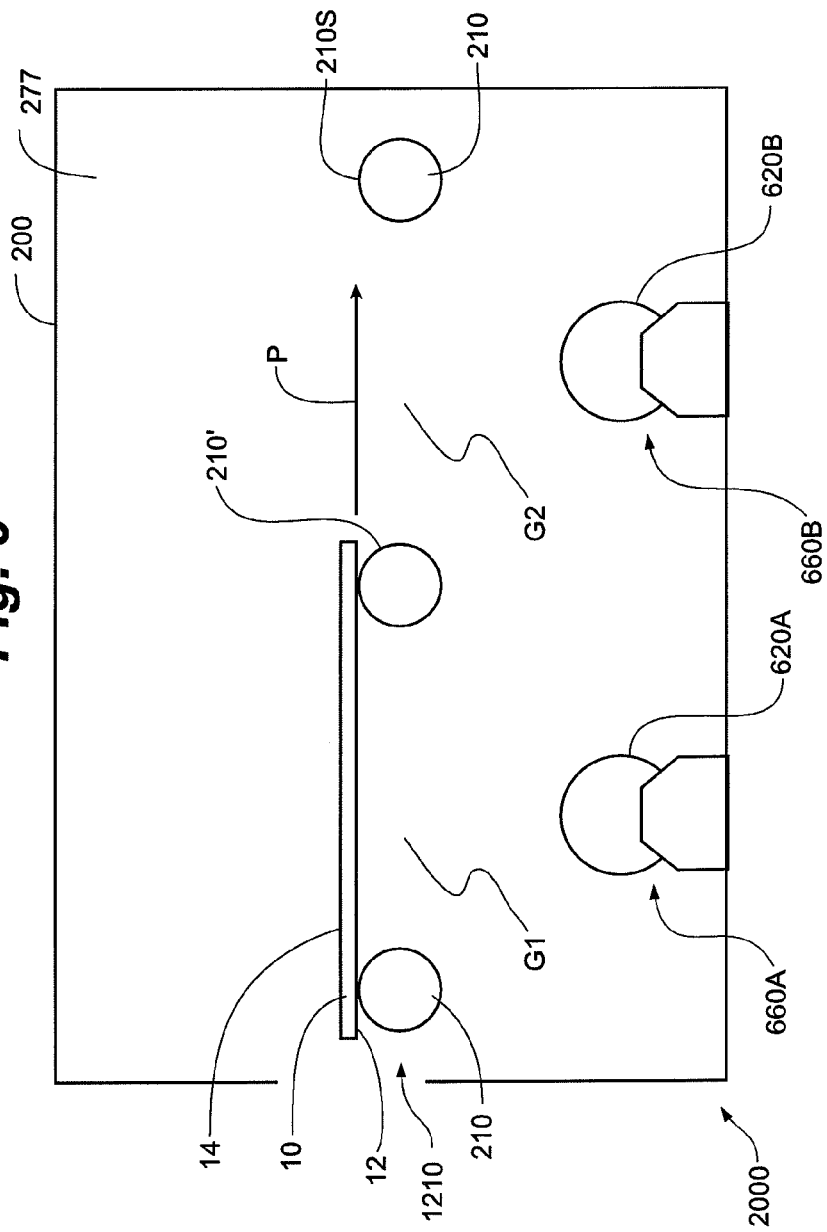
FIG. 6 is a schematic side view of a deposition chamber in accordance with certain embodiments of the invention.

In certain embodiments of the present co-sputtering method, a first power supply is operated to sputter the first target 220A, 260A, 620A and a second power supply is operated to sputter the second target 220B, 260B, 620B. Reference is made to FIG. 5. The first and second power supplies can optionally be DC power supplies operated so as to deliver direct current electricity to the first and second targets, respectively. If so desired, the first target 220A, 260A, 620A can be sputtered at a different power level than the second target 220B, 260B, 620B. Suitable DC power supplies are available from a number of well known commercial suppliers, such as Bekaert VDS nv (Deinze, Belgium). In embodiments involving first and second DC power supplies, these power supplies can optionally be operated in a DC switching mode, such that direct current electricity is delivered only to the first target for a desired time period, whereafter a switch is performed such that direct current electricity is delivered only to the second target for a desired time period, whereafter another switch is performed such that direct current electricity is delivered only to the first target for a desired time period, this switching being performed continuously for a desired period of time. Methods of this nature can be practiced, for example, using a Bekaert DC power supply and a Bekaert switching box, which can be obtained commercially from Bekaert VDS nv (Deinze, Belgium).

In some embodiments of the present co-sputtering method, the deposition chamber 200 includes a substrate transport system 1210 defining a path of substrate travel P extending over the first 620A and second 620B targets. Here, the method includes conveying a substrate 10 along the path of substrate travel P (e.g., after positioning the substrate on the transport system), and sputtering the first and second targets upwardly so as to deposit the present mixed film upon a first major surface 12 of the substrate. This method could be practiced, for example, by operating an apparatus like that exemplified in FIG. 9. In methods of this nature, care is preferably taken to assure that the gap G is not so wide as to cause problems in conveying substrates of the desired size(s) over the gap. In upward co-sputtering methods, the mixed film preferably is deposited over an entirety of the substrate's first surface 12. Further, in some of these embodiments, the substrate's first surface 12 once coated with the present mixed film comes into direct contact with at least one surface 210S, 144S of the transport system 1210. This surface 210S, 144S can be a top (e.g., upward facing) surface of a transport roller 210 or a conveyor belt 144C-144G. Reference is made to FIGS. 9 and 10A.

In certain embodiments of the present co-sputtering method, a single AC power supply is operated to deliver alternating current electricity to the first 220A, 260A, 620A and second targets 220B, 260B, 620B. Reference is made to FIG. 9. Suitable AC power supplies are available from Advanced Energy Industries, Inc. (Fort Collins, Colo., USA), such as the AC model referred to commercially as the CRYSTAL power supply.

In some co-sputtering embodiments, the method further comprises sputter depositing upon a second major surface 14 of the substrate a low-emissivity coating 711 that includes at least one infrared-reflective film 771B, 711E comprising silver. Reference is made to FIGS. 10A and 10B.

Finally, in certain embodiments of the present co-sputtering method, the deposition chamber 200 is a sputtering chamber that is part of a large-area coater 2000 and the substrate 10 has a major dimension of at least about 1 meter.

Thus, it can be appreciated that the invention provides many useful embodiments. Some of these embodiments provide coatings, while others provide deposition methods. In connection with the coating embodiments, the invention provides a substrate 10 bearing a hydrophilic coating 40. In one group of coating embodiments, the hydrophilic coating 40 includes: (1) a first film 30 deposited over a major surface 12 of the substrate 10; and (2) a compound region 50 deposited over the first film 30. As noted above, the compound region 50 can be a mixed film or it can be a plurality of very thin films. Additional films can optionally be provided between the substrate 10 and the first film 30, between the first film 30 and the compound region 50, and/or over the compound region 50. Such additional films can be provided for a variety of different reasons, such as to optimize or otherwise control the optical properties of the coated substrate, to increase blockage of sodium ions that may migrate from the substrate to the compound region 50 (e.g., when the substrate is soda-lime glass), to increase the hydrophilicity of the coating, to provide photoactivity in the coating, and/or to increase photoactivity of the coating.

Figure 28:
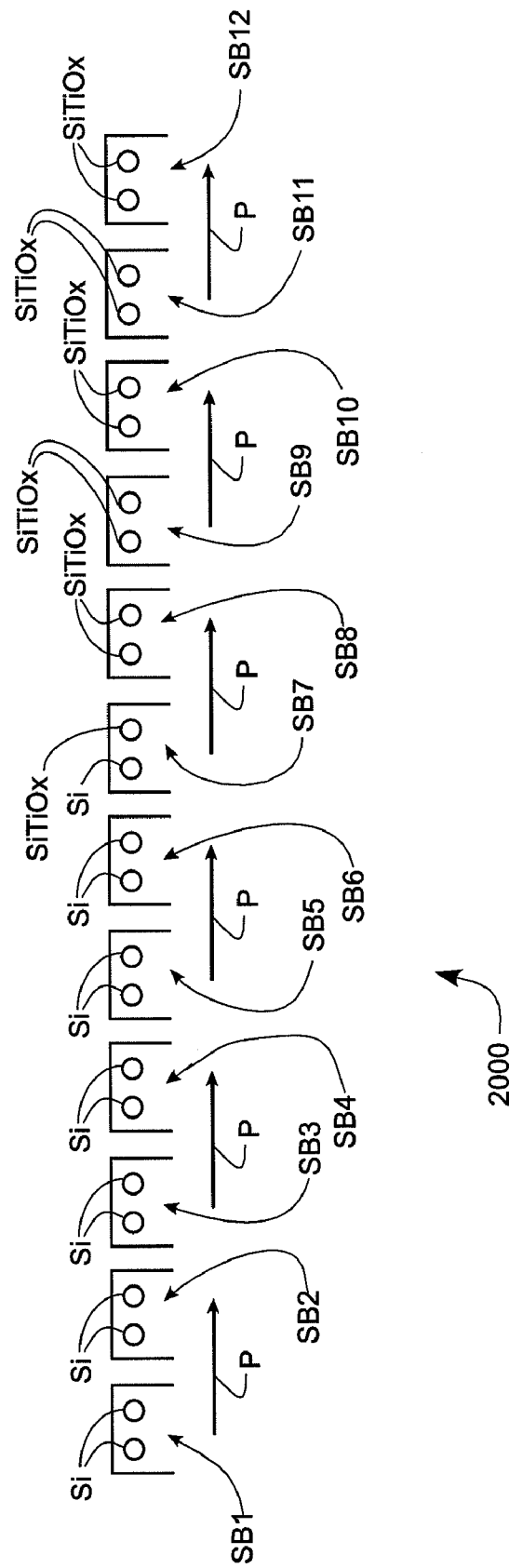
FIG. 28 is a schematic side view of a coater in accordance with certain embodiments of the invention.
Figure 29:
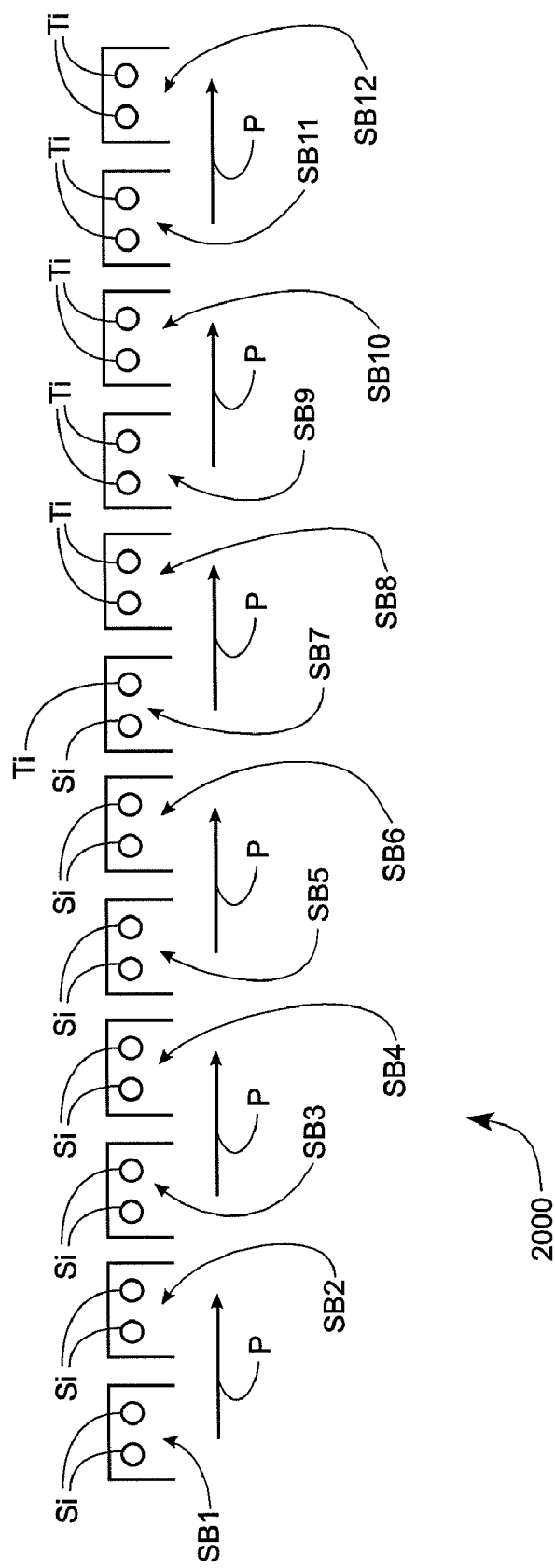
FIG. 29 is a schematic side view of a coater in accordance with certain embodiments of the invention.

In the present group of embodiments, the first film 30 can optionally be graded into the compound region 50. For example, in some embodiments, the first film 30 transitions gradually into the compound region 50. A coating of this nature can be produced, for example, by: (1) depositing over a substrate a thickness (e.g., at least about 30 Å, or at least about 40 Å) of substantially homogenous film comprising silica or another dielectric material; (2) depositing a graded film region; and (3) depositing a thickness of mixed film that comprises atoms of titanium, atoms of at least one other metal (i.e., a metal other than titanium), and atoms of oxygen; wherein the graded film region transitions gradually, with increasing distance from the substrate, from the composition of the first film 30 to the composition of the mixed film. Reference is made to FIG. 28.

In some embodiments of the present group, the first film 30 is a base film that is deposited directly over the substrate 10 (e.g., directly over a surface 12 of the substrate). This film, for example, can comprise silica (i.e., silicon oxide, e.g., silicon dioxide). When provided, the film 30 preferably consists of, or consists essentially of, silicon dioxide. The composition of such a film, however, can include small amounts of an electrically-conductive material, such as aluminum, which may be oxidized in the film. For example, the film 30 can be deposited by sputtering a silicon-containing target that includes a small amount of aluminum or another material that enhances the electrical conductivity of the target. In another embodiment, the first film 30 comprises silicon nitride. In still another embodiment, the first film 30 comprises zirconia (i.e., zirconium oxide). Optionally, the film 30 is entirely or substantially amorphous.

In embodiments of the present group, the first film 30 (the entire thickness of which can optionally consist essentially of silica) desirably has (e.g., is deposited at) a physical thickness of less than about 300 angstroms, perhaps more preferably less than about 250 angstroms (e.g., between about 40 angstroms and about 250 angstroms), and perhaps optimally between about 50 angstroms and about 250 angstroms. In some embodiments, the first film 30 (optionally when comprising or consisting essentially of silica) is provided at a thickness of less than 125 angstroms, less than 100 angstroms, or less than 95 angstroms.

Figure 15:
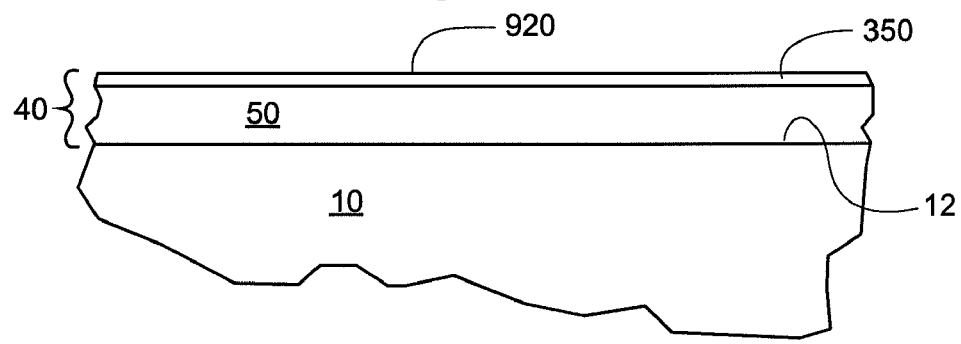
FIG. 15 is a partially broken-away schematic side view of a substrate bearing a hydrophilic coating in accordance with certain embodiments of the invention.
Figure 16:
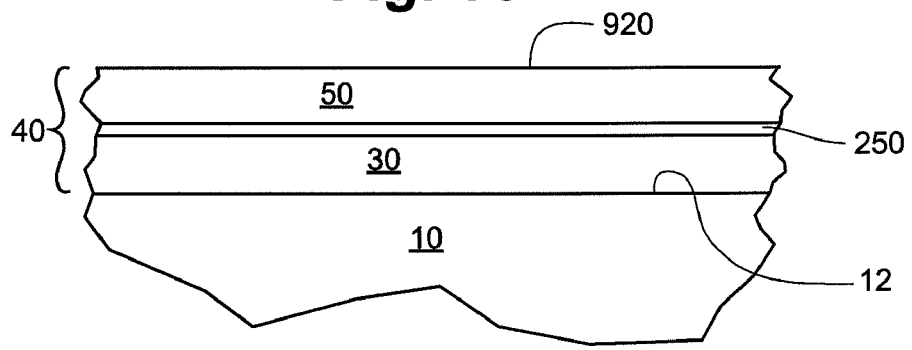
FIG. 16 is a partially broken-away schematic side view of a substrate bearing a hydrophilic coating in accordance with certain embodiments of the invention.

As noted above, the coating 40 includes a compound region 50. The compound region 50, in certain embodiments, is deposited directly over the optional first film 30. In some embodiments of this nature, at least one film is deposited between the first film 30 and the first surface 12 of the substrate 10. In other embodiments, at least one film 250 is deposited between the compound region 50 and the optional first film 30, as shown in FIG. 16. In still other embodiments, the compound region 50 is deposited directly over a surface 12 of the substrate 10, as shown in FIG. 15.

As noted above, the compound region preferably comprises at least one photocatalyst. Useful photocatalysts may include oxides of titanium, iron, silver, copper, tungsten, aluminum, zinc, strontium, palladium, gold, platinum, nickel, cobalt, or combinations thereof. In preferred embodiments, the compound region 50 comprises titania. In some embodiments of this nature, the compound region 50 is a hydrophilic film comprising (or consisting essentially of) atoms of titanium, silicon, and oxygen. This film, for example, can optionally be a mixture including (e.g., consisting essentially of) titania and silica. In some embodiments of this nature, the hydrophilic film comprises, or consists essentially of, silica and substoichiometric titania ($TiO_x$, where x is less than 2).

Generally, the compound region 50 (an entire thickness of which, and all areas of which, may optionally consist essentially of a mixture of titania and silica) is provided at a physical thickness of less than about 400 angstroms, perhaps more preferably less than about 300 angstroms, and perhaps optimally less than about 200 angstroms. In particular, some of these embodiments provide the compound region 50 at a physical thickness of between about 30 angstroms and about 200 angstroms, such as between about 40 angstroms and about 190 angstroms. In one particular embodiment, the physical thickness of the compound region 50 is about 90 Å-110 Å, such as about 95 Å. In another embodiment, the physical thickness of the compound region 50 is about 45 Å-55 Å, such as about 50 Å.

In certain preferred embodiments, the compound region 50 comprises sputtered film. In particularly preferred embodiments of this nature, the compound region 50 is formed entirely of sputtered film. For example, in some cases, the compound region 50 comprises (or is formed of) film that has been sputter deposited at a low temperature (e.g., while maintaining the substrate 10 at a temperature of less than about 250 degrees Celsius, and preferably less than 200 degrees Celsius). In these cases, the film preferably is sputter deposited without any supplemental means for delivering energy to the growing film (e.g., without any active heating, i.e., without any heating of the substrate beyond that which occurs normally from the plasma and ion bombardment of conventional sputtering). In other cases, the film is deposited by a sputter deposition technique that involves a supplemental heating of (or other supplemental energy delivery to) the substrate.

Some embodiments of the present group provide a substrate 10 (e.g., a glass sheet) having a first major surface 12 directly over which there is deposited a first film 30, optionally consisting essentially of silica and/or silicon nitride, at a thickness of between about 30 angstroms and about 300 angstroms, and a mixed film comprising (or consisting essentially of) silica and titania is deposited directly over the first film 30 at a thickness of between about 30 angstroms and about 300 angstroms. In some of these embodiments, the first film 30 comprises silica at a thickness of between about 50 angstroms and about 250 angstroms, perhaps about 110 angstroms, while the mixed film comprises (e.g., a mix of) silica and titania and has a thickness of between about 50 angstroms and about 250 angstroms, perhaps about 50 angstroms or about 95 angstroms.

In some embodiments, the compound region 50 is a mixed film having a physical thickness of less than 125 angstroms (and optionally less than 100 angstroms) but greater than about 30 angstroms, while the optional first film 30 has a thickness of less than about 300 angstroms but greater than about 30 angstroms. In these embodiments, the first film can optionally comprise (or consist essentially of) silica and/or silicon nitride, while the mixed film can optionally comprise (or consist essentially of) a mix of silica and titania.

In some embodiments of the present group, the compound region 50 is a mixed oxide film or a mixed oxynitride film (that is, a thickness of an oxide or oxynitride material that includes atoms of at least two different metals). Preferably, the mixed film in these embodiments includes atoms of two different metals that are each present in the mixed film in an amount equal to at least about five atomic percent (and in some cases at least about 10 atomic percent) relative to the total number of metal atoms in the mixed film. In the present disclosure, the term "metal" is defined to include, in addition to true metals, semi-metals (or "metalloids") such as silicon.

Conventional wisdom may suggest that the present coating 40 would not have enough photoactivity to give desirable self-cleaning properties. The present coating 40, however, is particularly advantageous in giving windows water-sheeting properties, while at the same time having exceptional optical properties and durability.

Figure 14:
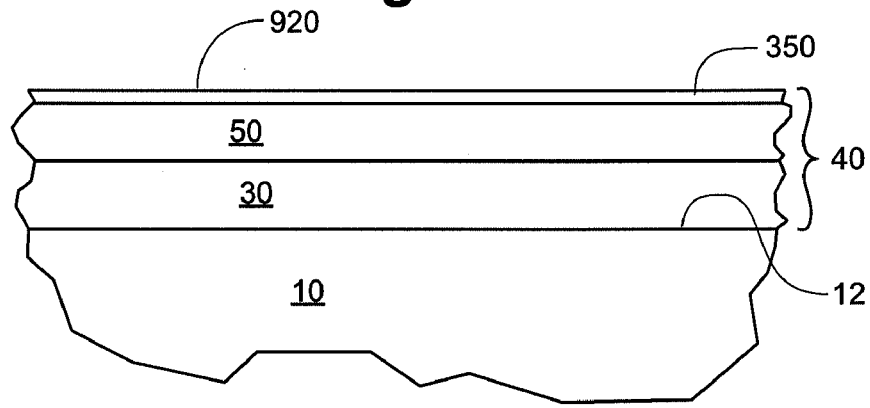
FIG. 14 is a partially broken-away schematic side view of a substrate bearing a hydrophilic coating in accordance with certain embodiments of the invention.

As noted above, the compound region 50 in certain embodiments is a mixed film. In some cases, this mixed film is the outermost film of the coating 40. In other cases, there is a very thin film 350 comprising titania (e.g., $TiO_2$) overlying the mixed film. Embodiments of this nature are exemplified in FIGS. 14 and 15. In these embodiments, the mixed film (which can optionally be a mixed oxide) preferably is a mix of titania and at least one other material (e.g., silica). For example, the mixed film in the embodiments of FIGS. 14 and 15 can be any one of the mixed films described above.

The film 350, when provided, preferably has a thickness of less than about 60 angstroms, and perhaps more preferably less than about 50 angstroms (e.g., between 5 angstroms and about 50 angstroms). In one particular embodiment, this film 350 has a thickness of between about 30 angstroms and about 50 angstroms. When provided, the film 350 can optionally consist essentially of (or consist of) titania, such as $TiO_2$ or $TiO_x$, where x is less than 2. Further, when provided, the film 350 preferably is the outermost film of the coating 40, such that the film 350 defines an exposed outermost face 920 of the coating.

In some embodiments, the optional film 350 is deposited by sputtering one or more metallic (e.g., essentially pure metal) titanium targets. For example, certain methods of the invention involve: (1) providing a substrate 10 having a major surface 12 over which there is deposited a mixed oxide film (e.g., a film consisting essentially of a mix of titania and silica); and (2) depositing a titania film over (e.g., directly over) the mixed oxide film by sputtering in an oxidizing atmosphere one or more metallic targets each consisting essentially of (or consisting of) titanium. This method can optionally involve depositing the film 350 at a thickness within one or more of the ranges described in the immediately preceding paragraph.

Further, in certain embodiments, the compound region 50 is a mixed film directly beneath which there is positioned a very thin film 250 comprising titania. FIG. 16 exemplifies embodiments of this nature. The film 250 can optionally be deposited directly over the optional first film 30. In the present embodiments, the mixed film (which can optionally be a mixed oxide film) preferably is a mix of titania and at least one other material (e.g., silica). For example, the mixed film in the embodiments of FIG. 16 can be any one of the mixed films described above.

The film 250, when provided, preferably has a thickness of less than about 60 angstroms, perhaps more preferably less than about 50 angstroms (e.g., between 5 angstroms and about 50 angstroms). In one particular embodiment, the film 250 has a thickness of between 30 angstroms and 50 angstroms. When provided, this film 250 can optionally consist essentially of (or consist of) titania, such as $TiO_2$ or $TiO_x$, where x is less than 2.

In one particular embodiment, optional film 250 is provided in conjunction with optional film 350, such that a mixed film serving as the compound region 50 is sandwiched directly between film 250 and film 350. In other embodiments, when optional film 250 is provided, a mixed film serving as the compound region is the outermost film of the coating.

In some embodiments, the optional film 250 is deposited by sputtering one or more metallic (e.g., essentially pure metal) titanium targets. Thus, certain methods of the invention involve: (1) providing a substrate 10 having a major surface 12; (2) depositing a very thin titania film over (directly over, or over a previously-deposited film 30) the surface 12 of the substrate 10 by sputtering in an oxidizing atmosphere one or more metallic targets each consisting essentially of (or consisting of) titanium; and (3) depositing a mixed oxide film over (e.g., directly over) the titania film 250. This method can optionally involve depositing the film 350 at a thickness within one or more of the ranges described in the immediately preceding paragraph.

In the coating embodiments of the present disclosure, the coating 40 preferably has an exposed outer face 920. In some embodiments, this outer face has an average surface roughness $R_a$ of less than 1.8 nm, preferably less than about 1.6 nm, perhaps more preferably less than about 1.0 nm, and in some cases less than about 0.6 nm. The process parameters of the exemplary deposition techniques detailed above can be used to provide surface roughnesses in these ranges.

Figure 4:
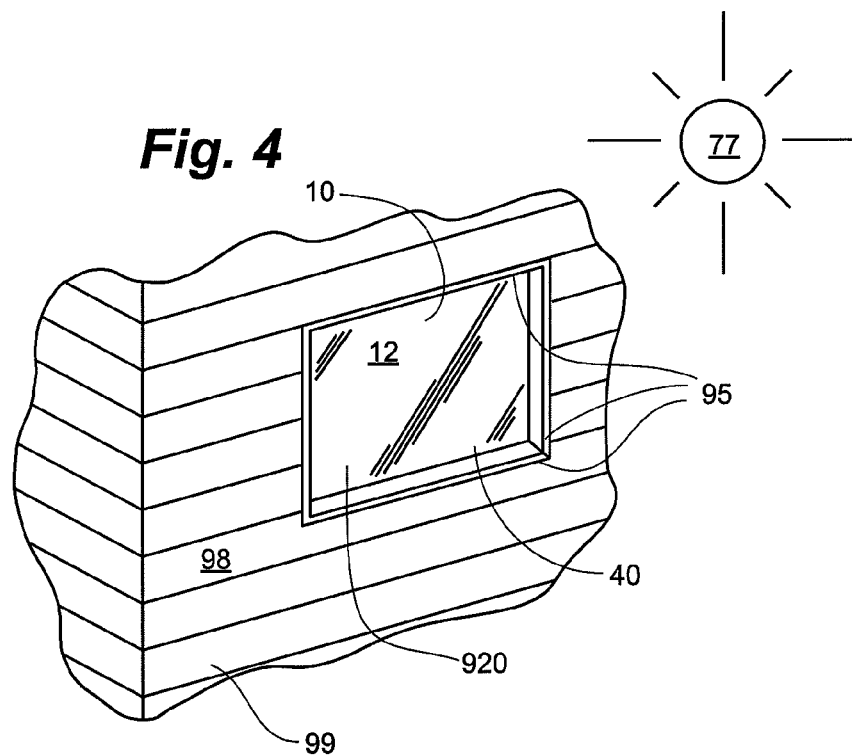
FIG. 4 is a partially broken-away perspective view of a window pane bearing a hydrophilic coating, the pane is mounted in an exterior wall of a building in accordance with certain embodiments of the invention.

In certain embodiments, the hydrophilic coating 40 is on the "first" surface of a window or other glazing. This can be appreciated with reference to FIG. 4, which exemplifies embodiments wherein the substrate 10 (which may be a glass pane) is a window pane that is mounted on a window frame 95 (e.g., in an exterior wall 98 of a building 99). In many such applications, the coated first surface (i.e., the surface 12 on which the hydrophilic coating 40 is provided) of such a window will be exposed to an outdoor environment, represented by the sun 77 (e.g., such that the coating 40 will be in periodic contact with rain).

In one embodiment, a hydrophilic coating 40 is applied to the "fourth" surface of a window (e.g., the #4 surface of a double-pane IG unit), optionally in conjunction with providing a hydrophilic coating 40 on the first surface of the same window. Further, in monolithic windows, the hydrophilic coating 40 can be provided on only the #1 surface, on only the #2 surface, or on both the #1 and #2 surfaces.

Turning now to FIG. 3, there is shown a substrate 10 bearing two coatings: (1) a hydrophilic coating 40 on the first surface 12 of the substrate; and (2) a low-emissivity coating 711 on the second surface 14 of the substrate. Here, the substrate 10 is part of a multiple-pane IG unit. Alternatively, with such an IG unit, the low-emissivity coating 711 can be positioned on the third surface (the so-called "third surface" is the surface of the second, e.g., inboard, pane 10' that is exposed to the between-pane space 813 of the IG unit). The low-emissivity coating 711 is not required in all embodiments. When provided, any low-emissivity coating can be used. Suitable examples of a low-emissivity coating are described in U.S. patent application Ser. No. 09/728,435, entitled "Haze-Resistant Transparent Film Stacks", the entire teachings of which are incorporated herein by reference.

With reference to FIGS. 3 and 10B, film region 711A can be a sputtered dielectric film, such as zinc oxide, at a thickness of between about 75 angstroms and about 300 angstroms, film region 711B can be a sputtered silver-containing film, such as essentially pure silver, at a thickness of between about 65 angstroms and about 150 angstroms, film region 711C can be a thin sputtered metal-containing layer, such as a titanium-containing layer (which may be oxidized at least over a certain outermost thickness), at a thickness of between about 5 angstroms and about 30 angstroms, film region 711D can be sputtered dielectric film, such as five alternating layers of zinc oxide and silicon nitride, at a total thickness of between about 400 angstroms and about 900 angstroms, film region 711E can be a sputtered silver-containing film, such as essentially pure silver, at a thickness of between about 65 angstroms and about 150 angstroms, film region 711F can be a thin sputtered metal-containing layer, such as a titanium-containing layer (which may be oxidized at least over a certain outermost thickness), at a thickness of between about 5 angstroms and about 30 angstroms, and film region 711G can be a sputtered dielectric film, such as zinc oxide, at a thickness of between about 75 angstroms and about 400 angstroms.

It can be appreciated that the invention provides various methods for producing coated substrates. As described above, some of these methods involve depositing a hydrophilic coating 40. For example, the invention provides basic deposition methods that involve depositing over a major surface 12 of a substrate 10 each film of any coating embodiment described in the present disclosure. The hydrophilic coating 40 can include one, two, or more films. In many cases, each film of the hydrophilic coating 40 can be deposited by any of a variety of well known coating techniques. Useful techniques include, for example, sputter deposition, ion-assisted deposition, chemical vapor deposition (CVD), plasma enhanced chemical vapor deposition, vacuum evaporation, pyrolytic deposition, and sol gel deposition. In certain embodiments, the hydrophilic coating 40 is deposited by sputtering. For example, the coating 40 can optionally be sputter deposited while the substrate is maintained at a low temperature (e.g., below about 250 degrees Celsius, more preferably below 200 degrees Celsius). Such sputtering can optionally be performed without any supplemental means for delivering energy to the growing film (e.g., without any active heating, i.e., without any heating of the substrate beyond that which occurs normally from the plasma and ion bombardment of conventional sputtering).

Conventional sputtering techniques are well known in the art. Sputtering chambers and related equipment are commercially available from a variety of sources (e.g., Leybold). Useful magnetron sputtering techniques and equipment are described in U.S. Pat. No. 4,166,018, issued to Chapin, the teachings of which are incorporated herein by reference.

In certain methods, a hydrophilic coating 40 of the invention is applied to a substrate 10 in a multiple-chamber sputtering line. Sputtering lines are well known in the present art. A typical sputtering line includes a series of sputtering chambers aligned and connected such that a sheet-like substrate can be passed from one chamber to the next by conveying the substrate horizontally over spaced-apart transport rollers 210 in each of the chambers (the rollers form a continuous path of substrate travel P extending through the sputtering line). Reference is made to FIGS. 10A and 25-29. The substrate 10 is typically conveyed at speeds of between about 100-500 inches per minute.

The invention provides a particular group of embodiments involving an advantageous upward sputtering technology. These embodiments provide a method for depositing coatings onto substrates. The method comprises providing a coater 2000 having a substrate transport system 1210 defining a path of substrate travel P extending through the coater. In the present embodiments, at least part of a lower sputtering target 620, 620A, 620B is mounted below (i.e., at a lower elevation than, and preferably directly beneath) the path of substrate travel. Reference is made to FIGS. 6-7, 9, 10A, 11-13, 25, 30-31, 35B, and 36B.

The present method comprises conveying a glass sheet 10 along the path of substrate travel P (e.g., after positioning the glass sheet on the transport system 1210), such that the glass sheet is conveyed over (and past) the lower target 620, 620A, 620B. The method further comprises sputtering the lower target (e.g., as the glass sheet 10 is being conveyed over and past the lower target) so as to deposit a desired film 703, 705, 799 upon a bottom major surface 12 of the glass sheet. In the present embodiments, the desired film preferably has a refractive index of greater than 1.5 (preferably greater than 1.55, optionally greater than 1.57, and in some cases greater than 1.6). The desired film here forms part or all of a coating (optionally a hydrophilic coating 40) sputtered upwardly onto the bottom major surface 12 of the glass sheet. Preferably, the present method involves depositing this coating so as to have an optical thickness of less than about 700 angstroms, preferably less than about 600 angstroms, perhaps more preferably less than about 400 angstroms, and in some cases less than about 300 angstroms. In one particular embodiment, this optical thickness is less than about 200 angstroms (e.g., between about 75 angstroms and about 200 angstroms).

In the present upward sputtering method, the refractive index of the desired film can optionally be greater than 1.55, 1.57, or 1.6. Additionally or alternatively, the refractive index of the desired film can optionally be less than about 2.3, preferably less than about 2.25, and perhaps more preferably less than about 1.9, 1.8, or 1.7. In one particular embodiment, the refractive index of the desired film is between about 1.55 and about 1.9, such as between about 1.57 and about 1.8.

In the present upward sputtering method, the lower target can optionally be a rotary target having a central axis, the lower target being rotated about its central axis during its sputtering. More generally, in any embodiment of the invention involving at least one lower sputtering target, each such target can advantageously be a rotary target. Rotary targets can be provided advantageously in any sputter-up embodiments to promote the shedding of particles that may fall upon the targets.

In the present method, the coating sputtered upwardly onto the bottom major surface of the glass sheet can be deposited by conveying the glass sheet over (and past) a plurality of lower targets 620A, 620B, each mounted (at least in part) inside the coater and below the path of substrate travel. Reference is made to FIGS. 6-7, 9, 10A, 11-12, 25, 30-31, 35B, and 36B. In certain embodiments, the upwardly sputtered coating is deposited by conveying the glass over (and past) at least three lower targets. Reference is made to FIGS. 25, 35B, and 36B.

Preferably, the desired film 703, 705, 799 in the present method is deposited over an entirety of the bottom major surface 12 of the glass sheet 10. In some embodiments of this nature, the bottom surface 12 of the glass sheet 10 once coated with the desired film 703, 705, 799 comes into direct contact with at least one surface 210S, 144S of the transport system 1210 as the glass sheet is being conveyed along the path of substrate travel P. The transport system 1210, for example, can comprise a plurality of transport rollers 210 and/or a plurality of conveyor belts 144C-144G. Thus, the bottom surface 12 of the glass sheet 10 once coated with the desired film may come into direct contact with a transport roller (e.g., with a support surface 210S thereof) or with a conveyor belt (e.g., with a support surface 144S thereof) as the glass sheet is being conveyed along the path of substrate travel.

Various coatings of the invention were evaluated to determine selected properties. The ensuing discussion reports several of these properties. Some of the data reported herein are for coatings that have been subjected to conventional glass tempering, while other data are for untempered (optionally annealed) coatings. In some cases, properties are reported in the context of a single (monolithic) pane 10 bearing the hydrophilic coating 40 on one surface 12. In these cases, exemplary properties are reported for a pane of 3 mm soda-lime float glass. In other cases, properties are reported in the context of an IG unit 1500 having the hydrophilic coating 40 on its #1 surface. In these cases, the exemplary properties are reported for a double-pane IG unit wherein both panes are 3 mm soda-lime float glass with a ½ inch between-pane space filled with an insulative gas mix of 90% argon and 10% air. These specifics, of course, are by no means limiting to the invention. Absent an express statement to the contrary, the present discussion reports determinations made using the well known Window 4.2 program (e.g., calculating center of glass data) under standard ASHRAE conditions.

Table 1 provides product performance data and comparative data for one particular insulating glass unit 1500 embodiment of the invention. The IG unit listed in the first row of Table 1 includes a glass pane having a double-silver low-emissivity coating on one side, with no coating on the other side (the other pane of the unit is uncoated). This IG unit was tested to provide a basis for comparison with an IG unit that includes a glass pane having both the low-emissivity coating and a hydrophilic coating 40. The IG unit listed in the second row of Table 1 includes such a coated glass pane (i.e., one having a double-silver low-emissivity coating 711 on one side 14, and a hydrophilic coating 40 on the other side 12). The other pane of this unit is uncoated. The hydrophilic coating 40 embodiment here is characterized by the following structure, moving outwardly from the surface 12 of the glass 10: (1) about 90 angstroms of $SiO_2$; and (2) a compound region 50 having a thickness of about 100 angstroms, where the compound region is formed by alternating layers of $SiO_2$ and $TiO_2$ each having a thickness of about 10-40 Å. Thus, the hydrophilic coating 40 here has the same structure as that described above with reference to FIGS. 18A-20. Finally, the IG unit listed in the third row of Table 1 includes a glass pane having a double-silver low-emissivity coating and a coating characterized by the following structure, moving outwardly: (1) a layer of $SiO_2$ having a thickness of about 90 angstroms; and (2) a layer of $TiO_2$ having a thickness of about 100 angstroms. The other pane of this unit is uncoated.

TABLE 1

| Row No. | Product | Visible Transmission | Exterior Visible Reflection |
|---|---|---|---|
| 1. | LoE2/glass | 73% | 12% |
| 2. | LoE2/glass/ 90 Å $SiO_2$/ 100 Å compound region | 73% | 12% |
| 3. | LoE2/glass/ 90 Å $SiO_2$/ 100 Å $TiO_2$ | 71% | 13% |

In Table 1, the infinitesimal optical impact of the hydrophilic coating 40 can be appreciated. Here, it was found that the hydrophilic coating 40 causes no measurable decrease in the visible transmission of the product, as compared to the visible transmission of the IG unit having only the low-emissivity coating. Even the low-optical-impact coating listed in the third row of Table 1 decreased the visible transmission of the product by about 2%.

The results are similar for exterior visible reflection. That is, the hydrophilic coating 40 caused no measurable increase in the exterior visible reflection of the product, relative to the exterior visible reflection of the IG unit with only the low-emissivity coating. By comparison, the low-optical-impact coating listed in the third row of Table 1 increased the exterior visible reflection of the product by about 1%. Thus, it can be appreciated that the optical impact of the hydrophilic coating 40 is exceptionally minimal.

Table 2 provides product performance data and comparative data for one particular monolithic pane 10 embodiment of the invention. The coatings listed in rows 1-3 of Table 2 are the same as those listed in rows 1-3 of Table 1.

TABLE 2

| Row No. | Product | Visible Transmission | Film Side Visible Reflection |
|---|---|---|---|
| 1. | LoE2/glass | 81% | 5% |
| 2. | LoE2/ glass/ 90 Å $SiO_2$/ 100 Å compound region | 80% | 5% |
| 3. | LoE2/ glass/ 90 Å $SiO_2$/ 100 Å $TiO_2$ | 79% | 6% |

Here, it was found that the hydrophilic coating 40 caused a decrease of about 1% in the visible transmission of the product, relative to the visible transmission of the pane having only the low-emissivity coating. In comparison, the low-optical-impact coating listed in the third row of Table 2 decreased the visible transmission of the product by about twice as much (i.e., by about 2%).

With respect to film side visible reflection, the hydrophilic coating 40 caused no measurable increase. By comparison, the low-optical-impact coating listed in the third row of Table 1 increased the film side visible reflection of the product by about 1%, compared to the visible transmission of the pane having only the low-emissivity coating. Thus, the hydrophilic coating 40 has very little optical impact in both insulated and monolithic glazing embodiments.

Table 3 provides product performance data and comparative data for an embodiment of the invention involving a monolithic pane 10 carrying only a hydrophilic coating 40 (without the low-emissivity coating). The coatings listed in rows 2-3 of Table 3 are the same as those listed in rows 2-3 of Tables 1 and 2. The product listed in row 1 of Table 3, however, is a clear, uncoated pane of 3.0 mm glass.

TABLE 3

| Row No. | Product | Visible Transmission | Film Side Visible Reflection |
|---|---|---|---|
| 1. | clear uncoated glass | 90% | 9% |
| 2. | glass/ 90 Å $SiO_2$/ 100 Å compound region | 90% | 10% |
| 3. | glass/ 90 Å $SiO_2$/ 100 Å $TiO_2$ | 86% | 13% |

Here, the hydrophilic coating 40 caused no measurable decrease in the visible transmission of the product, relative to the visible transmission of the clear, uncoated glass. By comparison, the low-optical-impact coating listed in the third row of Table 3 decreased the visible transmission by about 4%.

Insofar as the film side visible reflection is concerned, the hydrophilic coating 40 caused an increase of about 1%, relative to the film side visible reflection of the uncoated glass. The low-optical-impact coating listed in the third row of Table 1 increased the film side visible reflection by about 3%.

Durability tests were also performed. In particular, durability tests were carried out for a glass pane bearing the hydrophilic coating embodiment listed in row 2 of Tables 1-3.

For purposes of comparison, durability tests were also carried out for a glass pane bearing the coating listed in row 3 of Tables 1-3.

In one test, these two coated glass products were subjected to water testing using a condensation tester, model QCT by Q-Panel. Here, the two products were exposed to 100% relative humidity at 120° F. for 500 hours. The coatings were then inspected for coating loss. The hydrophilic coating 40 did not exhibit coating loss. The coating with a $TiO_2$ layer over a $SiO_2$ layer showed some coating loss.

In another water test, the two coated glass products were exposed to 90% relative humidity at 120° F. in a Singleton Model SL23 humidity test chamber for 500 hours. The coatings were then inspected for coating loss. In this test, neither of the two products exhibited coating loss.

In still another test, the two coated glass products were submerged in ten parts deionized water/one part muriatic acid at room temperature for 24 hours. The muriatic acid was 20° Baume hydrochloric acid 31.45% by weight. In this test, neither the hydrophilic coating 40 nor the coating with a $TiO_2$ layer over a $SiO_2$ layer exhibited coating loss.

In yet another test, the two coated glass products were subjected to a salt spray test, in accordance with ASTM B117. Here, the coated glass products were subjected to 240 hours in 5% salt solution. The apparatus used was a Singleton SCCH # 20 Corrosion Cabinet with an atomized temperature of 35 degrees C. (+/−1 degree C.). A 5% salt solution was prepared by dissolving 5 parts by weight of sodium chloride in 95 parts of distilled water. The solution had a pH of 6.5 and was collected at 1.8 ml per 80 cm per hour in the horizontal collection cylinders. The position of the sample is 15 to 30 degrees from vertical. Both of the coated glass products exhibited no measured change in appearance or function.

In a further test, the two coated glass products were submerged for 24 hours in a large plastic tub filled with distilled white vinegar, at room temperature, reduced with water to 5% acidity. In this test, the hydrophilic coating 40 did not exhibit coating loss, and the coating with a $TiO_2$ layer over a $SiO_2$ layer showed no coating loss.

Finally, the two coated glass products were subjected to a vinegar soak and rub test in an area of the coating where low-emissivity coating overspray was found. The top major surface of each glass pane had been coated with a low-emissivity coating using a sputter-down procedure, and some of the downwardly sputtered material was oversprayed onto the bottom major surface of the glass (here, the hydrophilic coating 40 was deposited onto the bottom of the glass by sputtering upwardly, as was the coating having a $TiO_2$ layer over a $SiO_2$ layer). Vinegar-soaked cloths were placed over areas of overspray on the two products for 20 minutes, and then the areas of overspray were rubbed with vinegar-soaked cloth. The hydrophilic coating 40 did not exhibit coating loss. The coating having a $TiO_2$ layer over a $SiO_2$ layer showed some coating loss.

The hydrophilic coating 40 is exceptional in terms having an appearance that exhibits very little change when tempered. Tables 4-6 provide pre-temper data and post-temper data for two embodiments of the hydrophilic coating 40. The first embodiment is a glass sheet 10 with a major surface 12 directly over which there is deposited a compound region 50 having a thickness of 100 Å, where the compound region is a mixed silica-titania film having 76% silica and 24% titania. The second embodiment is a glass sheet 10 with a major surface 12 directly over which there is deposited a 90 Å $SiO_2$ film, directly over which there is deposited a compound region 50 having a thickness of 100 Å, where the compound region is a mixed silica-titania film having 76% silica and 24% titania. The following data were collected for these two embodiments.

TABLE 4

(Pre-Temper)

| | Transmission (T) | $T_a$ | $T_b$ | Film Side Reflection ($R_f$) | $R_{f,a}$ | $R_{f,b}$ |
|---|---|---|---|---|---|---|
| glass/ 100 Å SiO:TiO | 89.4 | −0.8 | 0.5 | 8.5 | −0.3 | −0.61 |
| glass/ 90 Å $SiO_2$/ 100 Å SiO:TiO | 89.5 | −0.8 | 0.3 | 8.4 | −0.3 | −0.4 |

TABLE 5

(Post-Temper)

| | Transmission (T) | $T_a$ | $T_b$ | Film Side Reflection ($R_f$) | $R_{f,a}$ | $R_{f,b}$ |
|---|---|---|---|---|---|---|
| glass/ 100 Å SiO:TiO | 90.1 | −0.7 | 0.4 | 8.1 | −0.3 | −0.3 |
| glass/ 90 Å $SiO_2$/ 100 Å SiO:TiO | 90 | −0.7 | 0.5 | 8.3 | −0.2 | −0.8 |

Both of the coated glass products were tempered in a manner believed to yield acceptable tempering in a commercial production setting. In particular, the coated glass products were washed using standard washing equipment and placed in a furnace maintained at about 680-705° C. (preferably about 690-700° C.). Each coated glass product was held in the furnace for 100-120 seconds with constant movement to better ensure temperature uniformity, so as to raise the glass temperature to about 640° C. Each coated glass product was then removed from the furnace and exposed to a stream of air for about 50 seconds, so as to cool enough to be handled by an operator.

Color, transmission, and film-side reflection measurements were taken before and after tempering. In particular, the following optical measurements were taken both prior to and after tempering using a Hunter lab Ultrascan: total visible transmission (T); a and b color values in transmission ($T_a$ and $T_b$); reflectance at the film side ($R_f$); a and b color values for the film-side reflection ($R_{f,a}$ and $R_{f,b}$).

In Tables 4 and 5, the transmitted and film-side reflected colors are reported using the well known color coordinates of "a" and "b". These color coordinates represent conventional use of the well known Hunter Lab Color System (Hunter methods/units, Ill. D65, 10 degree observer). The present color properties can be determined as specified in ASTM Method E 308, the entire teachings of which are incorporated herein by reference.

The data in Tables 4 and 5 show that the present hydrophilic coatings when tempered exhibit very little change in terms of quantitative optical properties. Moreover, the actual appearance of these coatings to an observer undergoes virtually no visible change as a result of being tempered.

Turning now to Table 6, the haze of each tempered product was measured using a hazometer sold by BYK Gardner under the trade name Haze-Gard Plus. The levels of haze for both coatings were deemed to be very good, and these coatings exemplify embodiments wherein the hydrophilic coating 40 exhibits a haze of less than about 0.45, preferably less than about 0.40, more preferably less than about 0.25, and optimally less than about 0.2.

TABLE 6

| (Haze) | | |
|---|---|---|
| | Pre-Temper | Post-Temper |
| glass/<br>100 Å SiO:TiO | 0.11 | 0.17 |
| glass/<br>90 Å SiO$_2$/<br>100 Å SiO:TiO | 0.11 | 0.13 |

The thickness and structure of the film(s) in a coating of the invention can be determined in various ways known to skilled artisans. For example, a Focused Ion Beam (FIB) instrument can be used to prepare electron transparent cross-sectional specimens. The specimens can be examined using, for example, two-hundred KeV transmission electron microscopes, such as one dedicated high-resolution imaging instrument and another fully analytical instrument equipped with an X-ray energy-dispersive spectrometer. Selected area electron diffraction can be used to determine the crystallography of the coating. The present coating can also be examined using low magnification bright field and dark field images of the coating, energy-dispersive X-ray (EDX) spectra from the coating, and high-resolution lattice-fringe images. In cases involving an amorphous film, the specimen should be ion milled under cryo temperatures to facilitate testing to determine that the specimen is amorphous.

While preferred embodiments of the present invention have been described, it should be understood that numerous changes, adaptations, and modifications can be made therein without departing from the spirit of the invention and the scope of the appended claims.

What is claimed is:

1. A substrate with a first surface bearing a coating that comprises a compound region, the compound region comprising a photocatalyst, the photocatalyst being a first material, the compound region also comprising a dielectric material, the dielectric material being a second material, wherein said first and second materials are different materials, wherein the coating has a total thickness of at least about 50 angstroms but less than about 400 angstroms, wherein the substrate when uncoated has a first visible reflectance, wherein the substrate when bearing the coating has a second visible reflectance, and wherein the second visible reflectance is no more than about 3% greater than the first visible reflectance, each such visible reflectance being a film-side visible reflectance measured off the first surface of the substrate.

2. The substrate of claim 1, wherein the second visible reflectance is no more than about 1% greater than the first visible reflectance.

3. The substrate of claim 1, wherein the second visible reflectance is no more than about 0.75% greater than the first visible reflectance.

4. The substrate of claim 1, wherein the coating has a photocatalytic reaction rate characterized by an acetone decomposition slope of at least about 0.03.

5. The substrate of claim 1, wherein the compound region includes at least three films each having a thickness of about 45 angstroms or less.

6. The substrate of claim 1, wherein the compound region includes a subset of films, the subset having a composite refractive index of about 2.1 or less, the subset comprising at least three films each having a thickness of between about 10 angstroms and about 45 angstroms, wherein the compound region further includes an exposed outermost film, said outermost film comprising titania and having a thickness of at least about 20 angstroms.

7. The substrate of claim 1, wherein the compound region comprises alternating films of said first material and said second material, each such film having a thickness of less than about 45 angstroms, wherein said alternating films have a combined thickness of less than about 200 angstroms.

8. The substrate of claim 7, wherein said combined thickness is less than about 150 angstroms.

9. The substrate of claim 5, wherein said first material is titania, and at least two of said films comprise titania.

10. The substrate of claim 9, wherein at least three of said films comprise titania.

11. The substrate of claim 5, wherein said first material is titania that is substantially or entirely amorphous, at least one of said films comprising titania that is substantially or entirely amorphous.

12. The substrate of claim 5, wherein said second material is silica, and at least two of said films comprise silica.

13. The substrate of claim 1, wherein the compound region comprises alternating films of said first material and said second material, said first material being titania, said second material being silica, and wherein the compound region has at least five such alternating films each having a thickness of between about 10 angstroms and about 45 angstroms.

14. The substrate of claim 1, wherein the compound region comprises the following films, in sequence outwardly: a film comprising titania and having a thickness of between about 10 angstroms and about 30 angstroms; a film comprising silica and having a thickness of between about 5 angstroms and about 30 angstroms; a film comprising titania and having a thickness of between about 10 angstroms and about 30 angstroms; a film comprising silica and having a thickness of between about 5 angstroms and about 30 angstroms; and an exposed outermost film comprising titania and having a thickness of between about 10 angstroms and about 45 angstroms.

15. The substrate of claim 5, wherein the coating includes a desired film between the substrate's first surface and the compound region, the desired film having a physical thickness of at least about 30 angstroms.

16. The substrate of claim 5, wherein the total thickness of the coating is less than about 200 angstroms.

17. The substrate of claim 5, wherein the coating is substantially or entirely amorphous.

18. The substrate of claim 1, wherein the compound region comprises a mixed film including both said first and second materials.

19. The substrate of claim 18, wherein the mixed film has a refractive index of about 2.1 or less.

20. The substrate of claim 19, wherein the refractive index is about 1.7 or less.

21. The substrate of claim 18, wherein the first material is titania, and the mixed film comprises titania in an amount that is less than about 30% by weight relative to the total weight of the mixed film.

22. The substrate of claim 18, wherein the mixed film is a mixed oxide film comprising titanium, silicon, and oxygen.

23. The substrate of claim 18, wherein the mixed film has a thickness of less than 100 angstroms, the mixed film defining an exposed outermost face of the coating.

24. The substrate of claim 18, wherein the mixed film is entirely or substantially amorphous.

25. The substrate of claim 18, wherein the mixed film includes both amorphous and crystalline domains.

26. The substrate of claim 25, wherein said first material is titania, and the mixed film has a degree of crystallization that is less than about 20%.

27. The substrate of claim 25, wherein said first material is titania, and the mixed film comprises titanium dioxide crystals embedded in an entirely or substantially amorphous film.

28. The substrate of claim 27, wherein the titanium dioxide crystals have an average size of between about 5 nm and about 50 nm.

29. The substrate of claim 28, wherein the average size is between about 5 nm and about 25 nm.

30. The substrate of claim 18, wherein said first material is titania, said second material is silica, and the mixed film is a sputtered film.

31. The substrate of claim 25, wherein the mixed film includes an inner thickness that is an entirely or substantially amorphous mix of said first and second materials, said mixed film also including an outer thickness comprising crystals of said first material.

32. The substrate of claim 31, wherein said outer thickness comprises crystals of said first material embedded in film that is entirely or substantially amorphous.

33. The substrate of claim 32, wherein said first material is titania, and the crystalline domains comprise titanium dioxide crystals.

34. The substrate of claim 33, wherein said outer thickness defines an exposed outermost face of the coating.

35. The substrate of claim 18, wherein the mixed film is a mixed oxide film having a thickness of less than about 75 angstroms, the mixed oxide film defines an exposed outermost face of the coating, the first material is titania, the mixed oxide film comprises titania in an amount that is less than about 30% by weight relative to the total weight of the mixed oxide film, and the mixed oxide film is substantially or entirely amorphous.

36. The substrate of claim 18, wherein said first material is titania, and said second material is zirconia.

37. The substrate of claim 36, wherein the compound region includes domains consisting essentially of entirely or substantially amorphous titania and at least one domain characterized by blending together of titania and zirconia.

38. The substrate of claim 36, wherein the mixed film comprises at least some $ZrTiO_4$.

39. The substrate of claim 38, wherein the mixed film comprises a mixture including both $ZrTiO_4$ and $ZrO_2$.

40. The substrate of claim 23, wherein the coating includes a desired film between the substrate's first surface and the mixed film, the desired film having a physical thickness of at least about 30 angstroms.

41. The substrate of claim 18, wherein the total thickness of the coating is less than about 200 angstroms.

42. The substrate of claim 1, wherein the substrate is part of a multiple-pane insulating glazing unit having a between-pane space, the first surface of the substrate being an exterior surface of the unit and thus facing generally away from the between-pane space.

43. The substrate of claim 1, wherein the substrate is a glass sheet.

44. A substrate with a first surface bearing a coating that comprises a compound region, the compound region comprising a photocatalyst, the photocatalyst being a first material, the compound region also comprising a dielectric material, the dielectric material being a second material, wherein said first and second materials are different materials, the coating having a total thickness of less than about 250 angstroms, wherein the coating has a photocatalytic reaction rate characterized by an acetone decomposition slope of at least about 0.03.

45. The substrate of claim 44, wherein the acetone decomposition slope is at least about 0.038.

46. The substrate of claim 44, wherein the substrate when uncoated has a first visible reflectance, wherein the substrate when bearing the coating has a second visible reflectance, and wherein the second visible reflectance is no more than about 3% greater than the first visible reflectance, each such visible reflectance being a film-side visible reflectance measured off the first surface of the substrate.

47. The substrate of claim 46, wherein the second visible reflectance is no more than about 1% greater than the first visible reflectance.

48. The substrate of claim 47, wherein the second visible reflectance is no more than about 0.75% greater than the first visible reflectance.

49. The substrate of claim 44, wherein the compound region includes at least three films each having a thickness of between about 10 angstroms and about 45 angstroms.

50. The substrate of claim 44, wherein the compound region includes a subset of films, the subset having a composite refractive index of about 2.1 or less, the subset comprising at least three films each having a thickness of between about 10 angstroms and about 45 angstroms, wherein the compound region further includes an exposed outermost film, said outermost film comprising titania and having a thickness of at least about 20 angstroms.

51. The substrate of claim 44, wherein the compound region comprises alternating films of said first material and said second material, each such film having a thickness of less than about 45 angstroms, wherein said alternating films have a combined thickness of less than about 200 angstroms.

52. The substrate of claim 51, wherein said combined thickness is less than about 150 angstroms.

53. The substrate of claim 49, wherein said first material is titania, and at least two of said films comprise titania.

54. The substrate of claim 53, wherein at least three of said films comprise titania.

55. The substrate of claim 49, wherein said first material is titania that is substantially or entirely amorphous, at least one of said films comprising titania that is substantially or entirely amorphous.

56. The substrate of claim 49, wherein said second material is silica, and at least two of said films comprise silica.

57. The substrate of claim 44, wherein the compound region comprises alternating films of said first material and said second material, said first material being titania, said second material being silica, and wherein the compound region has at least three such alternating films each having a thickness of between about 10 angstroms and 45 angstroms.

58. The substrate of claim 44, wherein the compound region comprises the following films, in sequence outwardly: a film comprising titania and having a thickness of between about 10 angstroms and about 30 angstroms; a film comprising silica and having a thickness of between about 5 angstroms and about 30 angstroms; a film comprising titania and having a thickness of between about 10 angstroms and about 30 angstroms; a film comprising silica and having a thickness of between about 5 angstroms and about 30 angstroms; and; an exposed outermost film comprising titania and having a thickness of between about 10 angstroms and about 45 angstroms.

59. The substrate of claim 49, wherein the coating includes a desired film between the substrate's first surface and the compound region, the desired film having a physical thickness of at least about 30 angstroms.

60. The substrate of claim 49, wherein the coating is substantially or entirely amorphous.

61. The substrate of claim 44, wherein the compound region comprises a mixed film including both said first and second materials.

62. The substrate of claim 61, wherein the mixed film has a refractive index of about 2.1 or less.

63. The substrate of claim 62, wherein the refractive index is about 1.7 or less.

64. The substrate of claim 61, wherein the first material is titania, and the mixed film comprises titania in an amount that is less than about 30% by weight relative to the total weight of the mixed film.

65. The substrate of claim 61, wherein the mixed film comprises an oxide that includes silicon, titanium, and oxygen.

66. The substrate of claim 61, wherein the oxide film is a mixed oxide film having a thickness of less than 100 angstroms, the mixed oxide film defining an exposed outermost face of the coating.

67. The substrate of claim 61, wherein the mixed film is entirely or substantially amorphous.

68. The substrate of claim 61, wherein the mixed film includes both amorphous and crystalline domains.

69. The substrate of claim 68, wherein said first material is titania, and the mixed film has a degree of crystallization that is less than about 20%.

70. The substrate of claim 68, wherein said first material is titania, and the mixed film comprises titanium dioxide crystals embedded in an entirely or substantially amorphous film.

71. The substrate of claim 70, wherein the titanium dioxide crystals have an average size of between about 5 nm and about 25 nm.

72. The substrate of claim 68, wherein the mixed film includes an inner thickness that is an entirely or substantially amorphous mix of said first and second materials, said mixed film also including an outer thickness comprising crystals of said first material.

73. The substrate of claim 61, wherein the mixed film is a mixed oxide film having a thickness of less than about 75 angstroms, the mixed oxide film defines an exposed outermost face of the coating, the first material is titania, the mixed oxide film comprises titania in an amount that is less than about 30% by weight relative to the total weight of the mixed oxide film, and wherein the mixed oxide film is substantially or entirely amorphous.

74. The substrate of claim 66, wherein the coating includes a desired film between the substrate's first surface and the mixed oxide film, the desired film having a physical thickness of between about 30 angstrom and about 100 angstroms.

75. The substrate of claim 61, wherein the total thickness of the coating is less than about 175 angstroms.

76. The substrate of claim 61, wherein the mixed film is a sputtered film comprising silica and titania, said sputtered film having been produced by co-sputtering first and second targets, wherein the first target carries a sputterable material consisting essentially of a metallic material comprising titanium, and wherein the second target carries a sputterable material containing silicon as a major component, said targets being co-sputtered in a single sputtering bay.

77. The substrate of claim 44, wherein the substrate is part of a multiple-pane insulating glazing unit having a between-pane space, the first surface of the substrate being an exterior surface of the unit and thus facing generally away from the between-pane space.

78. The substrate of claim 44, wherein the substrate is a glass sheet.

79. A glass sheet having generally-opposed first and second major surfaces, the first major surface bearing a coating that comprises a compound region, the compound region comprising a photocatalyst, the photocatalyst being a first material, the compound region also comprising a second material, wherein said first and second materials are different materials, wherein the compound region is a sputtered mixed oxide film including both said first and second materials, the sputtered mixed oxide film having a thickness of at least about 40 angstroms but less than about 250 angstroms, the sputtered mixed oxide film defining an exposed outermost face of the coating, wherein said first material is titania and the sputtered mixed oxide film comprises titania in an amount that is less than about 30% by weight relative to the total weight of the sputtered mixed oxide film, wherein the glass sheet when uncoated has a first visible reflectance, wherein the glass sheet when bearing the coating has a second visible reflectance, and wherein the second visible reflectance is no more than about 3% greater than the first visible reflectance, each such visible reflectance being a monolithic film-side visible reflectance measured off the first major surface of the glass sheet, the glass sheet being part of a multiple-pane insulating glazing unit having a between-pane space, the first major surface of the glass sheet being an exterior surface of the unit and thus facing generally away from the between-pane space.

80. A glass sheet having generally-opposed first and second major surfaces, the first major surface bearing a coating that comprises a compound region, the compound region comprising titania and silica, wherein the compound region is a sputtered mixed oxide film having been produced by co-sputtering first and second targets, where the first target carried a sputterable material consisting essentially of titanium and the second target carried a sputterable material consisting essentially of silicon and aluminum, said co-sputtering having been carried out reactively in a single sputtering bay containing an oxidizing atmosphere, the sputtered mixed oxide film having a thickness of at least about 40 angstroms but less than about 250 angstroms, the sputtered mixed oxide film defining an exposed outermost face of the coating, the glass sheet being part of a multiple-pane insulating glazing unit having a between-pane space, the first major surface of the glass sheet being an exterior surface of the unit and thus facing generally away from the between-pane space.

81. A glass sheet having generally-opposed first and second major surfaces, the first major surface bearing a coating that comprises a compound region, the compound region comprising a photocatalyst, the photocatalyst being a first material, the compound region also comprising a dielectric material, the dielectric material being a second material, wherein said first and second materials are different materials, wherein the compound region includes at least three films each having a thickness of between about 10 angstroms and about 45 angstroms, wherein at least one of said films is an exposed outermost film of the coating, the coating having a total physical thickness of less than about 250 angstroms, the glass sheet being part of a multiple-pane insulating glazing unit having a between-pane space, the first major surface of the glass sheet being an exterior surface of the unit and thus facing generally away from the between-pane space.

82. The glass sheet of claim 81, wherein the compound region comprises the following films, in sequence outwardly from the first major surface of the substrate: a film comprising titania and having a thickness of between about 10 angstroms and about 30 angstroms; a film comprising silica and having a thickness of between about 5 angstroms and about 30 angstroms; a film comprising titania and having a thickness of between about 10 angstroms and about 30 angstroms; a film comprising silica and having a thickness of between about 5 angstroms and about 30 angstroms; and a film that is the exposed outermost film of the coating and comprises titania and has a thickness of between about 10 angstroms and about 45 angstroms.

83. A sheet-like substrate having generally-opposed first and second major surfaces, the first major surface bearing a coating that comprises a hydrophilic film, the hydrophilic film comprising a compound that includes atoms of titanium, silicon, and oxygen, the hydrophilic film having an outermost face with an average surface roughness Ra of less than 1.8 nm, wherein the hydrophilic film has a physical thickness of less than about 300 angstroms.

84. The substrate of claim 83, wherein the substrate when uncoated has a first visible transmittance, wherein the substrate when bearing the coating has a second visible transmittance, and wherein the second visible transmittance is less than 5% greater than the first visible transmittance.

85. The substrate of claim 84, wherein the second visible transmittance is less than 3% greater than the first visible transmittance.

86. The substrate of claim 85, wherein the second visible transmittance is less than about 1% greater than the first visible transmittance.

87. The substrate of claim 83, wherein the hydrophilic film has a refractive index of greater than 1.4 but less than 2.45.

88. The substrate of claim 87, wherein the refractive index is greater than 1.45 but less than 2.4.

89. The substrate of claim 88, wherein the refractive index is greater than 1.5 but less than 2.25.

90. The substrate of claim 83, wherein the hydrophilic film is a sputtered film, the physical thickness of the sputtered film varying by less than 40 angstroms over the first major surface.

91. The substrate of claim 83, wherein the physical thickness of the hydrophilic film is between about 30 angstroms and about 200 angstroms.

92. The substrate of claim 83, wherein the compound of the hydrophilic film has between about 10 and about 50 atomic percent titanium, relative to the total number of metal atoms in the hydrophilic film.

93. The substrate of claim 83, wherein the compound of the hydrophilic film has between about 90 and about 50 atomic percent silicon, relative to the total number of metal atoms in the hydrophilic film.

94. The substrate of claim 83, wherein the substrate is a sheet of glass containing sodium.

95. The substrate of claim 83, wherein the substrate is a sheet of glass having a major dimension of at least 1 meter.

96. The substrate of claim 83, wherein the second major surface of the substrate bears a low-emissivity coating including at least one infrared-reflective film comprising silver.

97. The substrate of claim 83, wherein the coating includes at least one amorphous film between the hydrophilic film and the first major surface of the substrate.

98. The substrate of claim 83, wherein the average surface roughness Ra is less than 1.6 nm.

99. The substrate of claim 98, wherein the average surface roughness Ra is less than 0.6 nm.

100. The substrate of claim 83, wherein the substrate is provided in combination with a window frame on an exterior wall of a building, the substrate being mounted in the window frame such that the hydrophilic film is exposed to an outdoor environment.

101. The substrate of claim 100 wherein the hydrophilic film is exposed to periodic contact with rain.

102. The substrate of claim 83, wherein the substrate is part of a multiple-pane insulating glass unit.

103. A glass sheet having generally-opposed first and second major surfaces, the first major surface bearing a coating that comprises an outermost hydrophilic film, the hydrophilic film comprising a compound that includes atoms of titanium, silicon, and oxygen, wherein the glass sheet when uncoated has a first visible transmittance, wherein the glass sheet when bearing the coating has a second visible transmittance, and wherein the second visible transmittance is less than about 3% greater than the first visible transmittance.

104. The glass sheet of claim 103, wherein the second visible transmittance is less than about 1% greater than the first visible transmittance.

105. The glass sheet of claim 103, wherein the hydrophilic film has an outermost face with an average surface roughness Ra of less than 1.8 nm.

106. The glass sheet of claim 103, wherein the hydrophilic film is a sputtered film, the physical thickness of the sputtered film varying by less than 40 angstroms over the first major surface.

107. The glass sheet of claim 103, wherein the physical thickness of the hydrophilic film is between about 30 angstroms and about 200 angstroms.

108. The glass sheet of claim 103, wherein the hydrophilic film has a refractive index of greater than 1.45 but less than 2.25.

109. The glass sheet of claim 103, wherein the second major surface of the glass sheet bears a low-emissivity coating including at least one infrared-reflective film comprising silver.

110. The glass sheet of claim 103, wherein the glass sheet is provided in combination with a window frame on an exterior wall of a building, the glass sheet being mounted in the window frame such that the hydrophilic film is exposed to an outdoor environment.

111. The glass sheet of claim 110, wherein the hydrophilic film is exposed to periodic contact with rain.

112. The glass sheet of claim 103, wherein the glass sheet is part of a multiple-pane insulating glass unit.

113. A glass sheet having generally-opposed first and second major surfaces, the first major surface bearing a coating that comprises a sputtered hydrophilic film, the sputtered hydrophilic film comprising a compound that includes atoms of titanium, silicon, and oxygen, the sputtered hydrophilic film having a refractive index of greater than 1.45 but less than 2.25, and wherein the sputtered hydrophilic film has a physical thickness of between about 30 angstroms and about 200 angstroms.

114. The glass sheet of claim 113, wherein the glass sheet when uncoated has a first visible transmittance, wherein the glass sheet when bearing the coating has a second visible transmittance, and wherein the second visible transmittance is less than 3% greater than the first visible transmittance.

115. The glass sheet of claim 114, wherein the second visible transmittance is less than about 1% greater than the first visible transmittance.

116. The glass sheet of claim 113, wherein the sputtered hydrophilic film has an outermost face with an average surface roughness Ra of less than 1.8 nm.

117. The glass sheet of claim 116, wherein the average surface roughness Ra is less than 1.6 nm.

118. The glass sheet of claim 117, wherein the average surface roughness Ra is less than 0.6 nm.

119. The glass sheet of claim 113, wherein the second major surface of the glass sheet bears a low-emissivity coating including at least one infrared-reflective film comprising silver.

120. The glass sheet of claim 113, wherein the glass sheet is provided in combination with a window frame on an exterior wall of a building, the glass sheet being mounted in the window frame such that the sputtered hydrophilic film is exposed to an outdoor environment.

121. The glass sheet of claim 120, wherein the sputtered hydrophilic film is exposed to periodic contact with rain.

122. The glass sheet of claim 113, wherein the glass sheet is part of a multiple-pane insulating glass unit.

123. A glass sheet having generally-opposed first and second major surfaces, the first major surface bearing a coating that comprises an amorphous hydrophilic film, the amorphous hydrophilic film comprising a compound that includes atoms of titanium, silicon, and oxygen, wherein the amorphous hydrophilic film has a thickness of less than about 250 angstroms.

124. The glass sheet of claim 123, wherein the glass sheet when uncoated has a first visible transmittance, wherein the glass sheet when bearing the coating has a second visible transmittance, and wherein the second visible transmittance is less than 3% greater than the first visible transmittance.

125. The glass sheet of claim 124, wherein the second visible transmittance is less than about 1% greater than the first visible transmittance.

126. The glass sheet of claim 123, wherein the amorphous hydrophilic film has a refractive index of greater than 1.45 but less than 2.25.

127. The glass sheet of claim 123, wherein the amorphous hydrophilic film has an outermost face with an average surface roughness Ra of less than 1.8 nm.

128. The glass sheet of claim 123, wherein the amorphous hydrophilic film is a sputtered film, the physical thickness of the sputtered film varying by less than 40 angstroms over the first major surface.

129. The glass sheet of claim 123, wherein the second major surface of the glass sheet bears a low-emissivity coating including at least one infrared-reflective film comprising silver.

130. The glass sheet of claim 123, wherein the glass sheet is provided in combination with a window frame on an exterior wall of a building, the glass sheet being mounted in the window frame such that the amorphous hydrophilic film is exposed to an outdoor environment.

131. The glass sheet of claim 130, wherein the amorphous hydrophilic film is exposed to periodic contact with rain.

132. The glass sheet of claim 123, wherein the glass sheet is part of a multiple-pane insulating glass unit.

* * * * *